United States Patent
Watts et al.

(10) Patent No.: US 7,281,921 B2
(45) Date of Patent: Oct. 16, 2007

(54) SCATTEROMETRY ALIGNMENT FOR IMPRINT LITHOGRAPHY

(75) Inventors: Michael P. C. Watts, Austin, TX (US); Ian M. McMackin, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/347,198

(22) Filed: Feb. 3, 2006

(65) Prior Publication Data

US 2006/0158651 A1 Jul. 20, 2006

Related U.S. Application Data

(62) Division of application No. 10/210,785, filed on Aug. 1, 2002, now Pat. No. 7,027,156.

(51) Int. Cl.
*B29C 43/58* (2006.01)
*B29C 59/00* (2006.01)
*G01B 11/00* (2006.01)

(52) U.S. Cl. .................. 425/385; 264/40.1; 356/401; 425/150; 425/171; 425/174.4

(58) Field of Classification Search ............... 425/150, 425/171, 174.4, 385; 356/401; 264/40.1
See application file for complete search history.

(56) References Cited

U.S. PATENT DOCUMENTS

| | | | | |
|---|---|---|---|---|
| 4,715,804 A | * | 12/1987 | Takahashi | 425/141 |
| 5,772,905 A | * | 6/1998 | Chou | 216/44 |
| 6,517,995 B1 | * | 2/2003 | Jacobson et al. | 430/320 |
| 6,636,312 B1 | * | 10/2003 | Hsin et al. | 356/401 |
| 6,696,220 B2 | * | 2/2004 | Bailey et al. | 425/385 |
| 6,842,229 B2 | * | 1/2005 | Sreenivasan et al. | 355/75 |
| 7,070,405 B2 | * | 7/2006 | Sreenivasan et al. | 425/174.4 |

* cited by examiner

*Primary Examiner*—Yogendra N. Gupta
*Assistant Examiner*—Emmanuel S Luk
(74) *Attorney, Agent, or Firm*—Fish & Richardson P.C.; Kelly K. Kordzik

(57) ABSTRACT

Described are methods for patterning a substrate by imprint lithography. Imprint lithography is a process in which a liquid is dispensed onto a substrate. A template is brought into contact with the liquid and the liquid is cured. The cured liquid includes an imprint of any patterns formed in the template. Alignment of the template with a previously formed layer on a substrate, in one embodiment, is accomplished by using scatterometry.

17 Claims, 52 Drawing Sheets

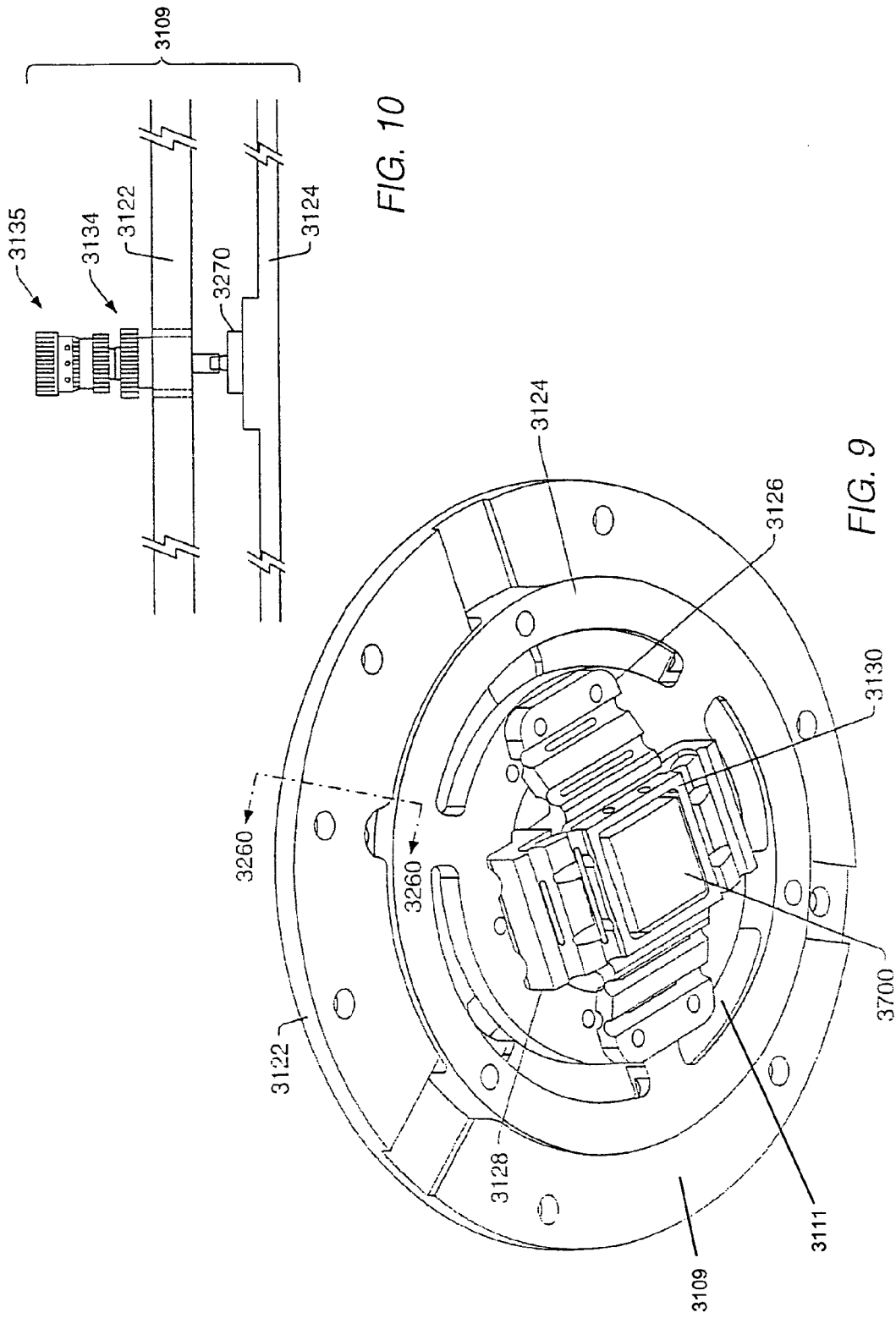

US 7,281,921 B2

SCATTEROMETRY ALIGNMENT FOR IMPRINT LITHOGRAPHY

CROSS-REFERENCE TO RELATED PATENT APPLICATIONS

The present application is a divisional patent application of U.S. patent application Ser. No. 10/210,785, filed Aug. 1, 2002 now U.S. Pat. No. 7,027,156 and entitled "Scatterometry Alignment for Imprints Lithography," and listing Michael P. C. Watts and Ian M. McMackin as inventors, the entirety of which is incorporated by reference herein.

BACKGROUND OF THE INVENTION

1. Field of the Invention

Embodiments presented herein relate to methods and systems for imprint lithography. More particularly, embodiments relate to methods and systems for micro- and nano-imprint lithography processes.

2. Description of the Relevant Art

Optical lithography techniques are currently used to make most microelectronic devices. However, it is believed that these methods are reaching their limits in resolution. Submicron scale lithography has been a critical process in the microelectronics industry. The use of sub-micron scale lithography allows manufacturers to meet the increased demand for smaller and more densely packed electronic circuits on chips. It is expected that the microelectronics industry will pursue structures that are as small or smaller than about 50 nm. Further, there are emerging applications of nanometer scale lithography in the areas of opto-electronics and magnetic storage. For example, photonic crystals and high-density patterned magnetic memory of the order of terabytes per square inch may require sub-100 nm scale lithography.

For making sub-50 nm structures, optical lithography techniques may require the use of very short wavelengths of light (e.g., about 13.2 nm). At these short wavelengths, many common materials are not optically transparent and therefore imaging systems typically have to be constructed using complicated reflective optics. Furthermore, obtaining a light source that has sufficient output intensity at these wavelengths is difficult. Such systems lead to extremely complicated equipment and processes that may be prohibitively expensive. It is also believed that high-resolution e-beam lithography techniques, though very precise, are too slow for high-volume commercial applications.

Several imprint lithography techniques have been investigated as low cost, high volume manufacturing alternatives to conventional photolithography for high-resolution patterning. Imprint lithography techniques are similar in that they use a template containing topography to replicate a surface relief in a film on the substrate. One form of imprint lithography is known as hot embossing.

Hot embossing techniques face several challenges: i) pressures greater than 10 MPa are typically required to imprint relief structures, ii) temperatures must be greater than the $T_g$ of the polymer film, iii) patterns (in the substrate film) have been limited to isolation trenches or dense features similar to repeated lines and spaces. Hot embossing is unsuited for printing isolated raised structures, such as lines and dots. This is because the highly viscous liquids resulting from increasing the temperature of the substrate films require extremely high pressures and long time durations to move the large volume of liquids needed to create isolated structures. This pattern dependency makes hot embossing unattractive. Also, high pressures and temperatures, thermal expansion, and material deformation generate severe technical challenges in the development of layer-to-layer alignment at the accuracies needed for device fabrication. Such pattern placement distortions lead to problems in applications, such as patterned magnetic media for storage applications. The addressing of the patterned medium bit by the read-write head becomes very challenging unless the pattern placement distortions can be kept to a minimum.

SUMMARY OF THE INVENTION

In one embodiment, a patterned layer is formed by curing an activating light curable liquid disposed on a substrate in the presence of a patterned template. The patterned template is positioned over a predefined portion of the substrate. Typically, the predefined portion of the substrate includes a previously formed patterning area. Alignment of the template with the substrate is accomplished with alignment marks on both the template and substrate.

In an embodiment, a patterned template is placed in a spaced relationship to the substrate. The patterned template includes an alignment mark. The template alignment mark includes a diffraction grating which matches a corresponding substrate alignment mark. A scatterometry alignment system is coupled to the body such that the alignment of the template diffraction grating with the substrate diffraction grating can be analyzed with the system. Alignment is accomplished by illuminating the template alignment mark and the substrate alignment mark with light at an angle that is substantially normal to plane defined by the substrate. Light reflected along a non-zero order from the template and substrate alignment marks is measured. Light measurements include analyzing the intensity of light at multiple wavelengths. Averaging out of light intensity readings at multiple wavelengths is used to determine an average alignment error. The average alignment error may be used to alter the position of the template with respect to the substrate prior to forming a patterned layer.

In another embodiment, a patterned template is placed in a spaced relationship to the substrate. The patterned template includes an alignment mark. The template alignment mark includes a diffraction grating which matches a corresponding substrate alignment mark. Alignment is accomplished by illuminating the template alignment mark and the substrate alignment mark with two incident light beams at an angle that is substantially non-normal to plane defined by the substrate. Light reflected along the zero order from the template and substrate alignment marks is measured. Light measurements include analyzing the intensity of light at multiple wavelengths. Averaging out of light intensity readings at multiple wavelengths is used to determine an average alignment error. The average alignment error may be used to alter the position of the template with respect to the substrate prior to forming a patterned layer.

In another embodiment, a patterned template is placed in a spaced relationship to the substrate. The patterned template includes an alignment mark. The template alignment mark includes a diffraction grating which matches a corresponding substrate alignment mark. Alignment is accomplished by illuminating the template alignment mark and the substrate alignment mark with two incident light beams at an angle that is substantially non-normal to plane defined by the substrate. Light reflected along a non-zero order from the template and substrate alignment marks is measured. Light measurements include analyzing the intensity of light at multiple wavelengths. Averaging out of light intensity readings at multiple wavelengths is used to determine an average alignment error. The average alignment error may be used to alter the position of the template with respect to the substrate prior to forming a patterned layer.

BRIEF DESCRIPTION OF THE DRAWINGS

Other objects and advantages of the invention will become apparent upon reading the following detailed description and upon reference to the accompanying drawings in which:

FIG. 9 depicts a projection view of a fine orientation system coupled to a pre-calibration system of an imprint head;

FIG. 10 depicts a cross-sectional view of a pre-calibration system;

Figure 1:
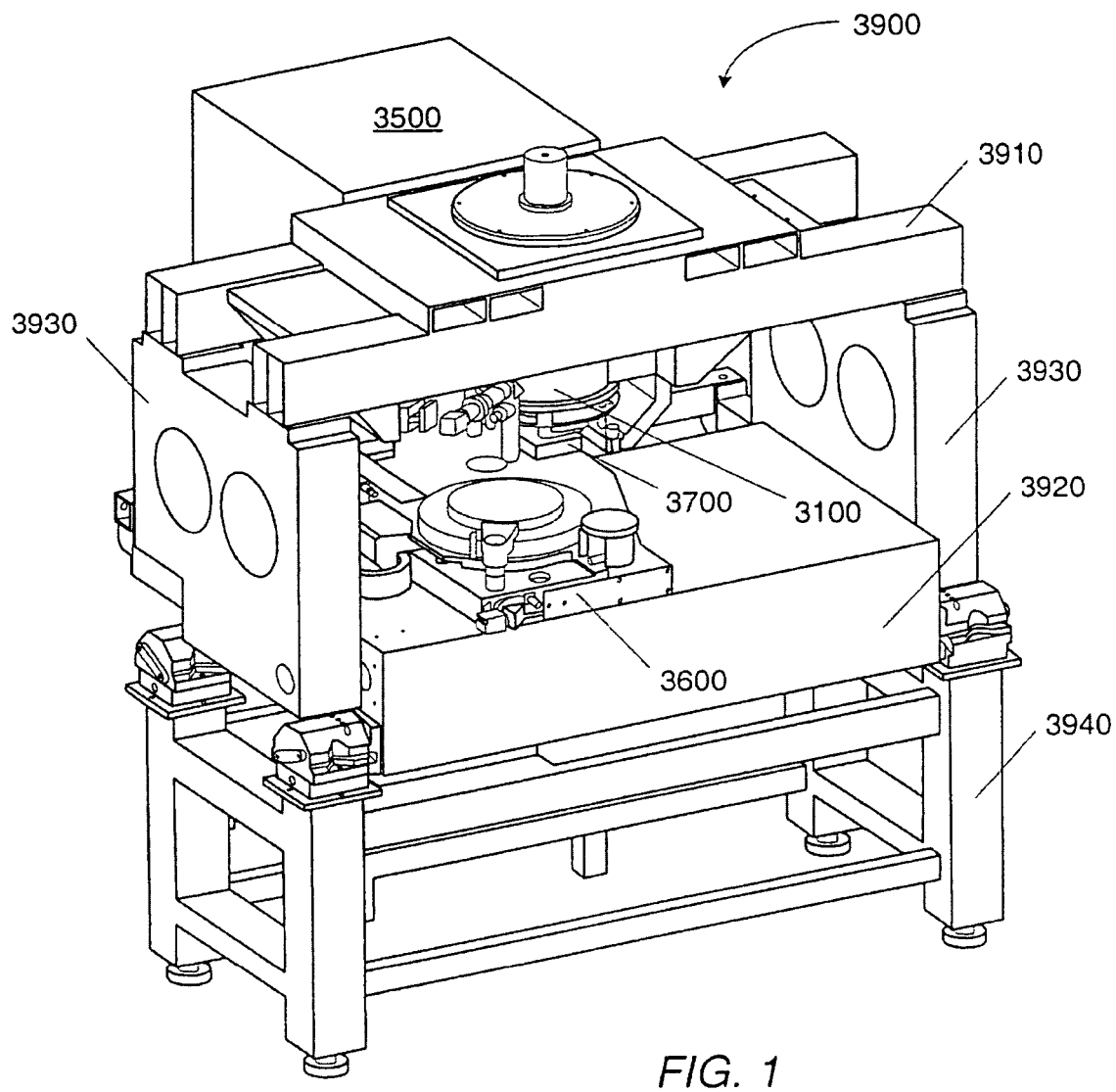
FIG. 1 depicts an embodiment of a system for imprint lithography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Embodiments presented herein generally relate to systems, devices, and related processes of manufacturing small devices. More specifically, embodiments presented herein relate to systems, devices, and related processes of imprint lithography. For example, these embodiments may be used for imprinting sub-100 nm features on a substrate, such as a semiconductor wafer. It should be understood that these embodiments may also be used to manufacture other kinds of devices including, but not limited to, patterned magnetic media for data storage, micro-optical devices, micro-electromechanical system, biological testing devices, chemical testing and reaction devices, and X-ray optical devices.

Imprint lithography processes have demonstrated the ability to replicate high-resolution (e.g., sub-50 nm) images on substrates using templates that contain images as topography on their surfaces. Imprint lithography may be used in patterning substrates in the manufacture of microelectronic devices, optical devices, MEMS, opto-electronics, patterned magnetic media for storage applications, etc. Imprint lithography techniques may be superior to optical lithography for making three-dimensional structures such as micro lenses and T-gate structures. Components of an imprint lithography system, including the template, substrate, liquid and any other materials that may affect the physical properties of the system including, but not limited to, surface energy, interfacial energies, Hamacker constants, Van der Waals' forces, viscosity, density, opacity, etc., are engineered to properly accommodate a repeatable process.

Methods and systems for imprint lithography are discussed in U.S. Pat. No. 6,334,960 to Willson et al. entitled "Step and Flash Imprint Lithography," which is incorporated herein by reference. Additional methods and systems for imprint lithography are further discussed in the following U.S. patent applications: U.S. Ser. No. 09/908,455 filed Jul. 17, 2001 (published as U.S. Publication No. 2002-0094496 A1) entitled "Method and System of Automatic Fluid Dispensing for Imprint Lithography Processes"; U.S. Ser. No. 09/907,512 filed Jul. 16, 2001 (issued as U.S. Pat. No. 6,921,615) entitled "High-Resolution Overlay Alignment Methods and Systems for Imprint Lithography"; U.S. Ser. No. 09/920,341 filed Aug. 1, 2001 (published as U.S. Publication No. 2002-0093122-A1) entitled "Methods for High-Precision Gap Orientation Sensing Between a Transparent Template and Substrate for Imprint Lithography"; U.S. Ser. No. 09/934,248 filed Aug. 21, 2001 (published as U.S. Publication No. 2002-0150398-A1) entitled "Flexure Based Macro Motion Translation Stage"; U.S. Ser. No. 09/698,317 filed Oct. 27, 2000 (issued as U.S. Pat. No. 6,873,087) entitled "High-Precision Orientation Alignment and Gap Control Stages for Imprint Lithography Processes"; U.S. Ser. No. 09/976,681 filed Oct. 12, 2001 (issued as U.S. Pat. No. 6,696,220) entitled "Template Design for Room Temperature, Low Pressure Micro- and Nano-Imprint Lithography"; and U.S. Ser. No. 10/136,188 filed May 1, 2002 (published as U.S. Publication No. 2003-0205657-A1) entitled "Methods of Manufacturing a Lithography Template" to Voison; all of which are incorporated herein by reference. Further methods and systems are discussed in the following publications, all of which are incorporated herein by reference: "Design of Orientation Stages for Step and Flash Imprint Lithography," B. J. Choi, S. Johnson, M. Colburn, S. V. Sreenivasan, C. G. Willson, to appear in J. of Precision Engineering; "Large Area High Density Quantized Magnetic Disks Fabricated Using Nanoimprint Lithography," W. Wu, B. Cui, X. Y. Sun, W. Zhang, L. Zhunag, and S. Y. Chou, J. Vac Sci Technol B 16 (6), 3825-3829, November-December 1998; "Lithographically-Induced Self-Assembly of Periodic Polymer Micropillar Arrays," S. Y. Chou, L. Zhuang, J. Vac Sci Technol B 17 (6), 3197-3202, 1999; and "Large Area Domain Alignment in Block Copolymer Thin Films Using Electric Fields," P. Mansky, J. DeRouchey, J. Mays, M. Pitsikalis, T. Morkved, H. Jaeger and T. Russell, Macromolecules 13, 4399 (1998).

System for Imprint Lithography

Overall System Description

FIG. 1 depicts an embodiment of a system for imprint lithography 3900. Imprint lithography system 3900 includes an imprint head 3100. Imprint head 3100 is mounted to an imprint head support 3910. Imprint head 3100 is configured to hold a patterned template 3700. Patterned template 3700 includes a plurality of recesses that define a pattern of features to be imprinted into a substrate. Imprint head 3100 or motion stage 3600 is further configured to move patterned template 3700 toward and away from a substrate to be imprinted during use. Imprint lithography system 3900 also includes motion stage 3600. Motion stage 3600 is mounted to motion stage support 3920. Motion stage 3600 is configured to hold a substrate and move the substrate in a generally planar motion about motion stage support 3920. Imprint lithography system 3900 further includes an activating light source 3500 coupled to imprint head 3100. Activating light source 3500 is configured to produce a curing light and direct the produced curing light through patterned template 3700 coupled to imprint head 3100. Curing light includes light at an appropriate wavelength to cure a polymerizable liquid. Curing light includes ultraviolet light, visible light, infrared light, x-ray radiation and electron beam radiation.

Imprint head support 3910 is coupled to motion stage support 3920 by bridging supports 3930. In this manner imprint head 3100 is positioned above motion stage 3600. Imprint head support 3910, motion stage support 3920 and bridging supports 3930 are herein collectively referred to as the system "body." The components of the system body may be formed from thermally stable materials. Thermally stable materials have a thermal expansion coefficient of less than about 10 ppm/° C. at about room temperature (e.g., 25° C.). In some embodiments, the material of construction may have a thermal expansion coefficient of less than about 10 ppm/° C., or less than 1 ppm/° C. Examples of such materials include silicon carbide, certain alloys of iron, including but not limited to, certain alloys of steel and nickel (e.g., alloys commercially available under the name INVAR®), and certain alloys of steel, nickel and cobalt (e.g., alloys commercially available under the name SUPER INVAR™). Additional examples of such materials include certain ceramics, including but not limited to, ZERODUR® ceramic. Motion stage support 3920 and bridging supports 3930 are coupled to a support table 3940. Support table 3940 provides a substantially vibration free support for the components of imprint lithography system 3900. Support table 3940 isolates imprint lithography system 3900 from ambient vibrations (e.g., due to works, other machinery, etc.). Motion stages and vibration isolation support tables are commercially available from Newport Corporation of Irvine, Calif.

As used herein, the "X-axis" refers to the axis that runs between bridging supports 3930. As used herein the "Y-axis" refers to the axis that is orthogonal to the X-axis. As used herein the "X-Y plane" is a plane defined by the X-axis and the Y-axis. As used herein the "Z-axis" refers to an axis running from motion stage support 3920 to imprint head support 3910, orthogonal to the X-Y plane. Generally an imprint process involves moving the substrate, or the imprint head, along an X-Y plane until the proper position of the substrate with respect to patterned template 3700 is achieved. Movement of the template, or motion stage 3600, along the Z-axis, will bring patterned template 3700 to a position that allows contact between patterned template 3700 and a liquid disposed on a surface of the substrate.

Figure 2:
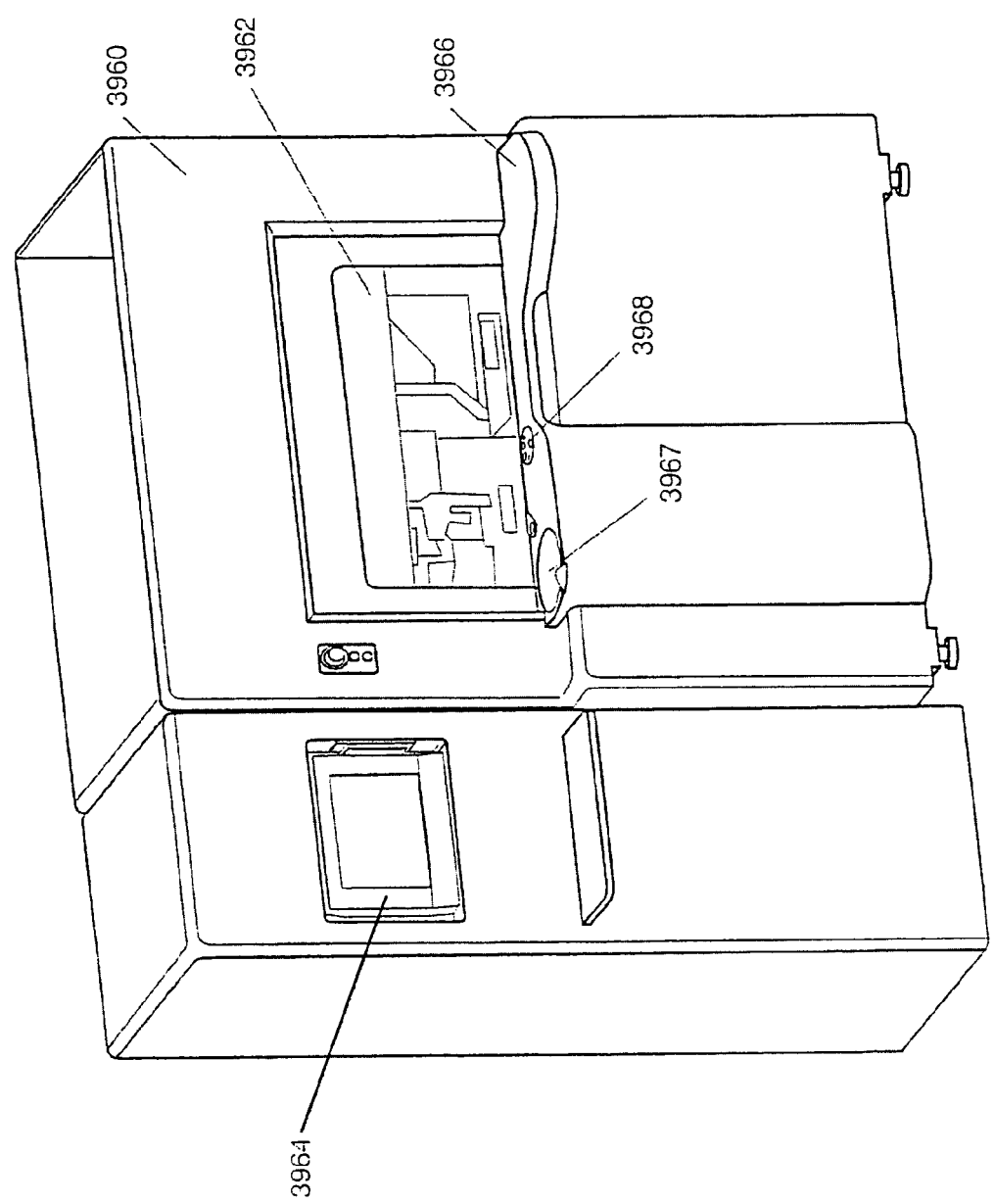
FIG. 2 depicts an imprint lithography system enclosure.

Imprint lithography system 3900 may be placed in an enclosure 3960, as depicted in FIG. 2. Enclosure 3960 encompasses imprint lithography system 3900 and provides a thermal and air barrier to the lithography components. Enclosure 3960 includes a movable access panel 3962 that allows access to the imprint head 3100 and motion stage 3600 of FIG. 1 when moved to an "open" position, as depicted in FIG. 2. When in a "closed" position, the components of imprint lithography system 3900 are at least partially isolated from the room atmosphere. Access panel 3962 also serves as a thermal barrier to reduce the effects of temperature changes within the room on the temperature of the components within enclosure 3960. Enclosure 3960 includes a temperature control system. A temperature control system is used to control the temperature of components within enclosure 3960. In one embodiment, temperature control system is configured to inhibit temperature variations of greater than about 1° C. within enclosure 3960. In some embodiments, a temperature control system inhibits variations of greater than about 0.1° C. In one embodiment, thermostats or other temperature measuring devices in combination with one or more fans may be used to maintain a substantially constant temperature within enclosure 3960.

Various user interfaces may also be present on enclosure 3960. A computer controlled user interface 3964 may be coupled to enclosure 3960. User interface 3964 may depict the operating parameters, diagnostic information, job progress and other information related to the functioning of the enclosed imprint system 3900. User interface 3964 may also be configured to receive operator commands to alter the operating parameters of imprint lithography system 3900. A staging support 3966 may also be coupled to enclosure 3960. Staging support 3966 is used by an operator to support substrates, templates and other equipment during an imprint lithography process. In some embodiments, staging support 3966 may include one or more indentations 3967 configured to hold a substrate (e.g., a circular indentation for a semiconductor wafer). Staging support 3966 may also include one or more indentations 3968 for holding patterned template 3700, shown in FIG. 1.

Additional components may be present depending on the processes that imprint lithography system 3900 is designed to implement. For example, for semiconductor processing equipment including, but not limited to, an automatic wafer loader, an automatic template loader and an interface to a cassette loader (all not shown) may be coupled to imprint lithography system 3900.

Imprint Head

Figure 3:
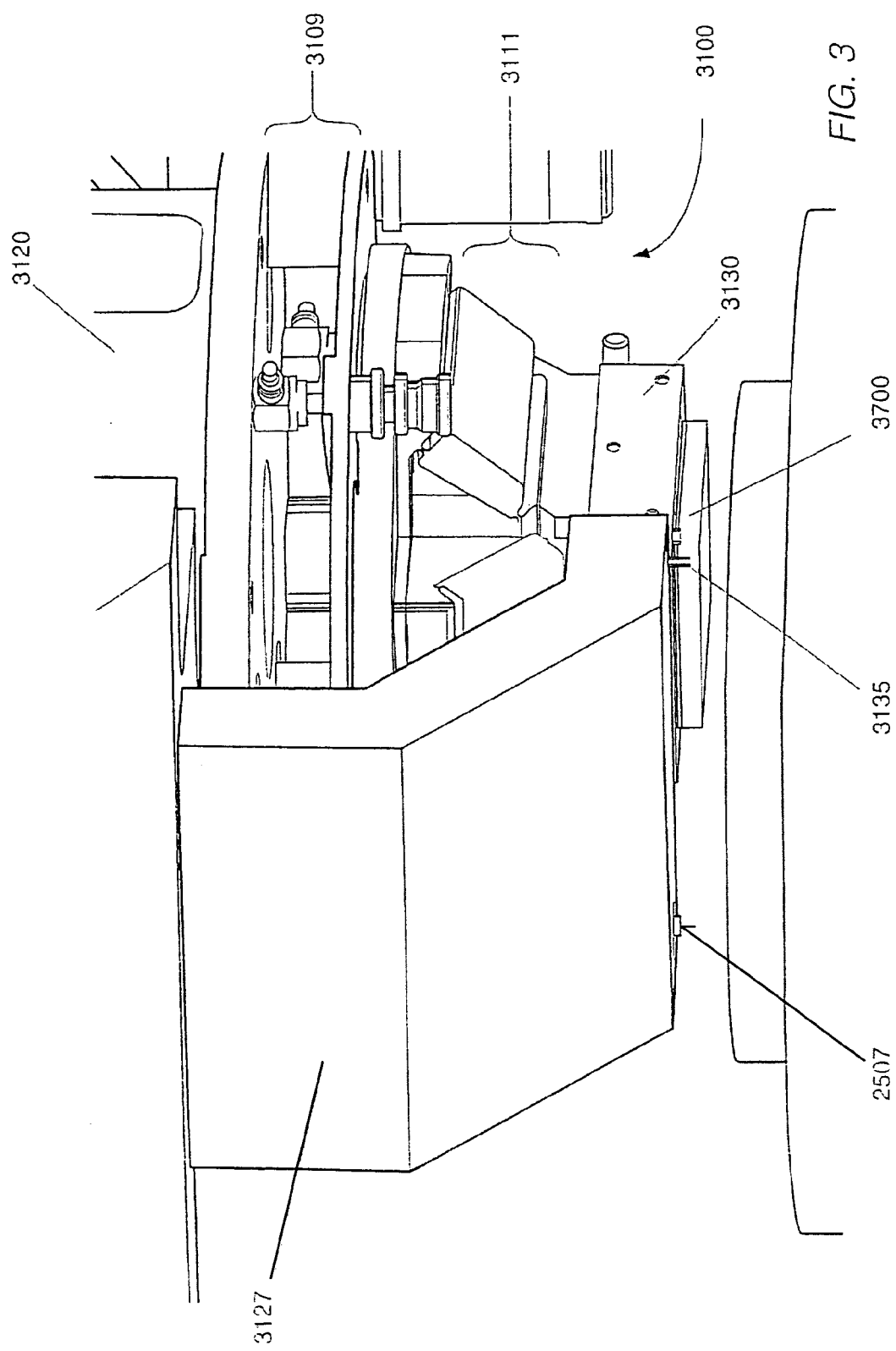
FIG. 3 depicts an embodiment of an imprint lithography head coupled to an imprint lithography system.

FIG. 3 depicts an embodiment of a portion of imprint head 3100. Imprint head 3100 includes a pre-calibration system 3109 and a fine orientation system 3111 coupled to pre-calibration system 3109. Template support 3130 is coupled to fine orientation system 3111. Template support 3130 is designed to support and couple patterned template 3700 to fine orientation system 3111.

Figure 4:
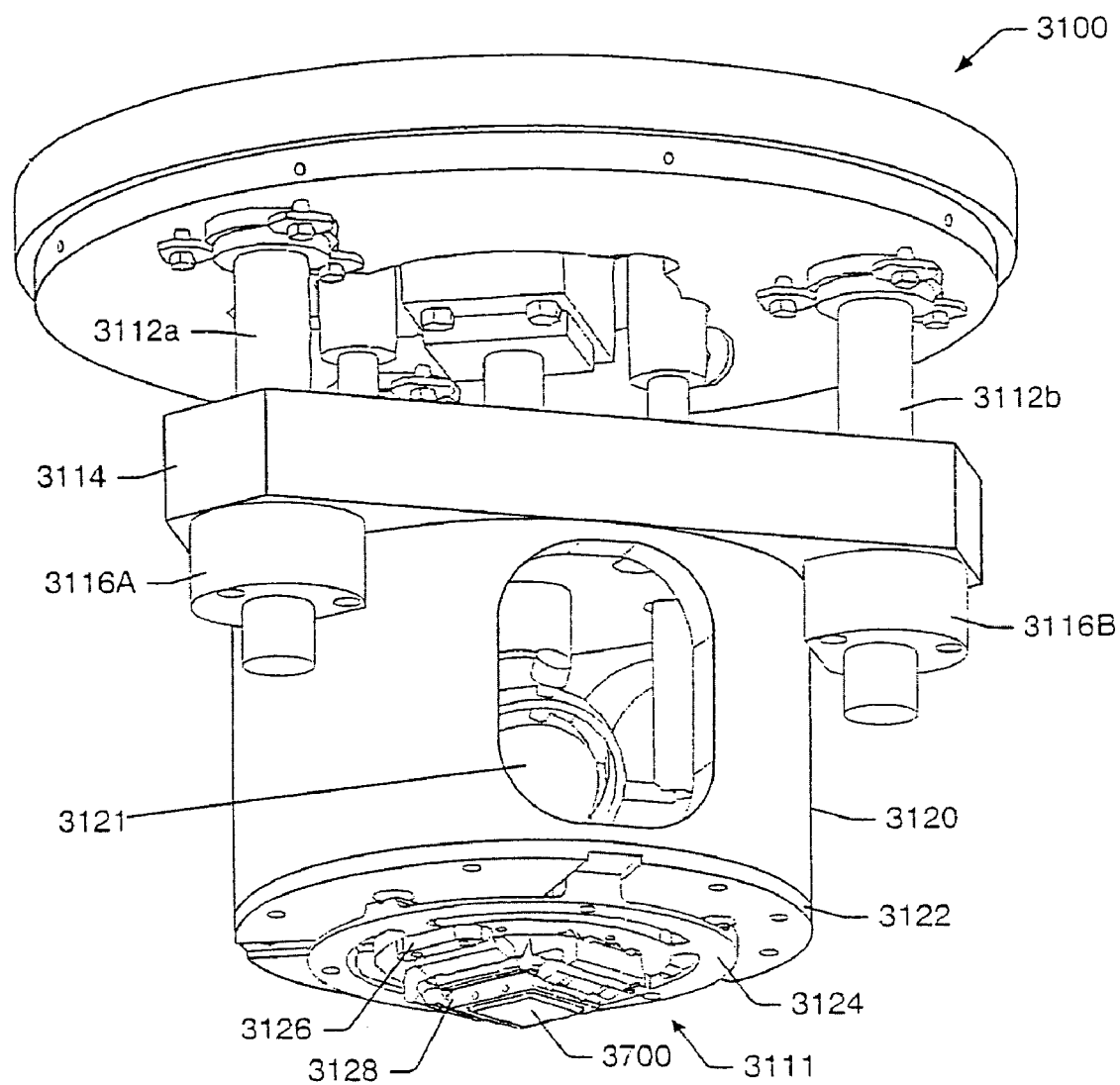
FIG. 4 depicts a projection view of an imprint head.

Referring to FIG. 4, a disk-shaped flexure ring 3124, which makes up a portion of pre-calibration system 3109 of FIG. 3, is coupled to imprint head housing 3120. Imprint head housing 3120 is coupled to a middle frame 3114 with guide shafts 3112a, 3112b. In one embodiment, three (3) guide shafts may be used (the back guide shaft is not visible in FIG. 4) to provide a support for housing 3120. Sliders 3116A and 3116B coupled to corresponding guide shafts 3112a, 3112b about middle frame 3114 are used to facilitate the up and down motion of housing 3120. A disk-shaped base plate 3122 is coupled to the bottom portion of housing 3120. Base plate 3122 may be coupled to flexure ring 3124. Flexure ring 3124 supports fine orientation system 3111 components that include first flexure member 3126 and second flexure member 3128. The operation and configuration of flexure members 3126, 3128 are discussed in detail below.

Figure 5:
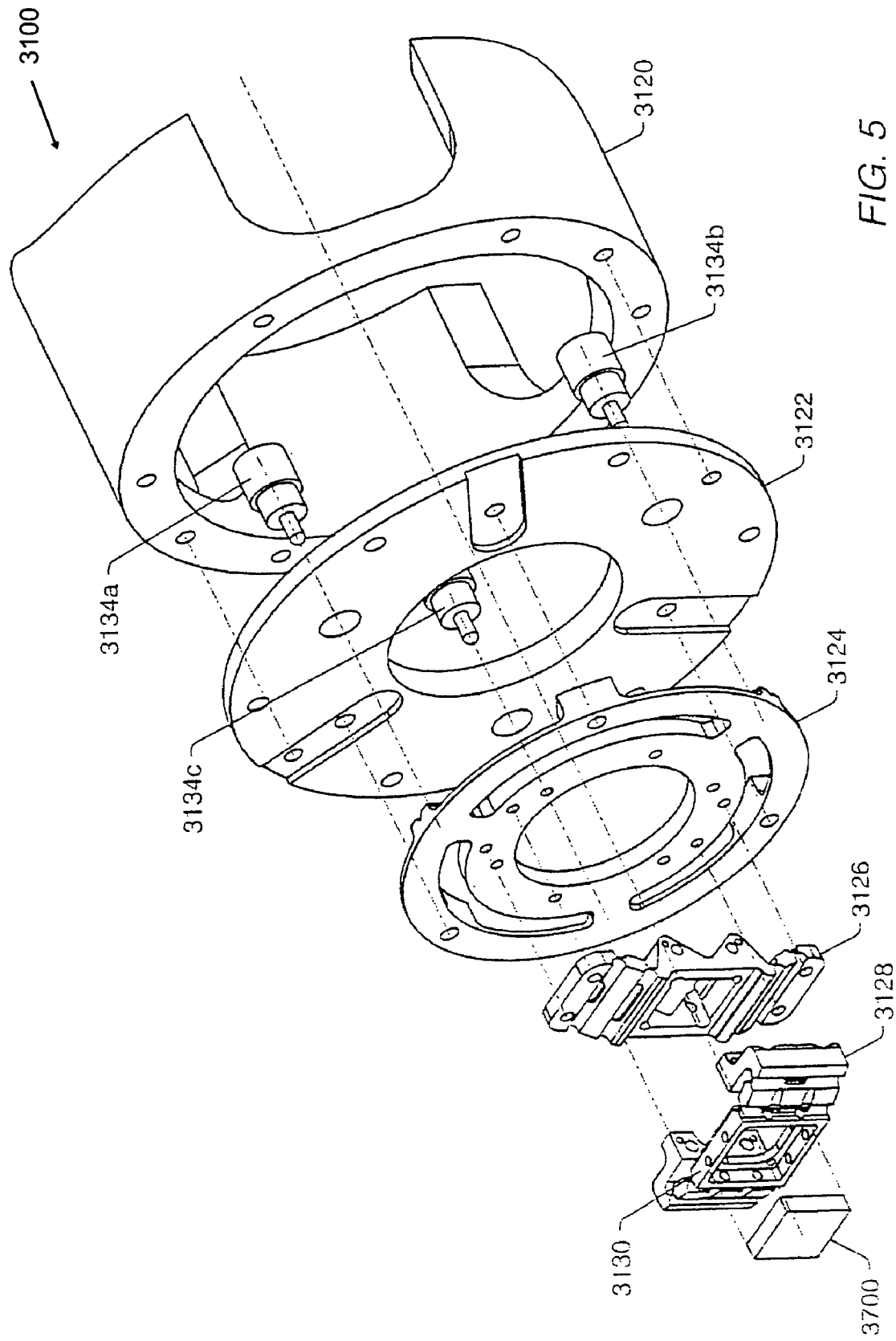
FIG. 5 depicts an exploded view of an imprint head.

FIG. 5 depicts an exploded view of imprint head 3100. As shown in FIG. 5, actuators 3134a, 3134b, and 3134c are fixed within housing 3120 and coupled to base plate 3122 and flexure ring 3124. In operation, motion of actuators 3134a, 3134b, and 3134c controls the movement of flexure ring 3124. Motion of actuators 3134a, 3134b, and 3134c may allow for a coarse pre-calibration. In some embodiments, actuators 3134a, 3134b, and 3134c may be equally spaced around housing 3120. Actuators 3134a, 3134b, 3134c and flexure ring 3124 together form pre-calibration system 3109, shown in FIG. 3. Actuators 3134a, 3134b, and 3134c allow translation of flexure ring 3124 along the Z-axis to control the gap accurately.

Imprint head 3100 also includes a mechanism that enables fine orientation control of patterned template 3700 so that proper orientation alignment may be achieved and a uniform gap may be maintained by patterned template 3700 with respect to a substrate surface. Alignment and gap control is achieved, in one embodiment, by the use of first and second flexure members, 3126 and 3128, respectively.

Figure 6:
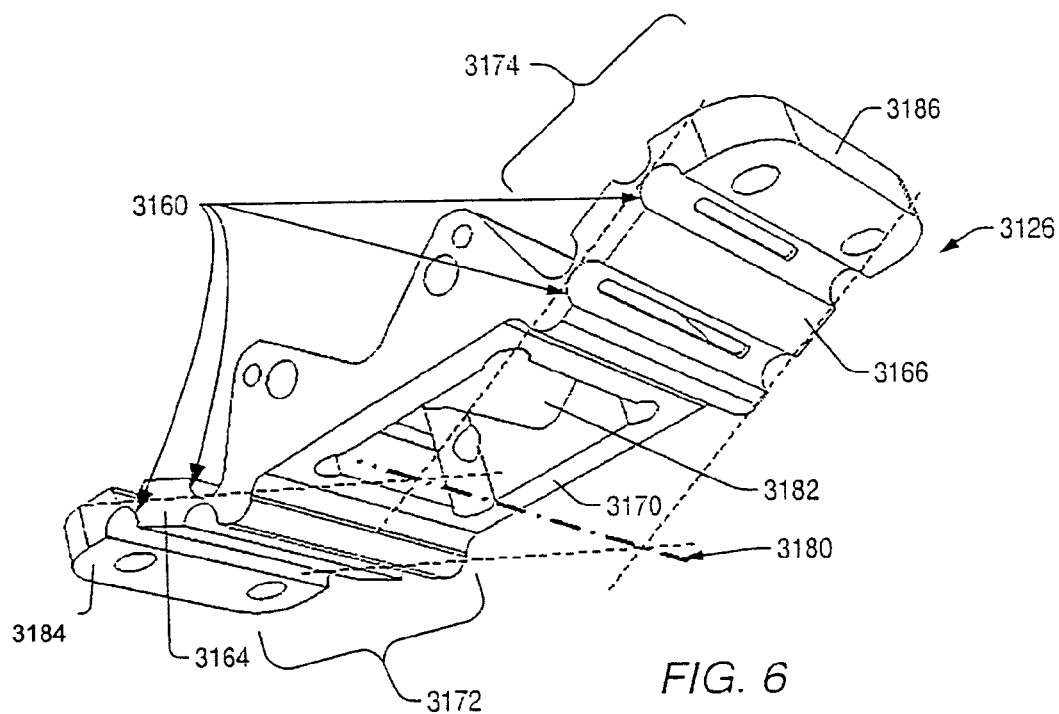
FIG. 6 depicts a projection view of a first flexure member.
Figure 7:
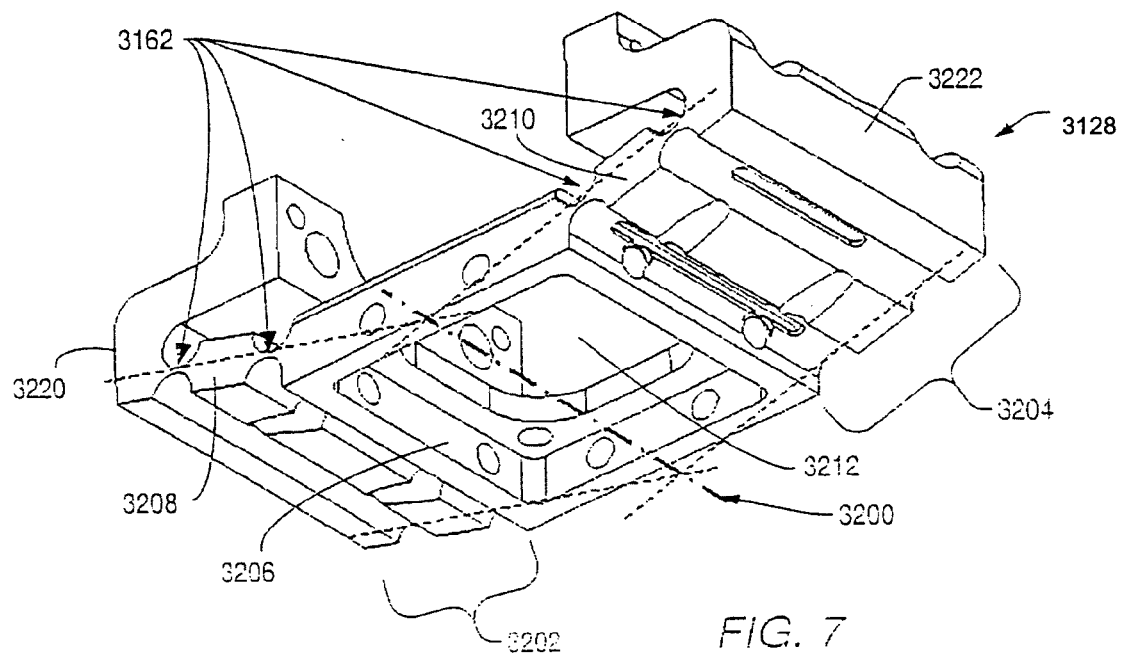
FIG. 7 depicts a projection view of a second flexure member.
Figure 8:
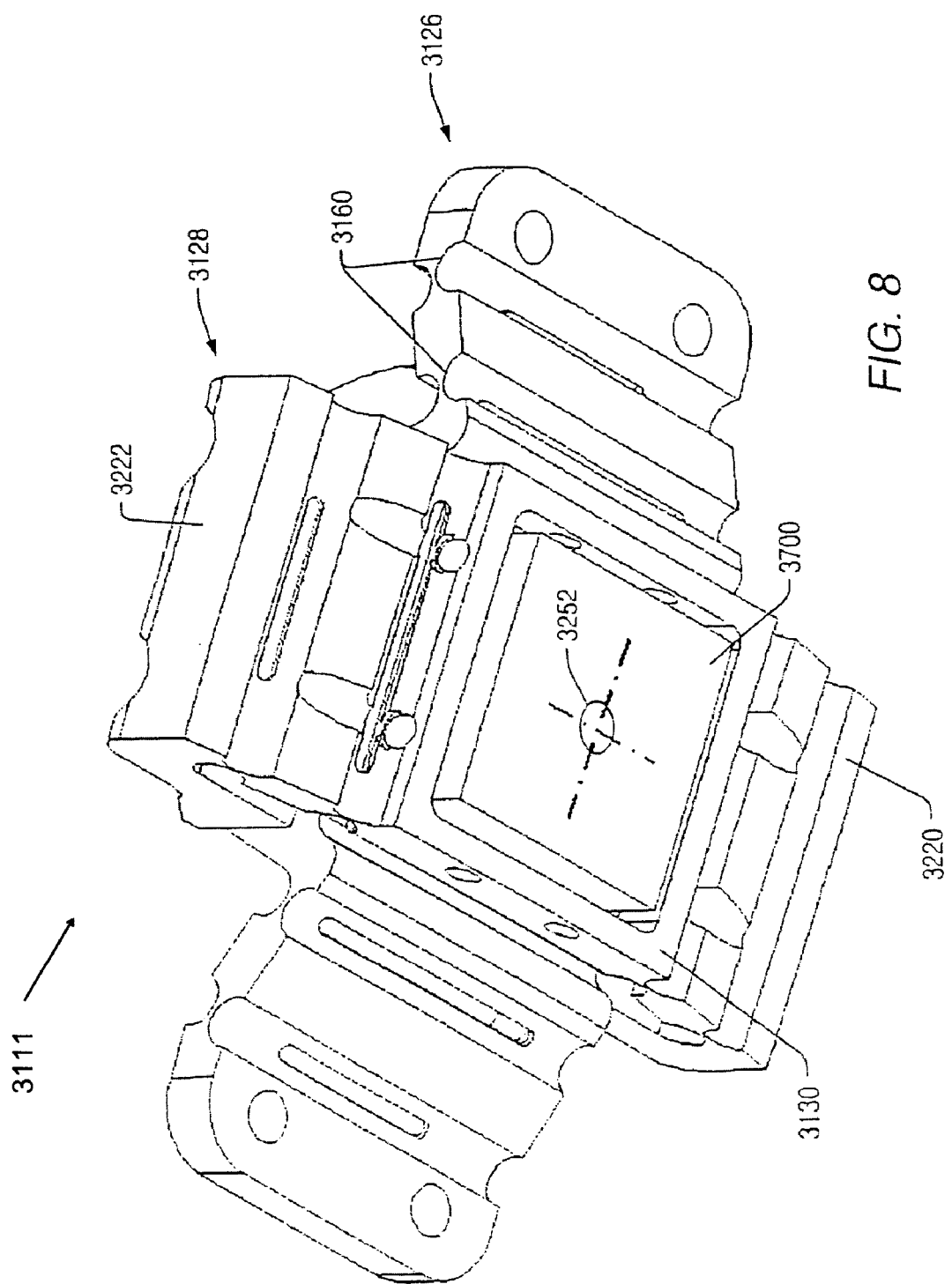
FIG. 8 depicts a projection view of first and second flexure members coupled together.

FIGS. 6 and 7 depict embodiments of first and second flexure members, 3126 and 3128, respectively, in more detail. As depicted in FIG. 6, first flexure member 3126 includes a plurality of flexure joints 3160 coupled to corresponding rigid bodies 3164 and 3166. Flexure joints 3160 may be notch shaped to provide motion of rigid bodies 3164 and 3166 about pivot axes that are located along the thinnest cross-section of the flexure joints. Flexure joints 3160 and rigid body 3164 together form arm 3172, while additional flexure joints 3160 and rigid body 3166 together form arm 3174. Arms 3172 and 3174 are coupled to and extend from first flexure frame 3170. First flexure frame 3170 has an opening 3182, which allows curing light (e.g., ultraviolet light) to pass through first flexure member 3126. In the depicted embodiment, four flexure joints 3160 allow motion of first flexure frame 3170 about a first orientation axis 3180. It should be understood, however, that more or less flexure joints may be used to achieve the desired control. First flexure member 3126 is coupled to second flexure member 3128 through first flexure frame 3170, as depicted in FIG. 8. First flexure member 3126 also includes two coupling members 3184 and 3186. Coupling members 3184 and 3186 include openings that allow attachment of the coupling members to flexure ring 3124, shown in FIG. 5, using any suitable fastening means. Coupling members 3184 and 3186 are coupled to first flexure frame 3170 via arms 3172 and 3174, as depicted in FIG. 6.

Second flexure member 3128 includes a pair of arms 3202 and 3204 extending from second flexure frame 3206, as depicted in FIG. 7. Flexure joints 3162 and rigid body 3208 together form arm 3202, while additional flexure joints 3162 and rigid body 3210 together form arm 3204. Flexure joints 3162 may be notch shaped to provide motion of rigid body 3210 and arm 3204 about pivot axes that are located along the thinnest cross-section of the flexure joints 3162. Arms 3202 and 3204 are coupled to and extend from template support 3130. Template support 3130 is configured to hold and retain at least a portion of a patterned template 3700, as described above. Template support 3130 also has an opening 3212, which allows curing light (e.g., ultraviolet light) to pass through second flexure member 3128. In the depicted embodiment, four flexure joints 3162 allow motion of template support 3130 about a second orientation axis 3200. It should be understood, however, that more or less flexure joints may be used to achieve the desired control. Second flexure member 3128 also includes braces 3220 and 3222. Braces 3220 and 3222 include openings that allow attachment of the braces to portions of first flexure member 3126.

In one embodiment, first flexure member 3126 and second flexure member 3128 are joined as shown in FIG. 8 to form fine orientation system 3111. Braces 3220 and 3222 are coupled to first flexure frame 3170 such that first orientation axis 3180 of first flexure member 3126 and second orientation axis 3200 of second flexure member 3128 are substantially orthogonal to each other. In such a configuration, first orientation axis 3180 and second orientation axis 3200 intersect at a pivot point 3252 at approximately the center region of patterned template 3700 disposed in template support 3130 of FIG. 8. This coupling of the first and second flexure members, 3126 and 3128, respectively, allows fine alignment and gap control of patterned template 3700 during use. While first and second flexure members 3126 and 3128 are depicted as discrete elements, it should be understood that the first and second flexure members 3126 and 3128 may be formed from a single machined part where the flexure members 3126 and 3128 are integrated together. Flexure members 3126 and 3128 are coupled by mating of surfaces such that motion of patterned template 3700 occurs about pivot point 3252, substantially reducing "swinging" and other motions that may shear imprinted features following imprint lithography. Fine orientation system 3111 imparts negligible lateral motion at the template surface and negligible twisting motion about the normal to the template surface due to selectively constrained high structural stiffness of the flexure joints 3162. Another advantage of using the herein described flexure members 3126 and 3120 is that they do not generate substantial amounts of particles, especially when compared with frictional joints. This offers an advantage for imprint lithography processes, as particles may disrupt such processes.

FIG. 9 depicts the assembled fine orientation system 3111 coupled to pre-calibration system 3109. Patterned template 3700 is positioned within template support 3130 that is part of second flexure member 3128. Second flexure member 3128 is coupled to first flexure member 3126 in a substantially orthogonal orientation. First flexure member 3126 is coupled to flexure ring 3124 via coupling members 3186 and 3184, shown in FIG. 6. Flexure ring 3124 is coupled to base plate 3122, as has been described above.

FIG. 10 represents a cross-section of pre-calibration system 3109 looking through cross-section 3260, shown in FIG. 9. As shown in FIG. 10, flexure ring 3124 is coupled to base plate 3122 with actuator 3134. Actuator 3134 includes an end 3270 coupled to a force detector 3135 that contacts flexure ring 3124. During use activation of actuator 3134 causes movement of end 3270 toward or away from flexure ring 3124. The movement of end 3270 toward flexure ring 3124 induces a deformation of flexure ring 3124 and causes translation of fine orientation system 3111, shown in FIG. 4, along the Z-axis toward the substrate. Movement of end 3270 away from flexure ring 3124 allows flexure ring 3124 to move to its original shape and, in the process, moves fine orientation system 3111, shown in FIG. 4, away from the substrate.

Referring to FIGS. 9 and 10, in a typical imprint process patterned template 3700 is disposed in template support 3130 coupled to fine orientation system 3111. Patterned template 3700 is brought into contact with a liquid on a surface of a substrate. Compression of the liquid on the substrate as patterned template 3700 is brought closer to the substrate causes a resistive force to be applied by the liquid onto patterned template 3700. This resistive force is translated through fine orientation system 3111 and to flexure ring 3124. The force applied against flexure ring 3124 will also be translated as a resistive force to actuator 3134. The resistive force applied to actuator 3134 may be determined using force detector 3135. Force detector 3135 may be coupled to actuator 3134 such that a resistive force applied to actuator 3134 during use may be determined and controlled.

Figure 11:
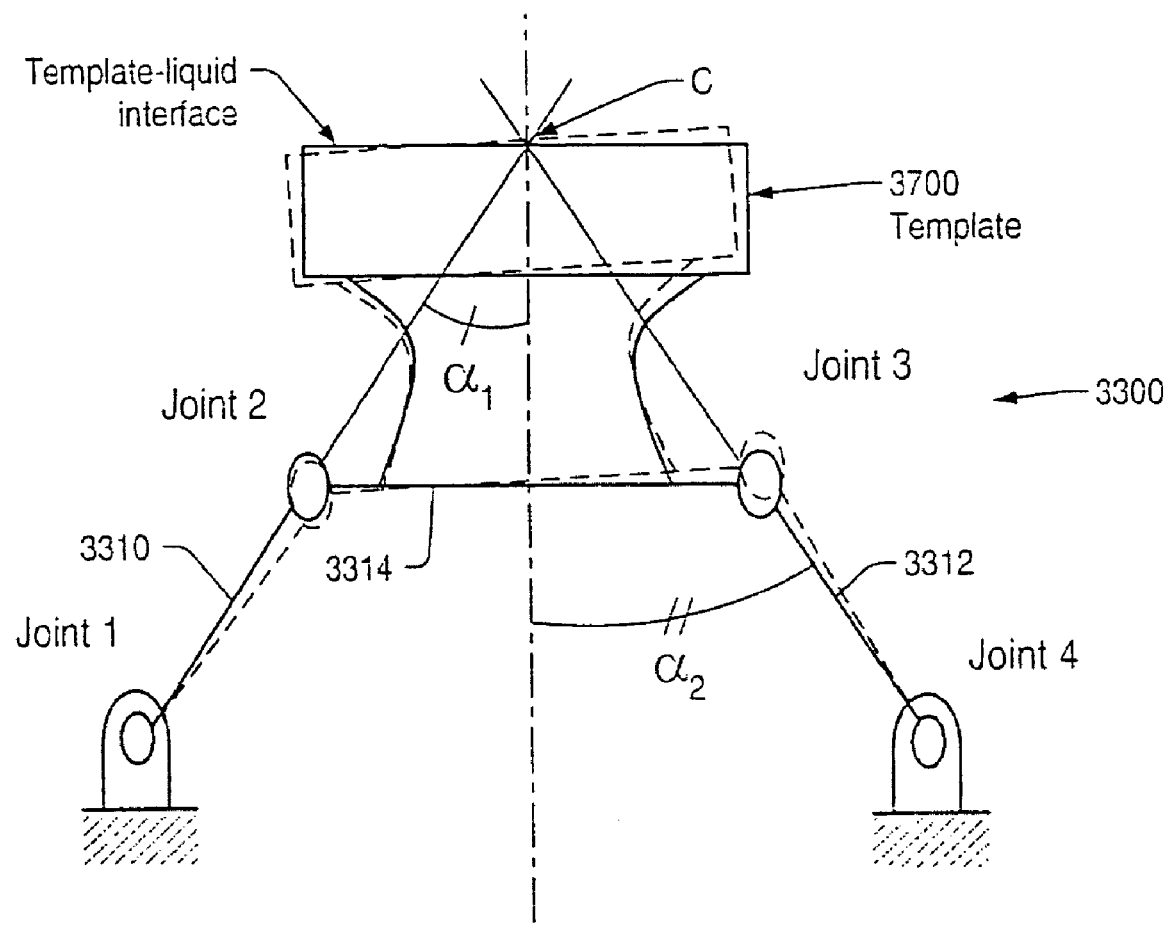
FIG. 11 depicts a schematic diagram of a flexure system.

FIG. 11 depicts a flexure model 3300 useful in understanding the principles of operation of a fine decoupled orientation stage, such as fine orientation stage 3111 shown in FIG. 4. Flexure model 3300 may include four parallel joints: Joints 1, 2, 3 and 4, that provide a four-bar-linkage system in its nominal and rotated configurations. Line 3310 denotes an axis of alignment of Joints 1 and 2. Line 3312 denotes an axis of alignment of Joints 3 and 4. Angle $\alpha_1$ represents an angle between a perpendicular axis through the center of patterned template 3700 and line 3310. Angle $\alpha_2$ represents a perpendicular axis through the center of patterned template 3700 and line 3310. Angles $\alpha_1$ and $\alpha_2$, in some embodiments, are selected so that the compliant alignment axis (or orientation axis) lies substantially at the surface of patterned template 3700. For fine orientation changes, rigid body 3314 between Joints 2 and 3 may rotate about an axis depicted by Point C. Rigid body 3314 may be representative of template support 3130 of second flexure member 3128, shown in FIG. 9.

Referring to FIGS. 6-11, fine system 3111 generates pure tilting motions with no substantial lateral motions at the surface of patterned template 3700 coupled to fine orientation system 3111. The use of flexure arms 3172, 3174, 3202, and 3204 may provide fine orientation system 3111 with high stiffness in the directions where side motions or rotations are undesirable and lower stiffness in directions where necessary orientation motions are desirable. Fine orientation system 3111 therefore allows rotations of template support 3130, and therefore patterned template 3700, about pivot point 3252 at the surface of patterned template 3700, while providing sufficient resistance in a direction perpendicular to patterned template 3700 and parallel to the template to maintain the proper position with respect to the substrate. In this manner a passive orientation system is used for orientation of patterned template 3700 to a parallel orientation with respect to patterned template 3700. The term "passive"

refers to a motion that occurs without any user or programmable controller intervention, i.e., the system self-corrects to a proper orientation by contact of patterned template 3700 with the liquid. Alternate embodiments in which the motion of flexure arms 3172, 3174, 3202 and 3204 are controlled by motors to produce an active flexure may also be implemented.

Motion of fine orientation system 3111 may be activated by direct or indirect contact with the liquid. If fine orientation system 3111 is passive, then it is, in one embodiment, designed to have the most dominant compliance about two orientation axes. The two orientation axes lie orthogonal to each other and lie on the imprinting surface of an imprinting member disposed on fine orientation system 3111. The two orthogonal torsional compliance values are set to be the same for a symmetrical imprinting member. A passive fine orientation system 3111 is designed to alter the orientation of patterned template 3700 when the template is not parallel with respect to a substrate. When patterned template 3700 makes contact with the liquid on the substrate, flexure members 3126 and 3128 compensate for the resulting uneven liquid pressure on patterned template 3700. Such compensation may be affected with minimal or no overshoot. Further, a fine orientation system 3111 as described above may hold the substantially parallel orientation between patterned template 3700 and the substrate for a sufficiently long period to allow curing of the liquid.

Imprint head 3100 is mounted to imprint head support 3910, as depicted in FIG. 1. In this embodiment, imprint head support 3910 is mounted such that imprint head 3100 remains in a fixed position at all times. During use, all movement along the X-Y plane is performed to the substrate by motion stage 3600.

Motion Stage

Figure 12:
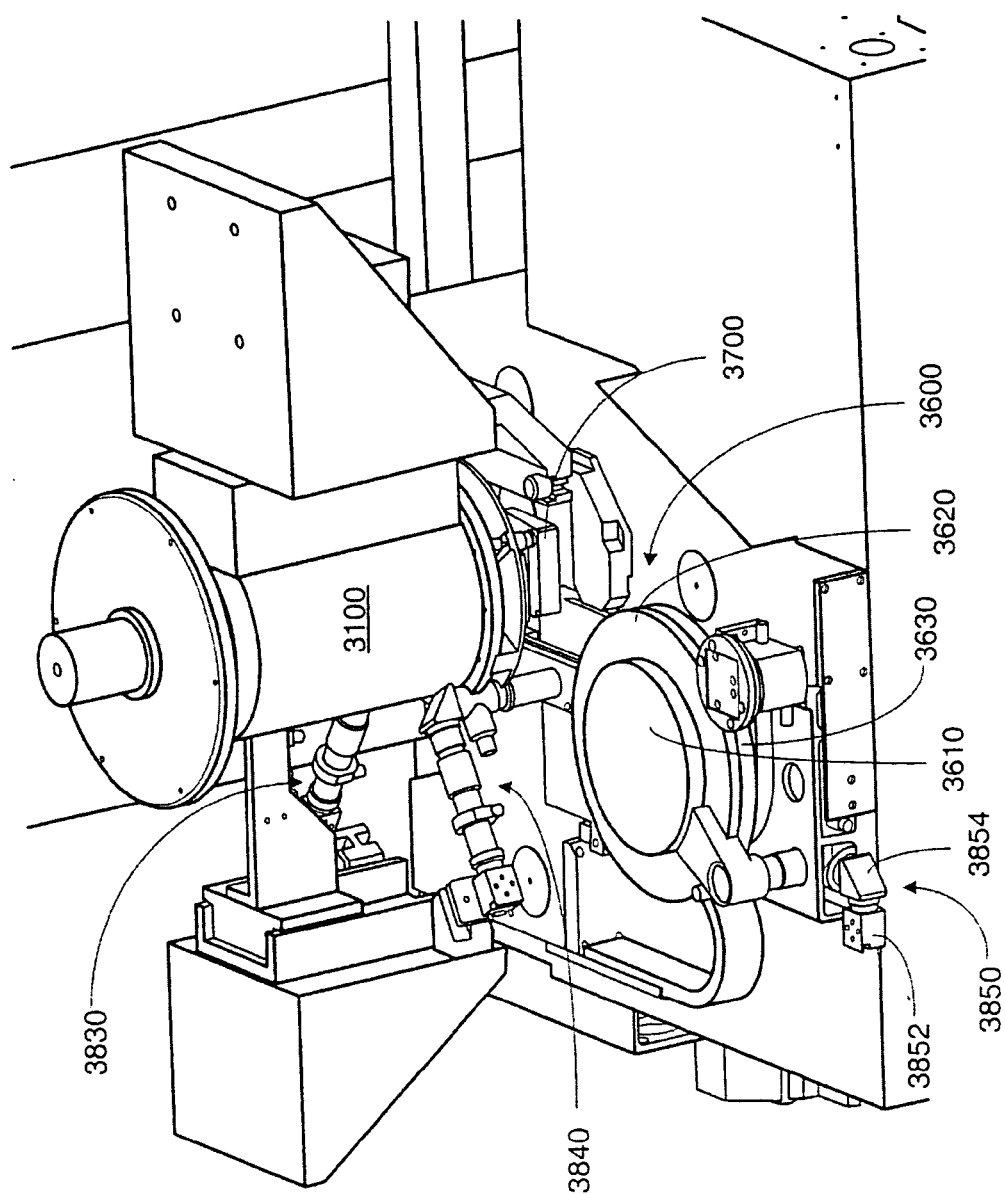
FIG. 12 depicts a projection view of a motion stage and an imprint head of an imprint lithography system.

Referring to FIG. 12, motion stage 3600 is used to support a substrate to be imprinted and move the substrate along an X-Y plane during use. Motion stage 3600, in some embodiments, is capable of moving a substrate over distances of up to several hundred millimeters with an accuracy of at least ±30 nm, preferably with an accuracy of about ±10 nm. In one embodiment, motion stage 3600 includes a substrate chuck 3610 that is coupled to carriage 3620. Carriage 3620 is moved about a base 3630 on a frictional bearing system or a non-frictional bearing system. In one embodiment, a non-frictional bearing system that includes an air bearing is used. Carriage 3620 is suspended above base 3630 of motion stage 3600 using, in one embodiment, an air layer (i.e., the "air bearing"). Magnetic or vacuum systems may be used to provide a counter balancing force to the air bearing level. Both magnetic-based and vacuum-based systems are commercially available from a variety of suppliers and any such systems may be used in an imprint lithography process. One example of a motion stage that is applicable to imprint lithography processes is the Dynam YX motion stage commercially available from Newport Corporation, Irvine Calif. Motion stage 3600 also may include a tip-tilt stage similar to the calibration stage, designed to approximately level the substrate to the X-Y motion plane. It also may include one or more theta stages to orient the patterns on the substrate to the X-Y motion axes.

Liquid Dispenser

Figure 13:
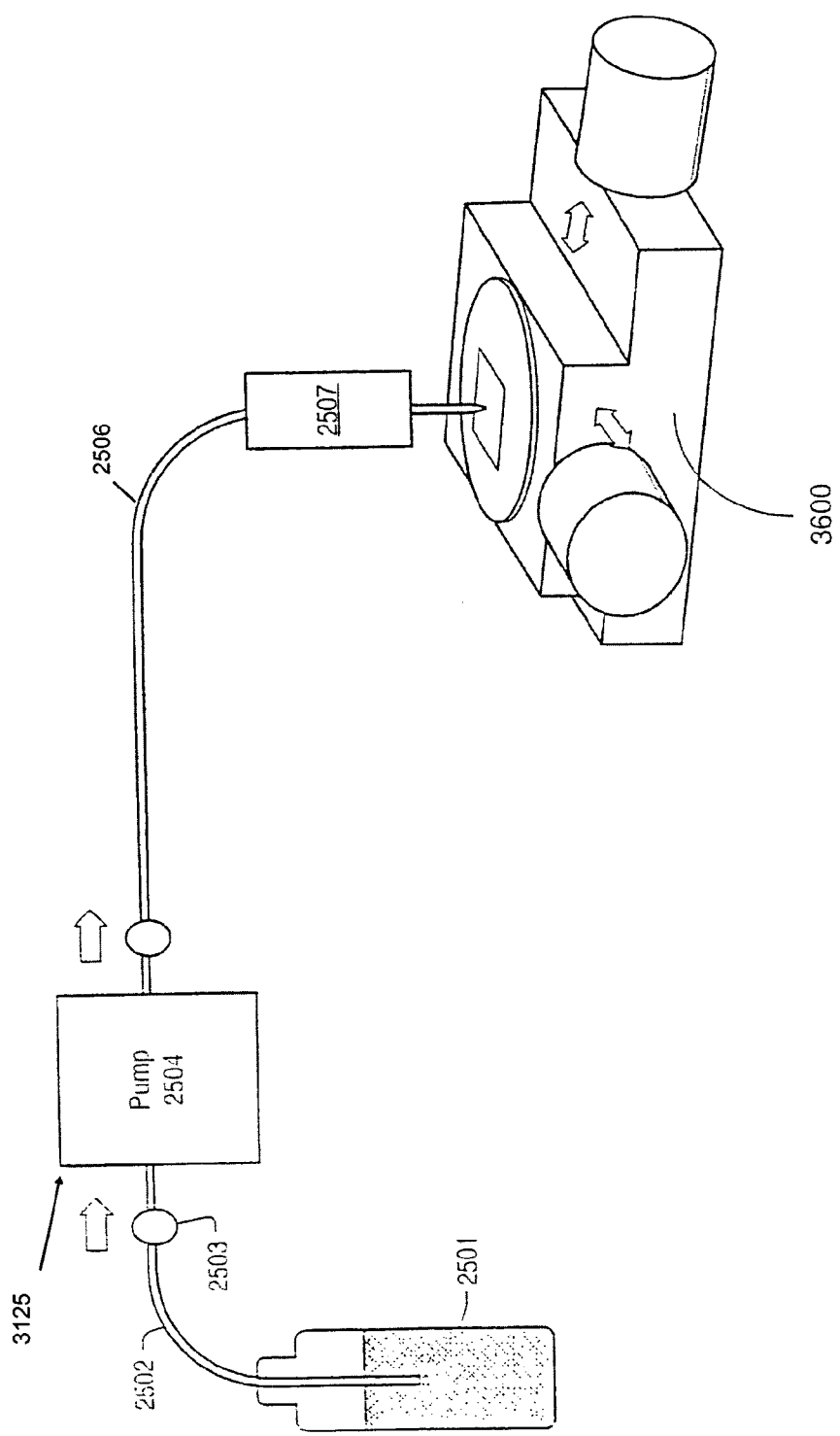
FIG. 13 depicts a schematic diagram of a liquid dispense system.

Referring to FIGS. 1 and 13, imprint lithography system 3900 also includes a liquid dispense system 3125 which is used to dispense a curable liquid onto a substrate. Liquid dispense system 3125 is coupled to the system body. In one embodiment, a liquid dispense system 3125 is coupled to imprint head 3100. FIG. 3 depicts liquid dispenser head 2507 of liquid dispense system 3125 extending out from cover 3127 of imprint head 3100. Various components of liquid dispense system 3125 may be disposed in cover 3127 of imprint head 3100.

A schematic of liquid dispense system 3125 is depicted in FIG. 13. In an embodiment, liquid dispense system 3125 includes a liquid container 2501. Liquid container 2501 is configured to hold an activating light curable liquid. Liquid container 2501 is coupled to a pump 2504 via inlet conduit 2502. An inlet valve 2503 is positioned between liquid container 2501 and pump 2504 to control flow through inlet conduit 2502. Pump 2504 is coupled to liquid dispenser head 2507 via outlet conduit 2506.

Liquid dispense system 3125 is configured to allow precise volume control of the amount of liquid dispensed onto an underlying substrate. In one embodiment, liquid control is achieved using a piezoelectric valve as pump 2504. Piezoelectric valves are available commercially available from the Lee Company, Westbrook, Conn. During use, a curable liquid is drawn into pump 2504 through inlet conduit 2502. When a substrate is properly positioned below, pump 2504 is activated to force a predetermined volume of liquid through outlet conduit 2506. The liquid is then dispensed through liquid dispenser head 2507 onto the substrate. In this embodiment, liquid volume control is achieved by control of pump 2504. Rapid switching of pump 2504 from an open to closed state allows a controlled amount of liquid to be sent to liquid dispenser head 2507. Pump 2504 is configured to dispense liquid in volumes of less than about 1 μL. The operation of pump 2504 may allow either droplets of liquid or a continuous pattern of liquid to be dispensed onto the substrate. Droplets of liquid are applied by rapidly cycling pump 2504 from an open to closed state. A stream of liquid is produced on the substrate by leaving pump 2504 in an open state and moving the substrate under liquid dispenser head 2507.

In another embodiment, liquid volume control may be achieved by use of liquid dispenser head 2507. In such a system, pump 2504 is used to supply a curable liquid to liquid dispenser head 2507. Small drops of liquid whose volume may be accurately specified are dispensed using a liquid dispensing actuator. Examples of liquid dispensing actuators include micro-solenoid valves or piezo-actuated dispensers. Piezo-actuated dispensers are commercially available from MicroFab Technologies, Inc., Plano, Tex. Liquid dispensing actuators are incorporated into liquid dispenser head 2507 to allow control of liquid dispensing. Liquid dispensing actuators are configured to dispense between about 50 pL to about 1000 pL of liquid per drop of liquid dispensed. Advantages of a system with a liquid dispensing actuator include faster dispensing time and more accurate volume control. Liquid dispensing systems are further described in U.S. Ser. No. 09/908,455 filed Jul. 17, 2001, entitled "Method and System of Automatic Fluid Dispensing for Imprint Lithography Processes," which is incorporated herein by reference.

Coarse Measurement System

Coarse determination of the position of patterned template 3700 and the substrate is determined by the use of linear encoders (e.g., exposed linear encoders). Encoders offer a coarse measurement on the order of 0.01 μm. Linear encoders include a scale coupled to the moving object and a reader coupled to the body. The scale may be formed from a variety of materials including glass, glass ceramics, and steel. The scale includes a number of markings that are read by the reader to determine a relative or absolute position of the moving object. The scale is coupled to motion stage 3600 by means that are known in the art. A reader is coupled to the body and optically coupled to the scale. In one embodiment, an exposed linear encoder may be used. Encoders may be configured to determine the position of motion stage 3600 along either a single axis, or in a two-axis plane. An example of an exposed two-axis linear encoder is the PP model encoder available from Heidenhain Corporation, Schaumburg, Ill. Generally, encoders are built into many commercially available X-Y motion stages. For example, the Dynam YX motion stage available from Newport Corp. has a two-axis encoder built into the system.

Referring to FIG. 3, the coarse position of patterned template 3700 along the Z-axis is also determined using a linear encoder. In one embodiment, an exposed linear encoder may be used to measure the position of patterned template 3700. A scale of the linear encoder, in one embodiment, is coupled to the pre-calibration ring of imprint head 3100. Alternatively, the scale may be coupled directly to template support 3130. The reader is coupled to the body and optically coupled to the scale. Position of patterned template 3700 is determined along the Z-axis by use of encoders.

Interferometers

In some embodiments, the detection of the position of the template and substrate during an imprint lithography process needs to be known to a degree of accuracy of less than 100 nm. Since many features on a patterned template in a high-resolution semiconductor process are smaller than 100 nm, such control is important to allow proper alignment of the features. Fine position detection, in one embodiment, may be determined using interferometers (e.g., laser interferometers).

Figure 42:
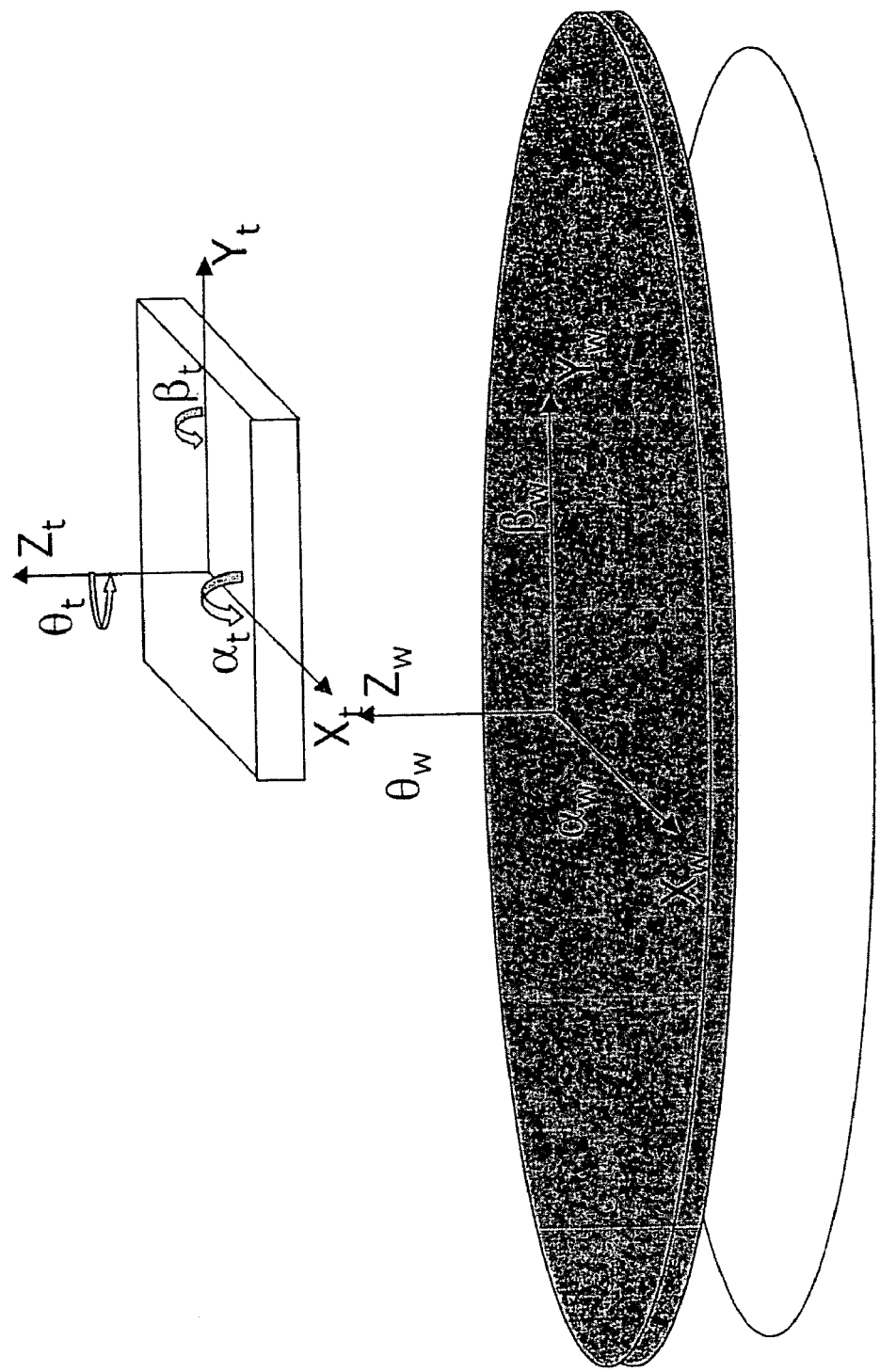
FIG. 42 depicts a schematic view of the degrees of motion of the template and the substrate.

FIG. 42 depicts the axis of rotation and movement that may be determined during an imprint lithography process. The substrate position is determined along the $X_W$ axis, the $Y_W$ axis and the $Z_W$ axis. Rotation of the substrate may also be determined about the X-axis ($\alpha_W$), about the Y-axis ($\beta_W$) and about the Z-axis ($\theta_W$). Similarly the position of the template is determined along the X, Y and Z axis. Rotation of the template may also be determined about the X-axis ($\alpha_T$), about the Y-axis ($\beta_T$) and about the Z-axis ($\theta_T$). To produce alignment of the template with the substrate the X, Y, and Z coordinates, as well as the $\alpha$, $\beta$ and $\theta$ angles should be matched.

Figure 43:
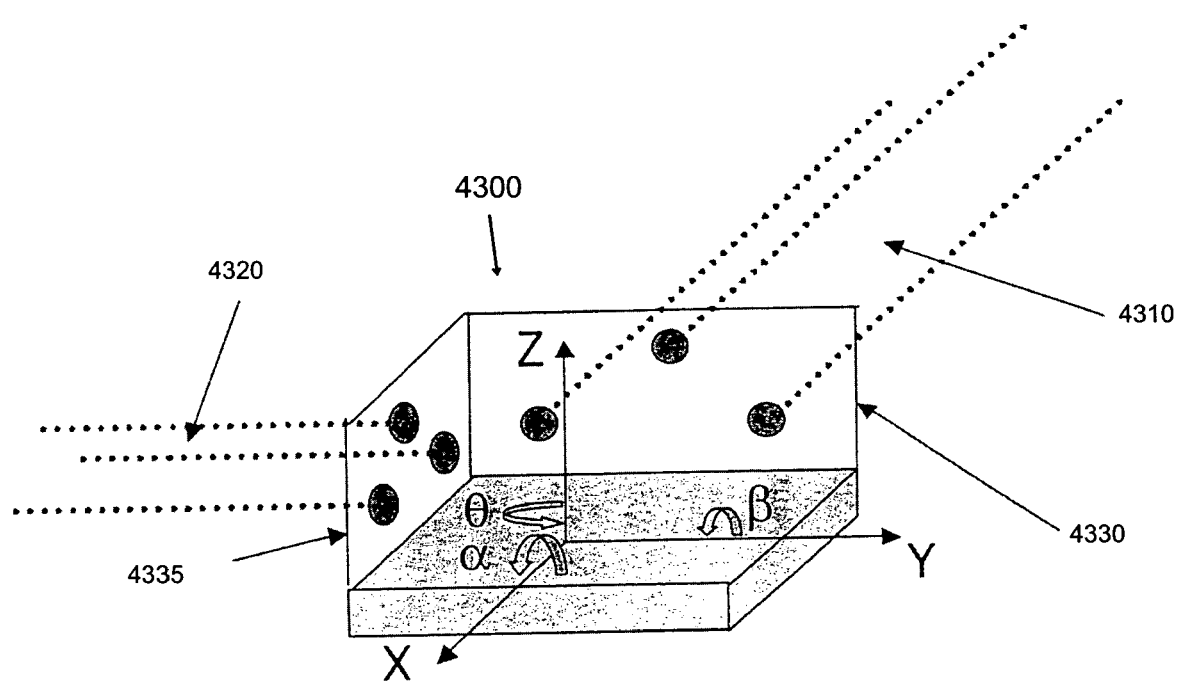
FIG. 43 depicts a schematic view of an interferometer based position detector.

Linear encoders may be used to determine X-axis, Y-axis and Z-axis positions of the template and substrate. However, such encoders typically do not provide the rotational information about these axes. In one embodiment, interferometers may be used to determine the X-axis and Y-axis position of the template and substrate and the rotational angles $\alpha$, $\beta$, and $\theta$. A schematic of an interferometer based position detection system is depicted in FIG. 43. An interferometer system 4300 includes a first three axis laser interferometer 4310 and a second three axis laser interferometer 4320. Mirror 4330 and mirror 4335 are coupled to the substrate and/or template. Mirror 4330 and mirror 4335 are optically coupled to first and second laser interferometers 4310 and 4320, respectively. Mirror 4330 is positioned on a portion of the template and/or substrate that is perpendicular to a side that mirror 4335 is placed on the template and/or substrate. As depicted in FIG. 43, this allows five degrees of motion to be determined substantially simultaneously. First laser interferometer 4310 will provide sensing of the position of the substrate and/or template along the X-axis and the rotational angles $\beta$ and $\theta$. Second laser interferometer 4320 will provide sensing of the position of the substrate and/or template along the Y-axis and the rotational angles $\alpha$ and $\theta$.

Figure 44:
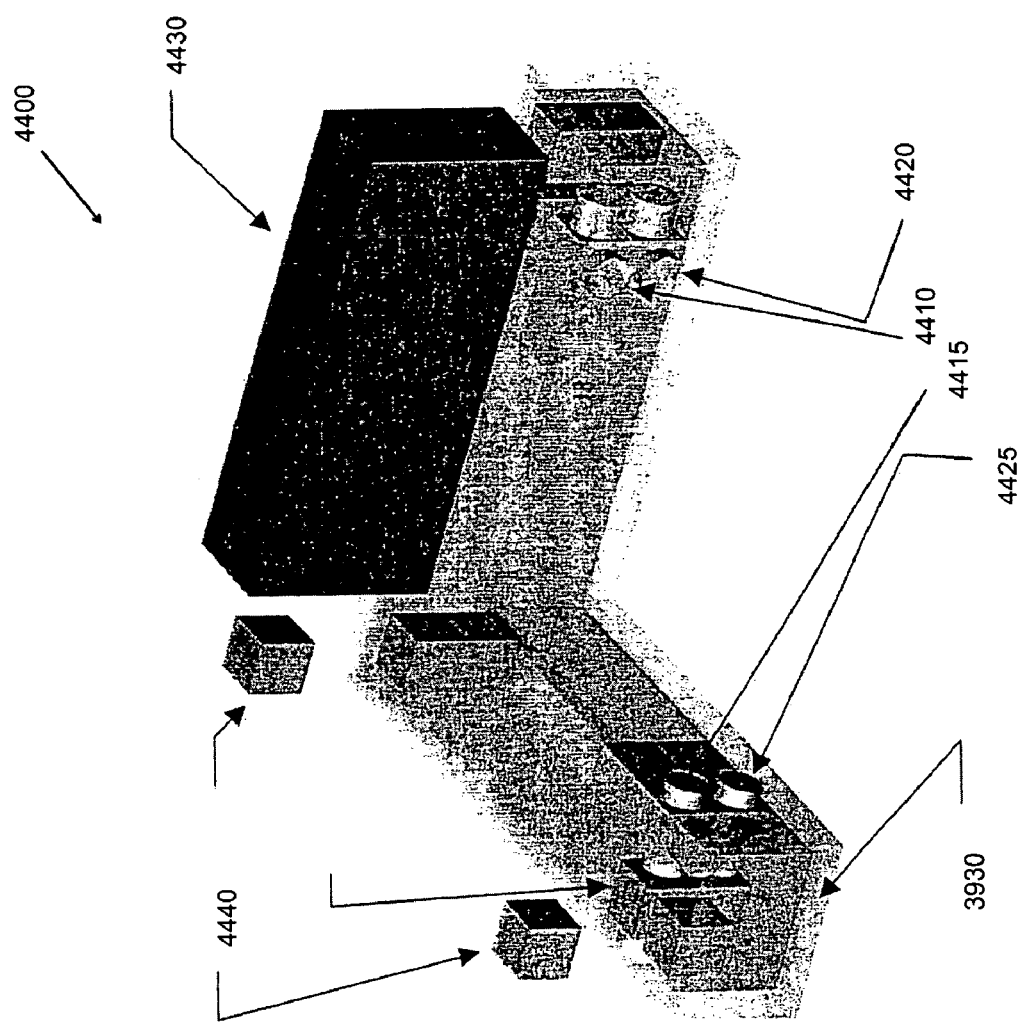
FIG. 44 depicts a projection view of a an interferometer based position detector.

An embodiment of an interferometer based position detector 4400 for use in imprint lithography system 3900, shown in FIG. 1, is depicted in FIG. 44. Position detector 4400 is mounted to a portion of the body of imprint lithography system 3900, shown in FIG. 1. For example, position detector 4440 may be mounted to support 3930 of the body. Position detector 4400 includes, in one embodiment, four interferometers. Interferometers are, in one embodiment, laser based. Either differential or absolute interferometers may be used. Two interferometers 4410 and 4415 are used for position determination of the template. The other two interferometers 4420 and 4425 are used for position determination of the substrate. In one embodiment, all of the interferometers 4410, 4415, 4420 and 4425 are three axis interferometers. The use of this arrangement of interferometers 4410, 4415, 4420 and 4425 allows five degrees of movement (e.g., X and Y position and $\alpha$, $\beta$ and $\theta$ rotation) of both the template and the substrate. Laser 4430 provides light for the interferometers. Light from the laser 4430 is conducted to interferometers 4410, 4415, 4420, and 4425 through optical components 4440 (note: not all optical components have been referenced). Optical components 4440 include beam splitters and mirror systems to conduct light from the laser 4430 to the interferometers 4410, 4415, 4420 and 4425. Interferometer systems and the appropriate optical systems are commercially available from several sources.

Air Gauges

In an embodiment, an air gauge 3135 may be coupled to imprint head 3100, as depicted in FIG. 3. Air gauge 3135 is used to determine whether a substrate disposed on motion stage 3600 is substantially parallel to a reference plane. As used herein, an "air gauge" refers to a device that measures the pressure of a stream of air directed toward a surface. When a substrate is disposed under an outlet of air gauge 3135, the distance the substrate is from the outlet of air gauge 3135 will influence the pressure air gauge 3135 senses. Generally, the further away from air gauge 3135 the substrate is, the lesser the pressure.

In such a configuration, air gauge 3135 may be used to determine differences in pressure resulting from changes in the distance between the substrate surface and air gauge 3135. By moving air gauge 3135 along the surface of the substrate, air gauge 3135 determines the distance between air gauge 3135 and the substrate surface at the various points measured. The degree of planarity of the substrate with respect to air gauge 3135 is determined by comparing the distance between air gauge 3135 and the substrate at the various points measured. The distance between at least three points on the substrate and air gauge 3135 is used to determine if a substrate is planar. If the distance is substantially the same, the substrate is considered to be planar. Significant differences in the distances measured between the substrate and air gauge 3135 indicate a non-planar relationship between the substrate and air gauge 3135. This non-planar relationship may be caused by the non-planarity of the substrate or a tilt of the substrate. Prior to use, a tilt of the substrate is corrected to establish a planar relationship between the substrate and patterned template 3700. Suitable air gauges may be obtained from Senex Inc.

During use of air gauges, the substrate or patterned template 3700 is placed within the measuring range of air gauge 3135. Motion of the substrate toward air gauge 3135 may be accomplished by either Z-axis motion of imprint head 3100 or Z-axis motion of motion stage 3600.

Light Source

In an imprint lithography process, a light curable liquid is disposed on a surface of the substrate. Patterned template 3700 is brought into contact with the light curable liquid and activating light is applied to the light curable liquid. As used herein "activating light" means light that may affect a chemical change. Activating light may include ultraviolet light (e.g., light having a wavelength between about 200 nm to about 400 nm), actinic light, visible light or infrared light. Generally, any wavelength of light capable of affecting a chemical change may be classified as activating. Chemical changes may be manifested in a number of forms. A chemical change may include, but is not limited to, any chemical reaction that causes a polymerization or a cross-linking reaction to take place. The activating light, in one embodiment, is passed through patterned template 3700 prior to reaching the composition. In this manner the light curable liquid is cured to form structures complementary to the structures formed on patterned template 3700.

In some embodiments, activating light source 3500 is an ultraviolet light source capable of producing light having a wavelength between about 200 nm to about 400 nm. Activating light source 3500 is optically coupled to patterned template 3700, as depicted in FIG. 1. In one embodiment, activating light source 3500 is positioned proximate to imprint head 3100. Imprint head 3100 includes a mirror 3121, as depicted in FIG. 4, which reflects light from activating light source 3500 to patterned template 3700. Light passes through an opening in the body of imprint head 3100 and is reflected by mirror 3121 toward patterned template 3700. In this manner, activating light source 3500 irradiates patterned template 3700 without being disposed in imprint head 3100.

Most activating light sources produce a significant amount of heat during use. If activating light source 3500 is too close to imprint lithography system 3900, heat from the light source will radiate toward the body of imprint lithography system 3900 and may cause the temperature of portions of the body to increase. Since many metals expand when heated, the increase in temperature of a portion of the body of imprint lithography system 3900 may cause the body to expand. This expansion may affect the accuracy of imprint lithography system 3900 when sub-100 nm features are being produced.

Figure 14:
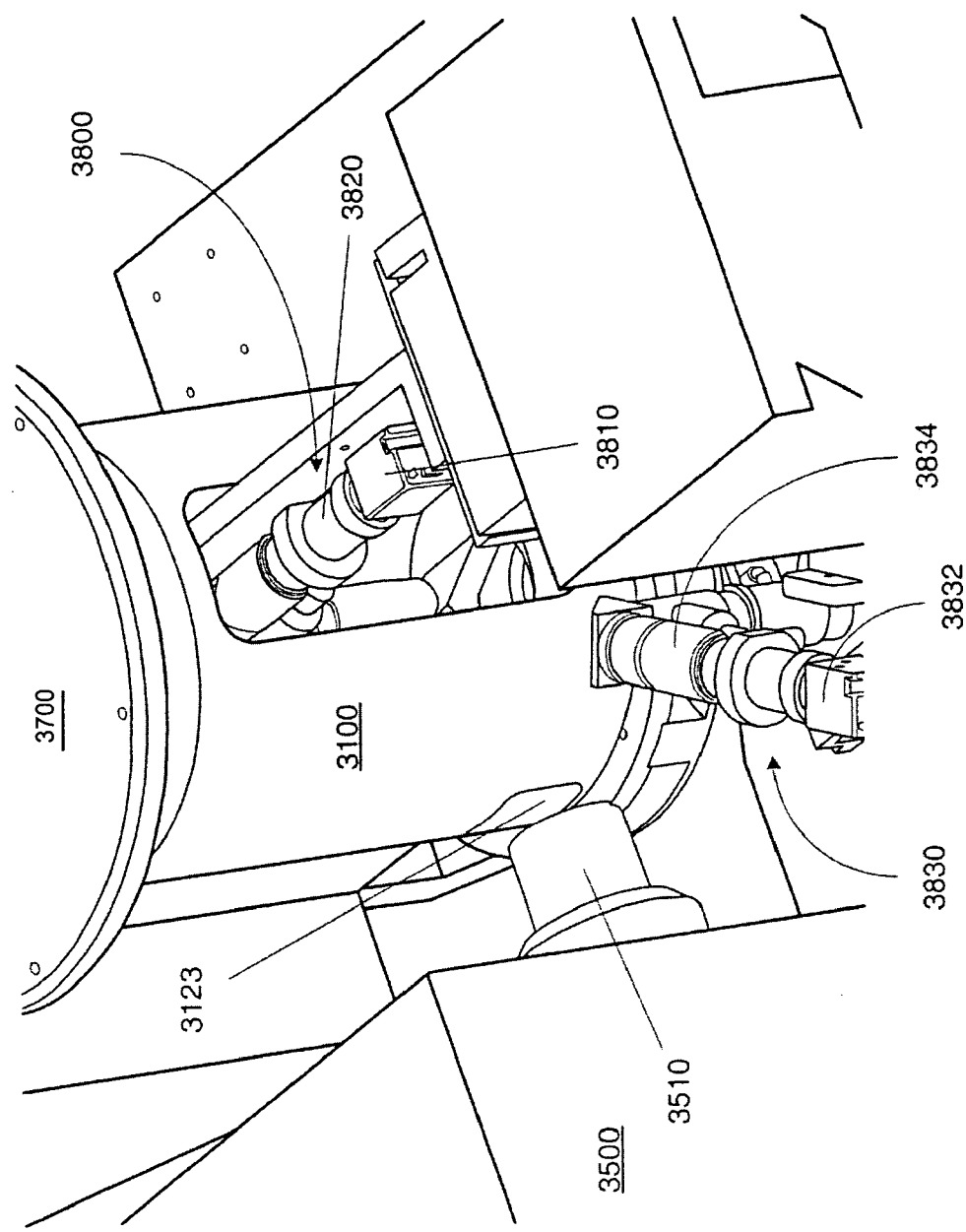
FIG. 14 depicts a projection view of an imprint head with a light source and camera optically coupled to the imprint head.

In one embodiment, activating light source 3500 is positioned at a sufficient distance from the body such that the system body is insulated from heat produced by activating light source 3500 by the intervening air between activating light source 3500 and imprint head 3100. FIG. 14 depicts activating light source 3500 optically coupled to imprint head 3100. Activating light source 3500 includes an optical system 3510 that projects light generated by a light source toward imprint head 3100. Light passes from optical system 3510 into imprint head 3100 via opening 3123. Light is then reflected toward patterned template 3700 coupled to imprint head 3100 by mirror 3121 disposed within the imprint head 3100 (see FIG. 4). In this manner, the light source is thermally insulated from the body. A suitable light source may be obtained from OAI Inc., Santa Clara, Calif.

Optical Alignment Devices

Referring to FIG. 1, one or more optical measuring devices may be optically coupled to imprint head 3100 and/or motion stage 3600. Generally, an optical measuring device is any device that allows the position and/or orientation of patterned template 3700 with respect to a substrate to be determined.

Turning to FIG. 14, a through-the-template optical imaging system 3800 is optically coupled to imprint head 3100. Optical imaging system 3800 includes an optical imaging device 3810 and an optical system 3820. Optical imaging device 3810, in one embodiment, is a CCD microscope. Optical imaging system 3800 is optically coupled to patterned template 3700 through imprint head 3100. Optical imaging system 3800 is also optically coupled to a substrate, when the substrate is disposed under patterned template 3700. Optical imaging system 3800 is used to determine the placement error between patterned template 3700 and an underlying substrate as described herein. In one embodiment, mirror 3121 (depicted in FIG. 4) is movable within imprint head 3100. During an alignment or optical inspection process, mirror 3121 is moved out of the optical path of optical imaging system 3800.

During use of an optical alignment device, the substrate or patterned template 3700 is placed within the measuring range (e.g., the field of view) of optical imaging system 3800. Motion of the substrate toward optical imaging system 3800 may be accomplished by either Z-axis motion of imprint head 3100 or Z-axis motion of motion stage 3600, shown in FIG. 7.

Additional optical imaging devices may be coupled to imprint head 3100 for viewing the substrate in an off-axis position. Off-axis positions are herein defined as a position that is not in the optical path of the activating light source. An off-axis optical imaging system 3830 is coupled to imprint head 3100 as depicted in FIG. 14. Off-axis optical imaging system 3830 includes an optical imaging device 3832 and an optical system 3834. Optical imaging device 3810, in one embodiment, is a CCD microscope. Off-axis optical imaging system 3830 is used to scan the substrate without having patterned template 3700 in the optical path. Off-axis optical imaging system 3830 may be used for off-axis alignment processes as described herein. Additionally, off-axis optical imaging system 3830 may be used to perform coarse alignment of patterned template 3700 with the substrate, while through-the-template optical imaging system 3800 is used for fine alignment of patterned template 3700 with the substrate. Additional off-axis optical systems may be coupled to imprint head 3100. FIG. 12 depicts an additional off-axis optical system 3840 coupled to imprint head 3100.

An additional optical imaging device may be coupled to the motion stage for viewing patterned template 3700. A template optical imaging system 3850 is coupled to motion stage 3600 as depicted in FIG. 12. Template optical imaging system 3850 includes an optical imaging device 3852 and an optical system 3854. Optical imaging device 3852, in one embodiment, is a CCD microscope. Template optical imaging system 3850 is used to scan the surface of patterned template 3700 without having to scan through the bulk of patterned template 3700. Template optical imaging system 3850 may be used for off-axis alignment processes as described herein.

It should be understood that optical imaging systems may be disposed in alternate system embodiments described herein. For example, in an alternate system embodiment, an optical imaging system may be coupled to a motion stage that is configured to move the imprint head. In such embodiments, the substrate is mounted to a substrate support that also includes an optical imaging device.

Light Curable Liquid

As previously mentioned, a light curable liquid is placed on a substrate and a template is brought into contact with the liquid during an imprint lithography process. The curable liquid is a low viscosity liquid monomer solution. A suitable solution may have a viscosity ranging from about 0.01 cps to about 100 cps (measured at 25° C.). Low viscosities are especially desirable for high-resolution (e.g., sub-100 nm) structures. Low viscosities also lead to faster gap closing. Additionally, low viscosities result in faster liquid filling of the gap area at low pressures. In particular, in the sub-50 nm regime, the viscosity of the solution should be at or below about 30 cps, or more preferably below about 5 cps (measured at 25° C.).

Many of the problems encountered with other lithography techniques may be solved by using a low viscosity light curable liquid in an imprint lithography process. Patterning of low viscosity light curable liquids solves each of the issues facing hot embossing techniques by utilizing a low-viscosity, light-sensitive liquid. Also use of a thick, rigid, transparent template offers the potential for easier layer-to-layer alignment. The rigid template is, in general, transparent to both liquid activating light and alignment mark measurement light.

The curable liquid may be composed of a variety of polymerizable materials. Generally, any photopolymerizable material may be used. Photopolymerizable materials may include a mixture of monomers and a photoinitiator. In some embodiments, the curable liquid may include one or more commercially available negative photoresist materials. The viscosity of the photoresist material may be reduced by diluting the liquid photoresist with a suitable solvent.

In an embodiment, a suitable curable liquid includes a monomer, a silylated monomer, and an initiator. A crosslinking agent and a dimethyl siloxane derivative may also be included. Monomers include, but are not limited to, acrylate and methacylate monomers. Examples of monomers include, but are not limited to, butyl acrylate, methyl acrylate, methyl methacrylate, or mixtures thereof. The monomer makes up approximately 25 to 50% by weight of the curable liquid. It is believed that the monomer ensures adequate solubility of the photoinitiator in the curable liquid. It is further believed that the monomer provides adhesion to an underlying organic transfer layer, when used.

The curable liquid may also include a silylated monomer. Silylated monomers in general are polymerizable compounds that include a silicon group. Classes of silylated monomers include, but are not limited to, silane acrylyl and silane methacrylyl derivatives. Specific examples include methacryloxypropyl tris(tri-methylsiloxy)silane and (3-acryloxypropyl)tris(tri-methoxysiloxy)-silane. Silylated monomers may be present in amounts from 25 to 50% by weight. The curable liquid may also include a dimethyl siloxane derivative. Examples of dimethyl siloxane derivatives include, but are not limited to, (acryloxypropyl) methylsiloxane dimethylsiloxane copolymer, acryloxypropyl methylsiloxane homopolymer, and acryloxy terminated polydimethylsiloxane. Dimethyl siloxane derivatives are present in amounts from about 0 to 50% by weight. It is believed that the silylated monomers and the dimethyl siloxane derivatives may impart a high oxygen etch resistance to the cured liquid. Additionally, both the silylated monomers and the dimethyl siloxane derivatives are believed to reduce the surface energy of the cured liquid, therefore increasing the ability of the template to release from the surface. The silylated monomers and dimethyl siloxane derivatives listed herein are all commercially available from Gelest, Inc.

Any material that may initiate a free radical reaction may be used as the initiator. For activating light curing of the curable material, it is preferred that the initiator is a photoinitiator. Examples of initiators include, but are not limited to, alpha-hydroxyketones (e.g., 1-hydroxycyclohexyl phenyl ketone, sold by Ciba-Geigy Specialty Chemical Division as Irgacure 184), and acylphosphine oxide initiators (e.g., phenylbis(2,4,6-trimethyl benzoyl) phosphine oxide, sold by Ciba-Geigy Specialty Chemical Division as Irgacure 819).

The curable liquid may also include a crosslinking agent. Crosslinking agents are monomers that include two or more polymerizable groups. In one embodiment, polyfunctional siloxane derivatives may be used as a crosslinking agent. An example of a polyfunctional siloxane derivative is 1,3-bis (3-methacryloxypropyl)-tetramethyl disiloxane.

In one example, a curable liquid may include a mixture of 50% by weight of n-butyl acrylate and 50% (3-acryloxypropyl)tris-trimethylsiloxane-silane. To this mixture 3% by weight mixture of a 1:1 Irgacure 819 and Irgacure 184 and 5% of the crosslinker 1,3-bis(3-methacryloxypropyl)-tetramethyl disiloxane may be added. The viscosity of this mixture is less than 30 cps measured at about 25° C.

Curable Liquid with Gas Release

In an alternate embodiment, the curable liquid may be formed of a monomer, an acid-generating photo-agent, and a base-generating photo-agent. Examples of the monomer include, but are not limited to, phenolic polymers and epoxy resins. The acid-generating photo-agent is a compound that releases acid when treated with activating light. The generated acid catalyzes polymerization of the monomer. Those of ordinary skill in the art know such acid-generating additives, and the specific acid-generating additive used depends on the monomer and the desired curing conditions. In general, the acid-generating additive is selected to be sensitive to radiation at the first wavelength $\lambda_1$, which, in some implementations, is in the visible or near ultraviolet (near UV) range. For example, in some implementations, the first wavelength $\lambda_1$ is selected to be approximately 400 nm or longer. A base generating photo-agent is also added to the monomer. The base-generating photo-agent may inhibit curing of the monomer near the interface of the template. The base generating photo-agent may be sensitive to radiation at a second wavelength $\lambda_2$, yet inert or substantially inert to radiation at the first wavelength $\lambda_1$. Moreover, the second wavelength $\lambda_2$ should be selected so that radiation at the second wavelength is primarily absorbed near the surface of the monomer at the interface with the template and does not penetrate very far into the curable liquid. For example, in some implementations, a base generating additive that is sensitive to radiation having a wavelength $\lambda_2$ in the deep UV range, in other words, radiation having a wavelength in the range of about 190-280 nm, may be used.

According to an embodiment, a curable liquid that includes a monomer, an acid-generating photo-agent and a base-generating photo-agent is deposited onto a substrate. A template is brought into contact with the curable liquid. The curable liquid is then exposed to radiation at a first wavelength $\lambda_1$ and a second wavelength $\lambda_2$ of light at substantially the same time. Alternatively, the curing liquid may be exposed to the radiation at the second wavelength $\lambda_2$ and subsequently to the radiation at the first wavelength $\lambda_1$. Exposure of the curable liquid to radiation at the second wavelength $\lambda_2$ produces an excess of base near the interface with the template. The excess base serves to neutralize the acid that is produced by exposure of the curable liquid to radiation at the first wavelength $\lambda_1$, thereby inhibiting the acid from curing the curable liquid. Since the radiation at the second wavelength $\lambda_2$ has a shallow penetration depth into the curable liquid, the base produced by that radiation only inhibits curing of the curable liquid at or near the interface with the template. The remainder of the curable liquid is cured by exposure to the longer wavelength radiation ($\lambda_1$) which penetrates throughout the curable liquid. U.S. Pat. No. 6,218,316 entitled "Planarization of Non-Planar Surfaces in Device Fabrication" describes additional details concerning this process and is incorporated herein by reference.

In another embodiment, the curable liquid may include a photosensitive agent which, when exposed, for example, to deep UV radiation, decomposes to produce one or more gases such as hydrogen ($H_2$), nitrogen ($N_2$), nitrous oxide ($N_2O$), sulfur tri-oxide ($SO_3$), acetylene ($C_2H_2$), carbon dioxide ($CO_2$), ammonia ($NH_3$) or methane ($CH_4$). Radiation at a first wavelength $\lambda_1$, such as visible or near UV, may be used to cure the curable liquid, and the deep UV radiation ($\lambda_2$) may be used to produce one or more of the foregoing gases. The generation of the gases produces localized pressure near the interface between the cured liquid and the template to facilitate separation of the template from the cured liquid. U.S. Pat. No. 6,218,316 describes additional details concerning this process and is incorporated herein by reference.

In another embodiment, a curable liquid may be composed of a monomer that cures to form a polymer that may be decomposed by exposure to light. In one embodiment, a polymer with a doubly substituted carbon backbone is deposited on the substrate. After the template is brought into contact with the curable liquid, the curable liquid is exposed to radiation at a first wavelength $\lambda_1$ (e.g., greater than 400 nm) and radiation at the second wavelength $\lambda_2$ in the deep UV range. Radiation at the first wavelength serves to cure the curable liquid. When the curable liquid is exposed to the second wavelength $\lambda_2$, scission occurs at the substituted carbon atoms. Since deep UV radiation does not penetrate deeply into the curable liquid, the polymer decomposes only near the interface with the template. The decomposed surface of the cured liquid facilitates separation from the template. Other functional groups which facilitate the photodecomposition of the polymer also can be used. U.S. Pat. No. 6,218,316 describes additional details concerning this process and is incorporated herein by reference.

Patterned Templates

In various embodiments, an imprint lithography template is manufactured using processes including, but not limited to, optical lithography, electron beam lithography, ion-beam lithography, x-ray lithography, extreme ultraviolet lithography, scanning probe lithography, focused ion beam milling, interferometric lithography, epitaxial growth, thin film deposition, chemical etch, plasma etch, ion milling, reactive ion etch or a combination of the above. Methods for making patterned templates are described in U.S. patent application Ser. No. 10/136,188 filed May 1, 2002 entitled "Methods of Manufacturing a Lithography Template" to Voison which is incorporated herein by reference.

In an embodiment, the imprint lithography template is substantially transparent to activating light. The template includes a body having a lower surface. The template further includes a plurality of recesses on the lower surface extending toward the top surface of the body. The recesses may be of any suitable size, although typically at least a portion of the recesses has a feature size of less than about 250 nm.

With respect to imprint lithography processes, the durability of the template and its release characteristics may be of concern. In one embodiment, a template is formed from quartz. Other materials may be used to form the template and include, but are not limited to: silicon germanium carbon, gallium nitride, silicon germanium, sapphire, gallium arsinide, epitaxial silicon, poly-silicon, gate oxide, silicon dioxide or combinations thereof. Templates may also include materials used to form detectable features, such as alignment markings. For example, detectable features may be formed of $SiO_x$, where X is less than 2. In some embodiments, X is about 1.5. In another example, detectable features may be formed of a molybdenum silicide. Both SiOx and molybdenum silicide are optically transparent to light used to cure the polymerizable liquid. Both materials, however, are substantially opaque to visible light. Use of these materials allows alignment marks to be created on the template that will not interfere with curing of the underlying substrate.

As previously mentioned, the template is treated with a surface treatment material to form a thin layer on the surface of the template. A surface treatment process is optimized to yield a low surface energy coating. Such a coating is used in preparing imprint templates for imprint lithography. Treated templates have desirable release characteristics relative to untreated templates. Untreated template surfaces possess surface free energies of about 65 dynes/cm or more. A treatment procedure disclosed herein yields a surface treatment layer that exhibits a high level of durability. Durability of the surface treatment layer allows a template to be used for numerous imprints without having to replace the surface treatment layer. The surface treatment layer, in some embodiments, reduces the surface free energy of the lower surface measured at 25° C. to less than about 40 dynes/cm, or in some cases, to less than about 20 dynes/cm.

A surface treatment layer, in one embodiment, is formed by the reaction product of an alkylsilane, a fluoroalkylsilane, or a fluoroalkyltrichlorosilane with water. This reaction forms a silinated coating layer on the surface of the patterned template. For example, a silinated surface treatment layer is formed from a reaction product of tridecafluoro-1,1,2,2-tetrahydrooctyl trichlorosilane with water. A surface treatment layer may be formed using either a liquid-phase process or a vapor-phase process. In a liquid-phase process, the substrate is immersed in a solution of precursor and solvent. In a vapor-phase process, a precursor is delivered via an inert carrier gas. It may be difficult to obtain a purely anhydrous solvent for use in a liquid-phase treatment. Water in the bulk phase during treatment may result in clump deposition, which will adversely affect the final quality or coverage of the coating. In an embodiment of a vapor-phase process, the template is placed in a vacuum chamber, after which the chamber is cycle-purged to remove excess water. Some adsorbed water, however, remains on the surface of the template. A small amount of water, however, is believed to be needed to initiate a surface reaction, which forms the coating. It is believed that the reaction may be described by the formula:

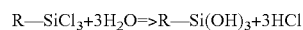

To facilitate the reaction, the template is brought to a desired reaction temperature via a temperature-controlled chuck. The precursor is then fed into the reaction chamber for a prescribed time. Reaction parameters such as template temperature, precursor concentration, flow geometries, etc.

are tailored to the specific precursor and template substrate combination. By controlling these conditions, the thickness of the surface treatment layer is controlled. The thickness of the surface treatment layer is kept at a minimal value to minimize the interference of the surface treatment layer with the feature size. In one embodiment, a monolayer of the surface treatment layer is formed.

Discontinuous Template

Figure 20A:
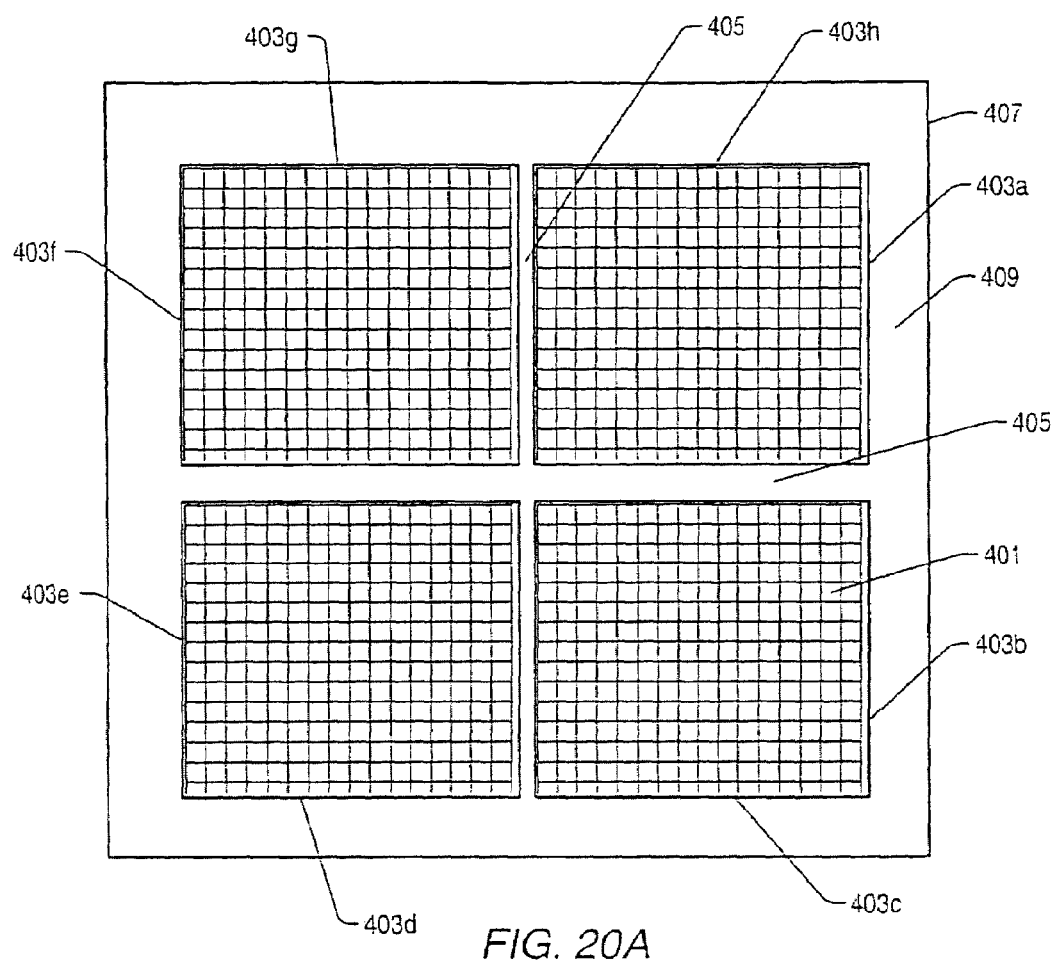
FIGS. 20A-20B depict top and cross-sectional views, respectively, of a template having a plurality of patterning areas and borders.
Figure 20B:
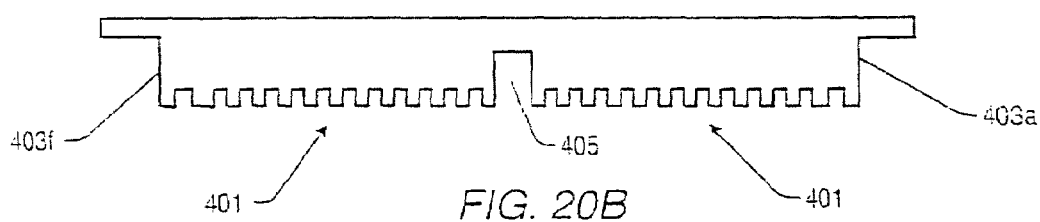

In an embodiment, there are at least two separate depths associated with the recesses on the lower surface of patterned template 3700. FIGS. 20A and 20B depict top and cross-sectional views, respectively, of a patterned template with recesses having two depths. Referring to FIGS. 20A and 20B, a template includes one or more patterning areas 401. In such embodiments, a first relatively shallow depth is associated with the recesses in patterning areas 401 of the template, as depicted in FIG. 20B. Patterning areas 401 include the area replicated during patterning of the template. Patterning areas 401 are positioned within a region defined by the edges 407 of the template. Outer region 409 is defined as the region that extends from an outer edge of any of patterning areas 401 to the edge of the template. The outer region has a depth that is substantially greater than the depth of the recesses in patterning areas 401. The perimeter of the template is herein defined as the patterning areas that are confined by outer region 409. As depicted in FIG. 20A, four patterning areas are positioned within the area defined by the template. Patterning areas 401 are separated from the edges 407 of the template by outer region 409. The "perimeter" of the template is defined by edges 403a, 403b, 403c, 403d, 403e, 403f, 403g, and 403h of patterning areas 401.

Patterning areas 401 may be separated from each other by border regions 405. Borders regions 405 are recesses that are positioned between patterning areas 401 that have a greater depth than the recesses of the pattering areas. As described below, both border region 405 and outer region 409 inhibits the flow of liquid between patterning areas 401 or beyond the perimeter of patterning areas 401, respectively.

Figure 15:
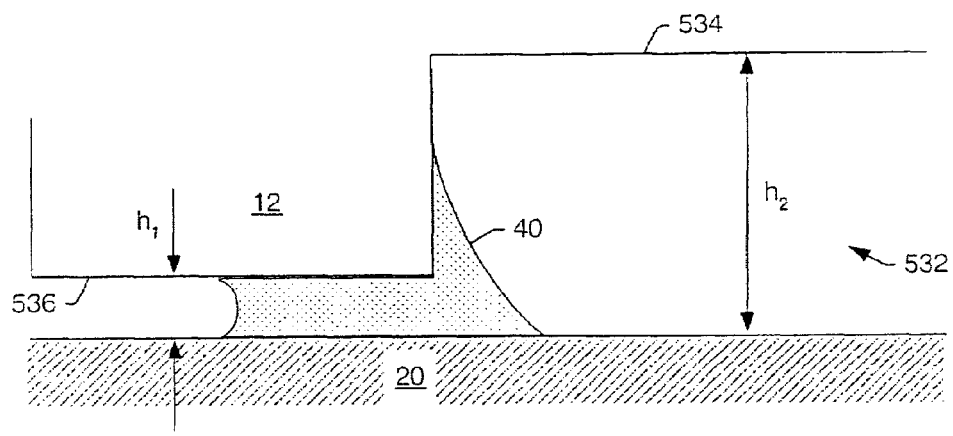
FIGS. 15 and 16 depict side views of an interface between a liquid droplet and a portion of a template.
Figure 16:
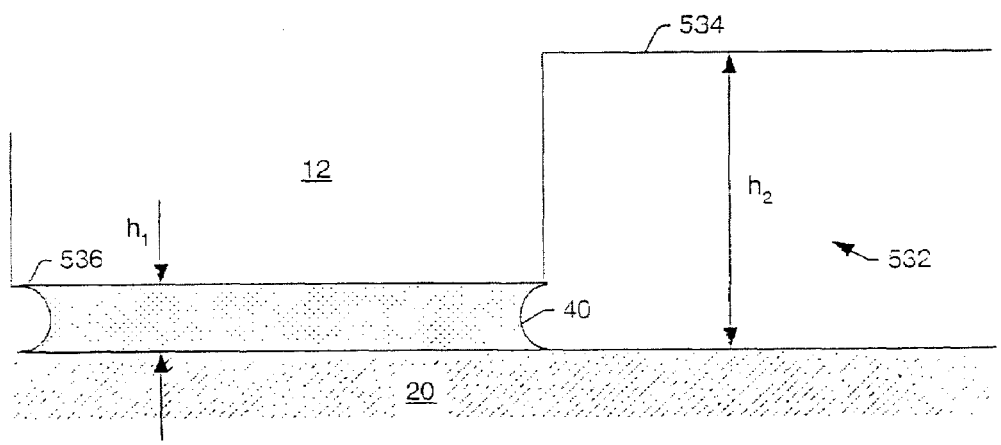

The design of the template is chosen based on the type of lithography process used. For example, a template for positive imprint lithography has a design that favors the formation of discontinuous films on the substrate. In one embodiment, a template 12 is formed such that the depth of one or more structures is relatively large compared to the depth of structures used to form the patterning region, as depicted in FIG. 15. During use, template 12 is placed in a desired spaced relationship to substrate 20. In such an embodiment, the gap ($h_1$) between the lower surface 536 of template 12 and substrate 20 is much smaller than the gap ($h_2$) between recessed surface 534 and substrate 20. For example, $h_1$ may be less than about 200 nm, while $h_2$ may be greater than about 10,000 nm. When template 12 is brought into contact with curable liquid 40 on substrate 20, curable liquid 40 leaves the region under recessed surface 534 and fills the gap between lower surface 536 and substrate 20 (as depicted in FIG. 16). It is believed that combinations of surface energies and capillary forces draw curable liquid 40 from the larger recess into the narrower region. As $h_1$ is decreased, forces applied to curable liquid 40 by template 12 may overcome capillary forces drawing curable liquid 40 under lower surface 536. These forces may cause spreading of curable liquid 40 into the area under recessed surface 534. The minimum value of $h_1$ at which curable liquid 40 is inhibited from spreading into a recess 532 is referred to herein as the "minimum film thickness." Additionally, as $h_1$ increases, the capillary forces are reduced, eventually allowing curable liquid 40 to spread into the deeper recessed regions. The maximum value of $h_1$ at which the capillary forces are sufficient to inhibit flow of curable liquid 40 into the deeper recessed region is herein known as the "maximum film thickness."

Figure 17:
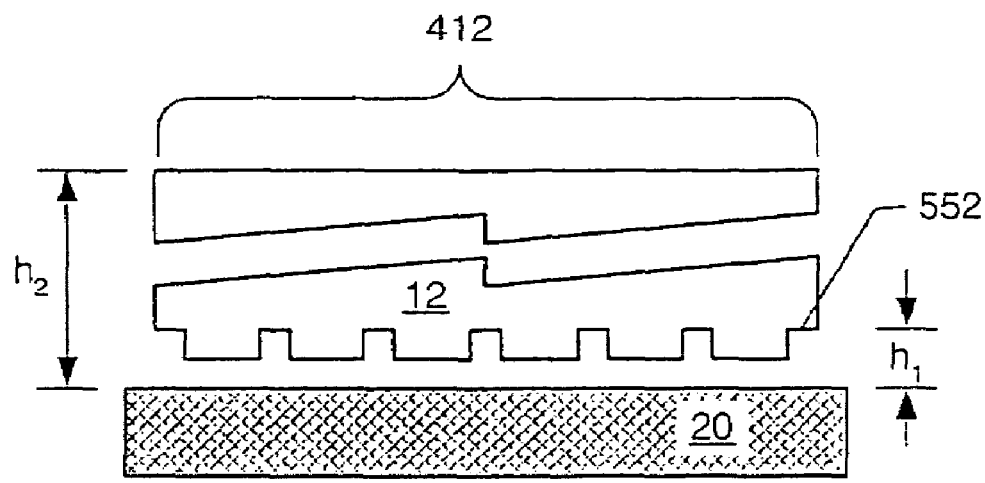
FIG. 17 depicts a cross-sectional view of a first embodiment of template configured for liquid confinement at the perimeter of the template.
Figure 18:
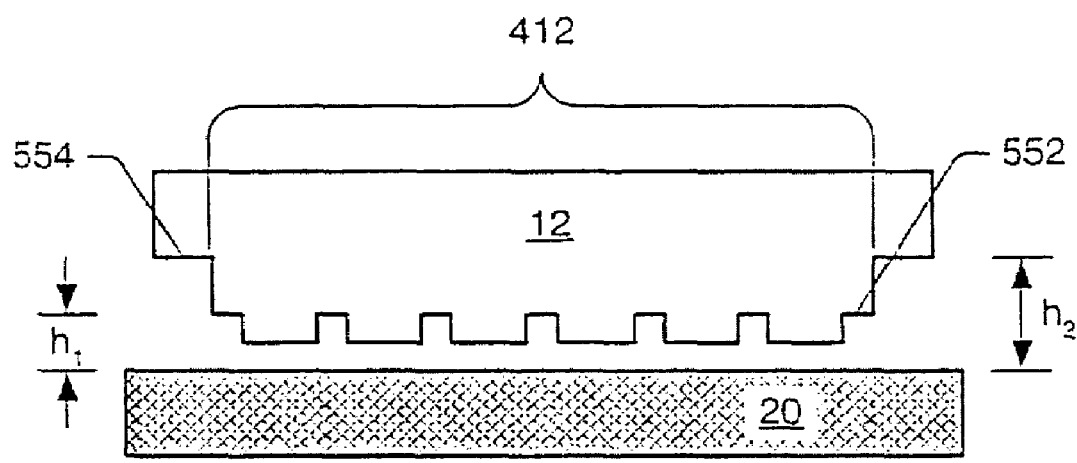
FIG. 18 depicts a cross-sectional view of a second embodiment of template configured for liquid confinement at the perimeter of the template.

As depicted in FIGS. 17 and 18, in various embodiments, template 12 is formed such that a curable liquid placed on substrate 20 is inhibited from flowing beyond perimeter 412 of template 12. In the embodiment depicted in FIG. 17, height $h_1$ is measured from substrate 20 to shallow recessed surface 552. Shallow recessed surface 552 extends to the perimeter of template 12. Thus, the edge of template 12 forms the height $h_2$ and is effectively infinite in comparison to height $h_1$. In the embodiment depicted in FIG. 18, a deep recess is formed at the outer edge of template 12. Height $h_2$ is measured between substrate 20 and deep recessed surface 554. Height $h_1$ is again measured between substrate 20 and shallow recessed surface 552. In either embodiment, height $h_2$ is much larger than height $h_1$. If $h_1$ is small enough, the activating light curable liquid remains in the gap between template 12 and substrate 20 while a curing agent is applied. Deeply recessed portions are particularly useful for liquid confinement in step and repeat processes as described herein.

In an embodiment, template 12 and substrate 20 each have one or more alignment marks. Alignment marks may be used to align template 12 and substrate 20. For example, one or more optical imaging devices (e.g., microscopes, cameras, imaging arrays, etc.) are used to determine alignment of the alignment marks.

In some embodiments, an alignment mark on the template may be substantially transparent to activating light. Alternatively, the alignment mark may be substantially opaque to alignment mark detection light. As used herein, alignment mark detection light and light used for other measurement and analysis purposes is referred to as "analyzing light." In an embodiment, analyzing light includes, but is not limited to, visible light and/or infrared light. The alignment mark may be formed of a material different than the material of the body. For example, the alignment mark may be formed from $SiO_x$, where x is about 1.5. In another example, the alignment mark may be formed of molybdenum silicide. Alternately, the alignment mark may include a plurality of lines etched on a surface of the body. The lines are configured to substantially diffuse activating light, but produce an analyzable mark under analyzing light.

In various embodiments, one or more deep recesses as described above may project entirely through the body of the template to form openings in the template. An advantage of such openings is that they may effectively ensure that height $h_2$ is very large with respect to $h_1$ at each opening. Additionally, in some embodiments, pressurized gas or vacuum may be applied to the openings. Pressurized gas or vacuum may also be applied to one or more openings after curing the liquid. For example, pressurized gas may be applied after curing as part of a peel and pull process to assist in separating the template from the cured liquid.

Figure 45:
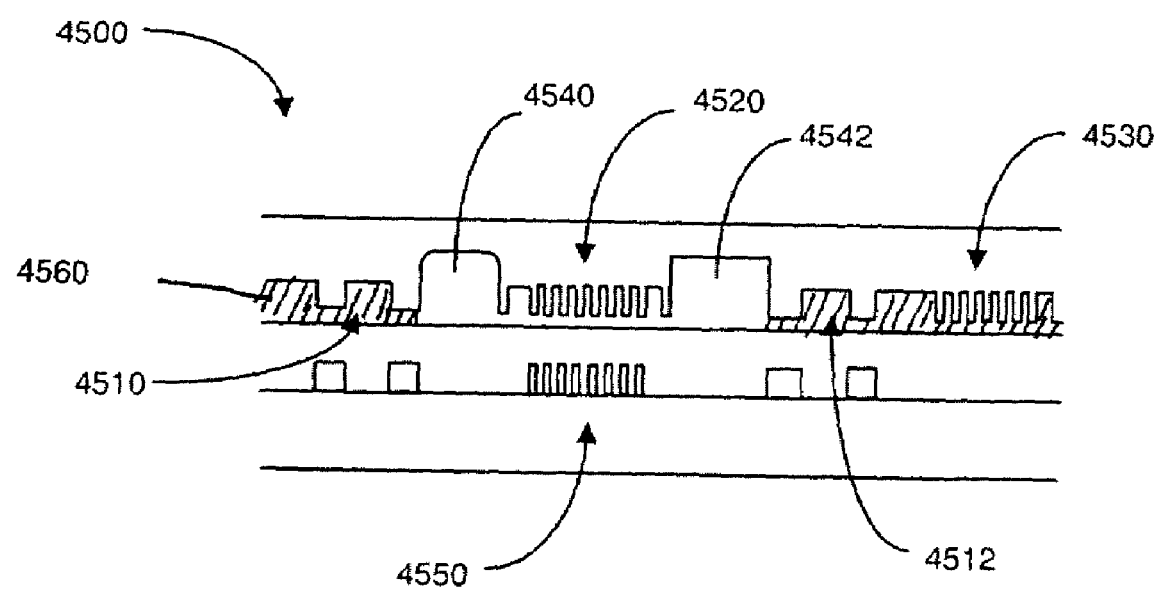
FIG. 45 depicts a cross sectional view of a patterned template that includes an alignment mark surrounded by a border.

In one embodiment, one or more alignment marks may be formed in a patterned template. As described herein, alignment marks formed in the template may be used to align a template with a patterned area on a substrate. One embodiment of a template that includes alignment marks is depicted in FIG. 45. Patterned template 4500 includes patterning areas 4510, alignment marks 4520, and alignment mark patterning area 4530. Alignment marks 4520 are separated from patterning areas 4510 and 4512 by borders 4540 and 4542, respectively. Borders 4540 and 4542 have a depth that is substantially greater than the depth of alignment marks 4520. When patterned template 4500 is brought into contact with activating light curable liquid 4560, activating light curable liquid 4560 spreads to the patterning areas 4510 and 4512, but is inhibited from spreading into alignment marks 4520 area by the borders 4540 and 4542, as depicted in FIG. 45.

Keeping the activating light curable liquid out of the alignment area may offer advantages when alignment measurements are being taken. During a typical alignment procedure, optical measurements are taken thorough the template to the underlying substrate alignment marks (e.g., alignment marks 4550) to determine if the alignment marks are aligned. The presence of a liquid between the template and the substrate during alignment measurements, may interfere with optical measurements. Typically the index of refraction of a liquid is substantially similar to the template material. By keeping the liquid out of the alignment region, optical alignment techniques may be simplified and the optical requirements of the alignment systems reduced.

When a template is used for imprinting one of multiple layers to be formed on a substrate, it is advantageous that the template not only include an alignment mark for alignment with an underlying substrate, but also an alignment patterning area. As depicted in FIG. 45, alignment mark patterning area 4530 contacts a portion of the applied activating light curable liquid. During curing, the alignment mark defined by alignment mark patterning area 4530 is imprinted into the cured layer. During subsequent processing, the alignment mark formed from alignment mark patterning area 4530 may be used to assist in alignment of a template with the substrate.

Alternate System Embodiments

The above described imprint lithography system 3900 may be modified according to alternate embodiments discussed below. It should be understood that any of the described alternative embodiments may be combined, singly or in combination, with any other system described herein.

Referring to FIG. 4, as described above, imprint head 3100 includes fine orientation system 3111 that allows for a "passive" orientation of patterned template 3700 with respect to the substrate. In another embodiment, fine orientation system 3111 may include actuators 3134a, 3134b, and 3134c coupled to flexure arms 3172, 3174, 3202, and 2304. Actuators 3134a, 3134b, and 3134c may allow "active" control of fine orientation system 3111. During use an operator or a programmable controller monitors the orientation of patterned template 3700 with respect to the substrate. The operators or a programmable controller then alters the orientation of patterned template 3700 with respect to the substrate by operating actuators 3134a, 3134b, and 3134c. Movement of actuators 3134a, 3134b and 3134c causes motion of flexure arms 3172, 3174, 3202, and 3204 to alter the orientation of patterned template 3700§. In this manner an "active" control of fine positioning of patterned template 3700 with respect to the substrate may be achieved. An active fine orientation system is further described in U.S. Ser. No. 09/920,341 filed Aug. 1, 2001 entitled "Methods for High-Precision Gap Orientation Sensing Between a Transparent Template and Substrate for Imprint Lithography," which is incorporated herein by reference.

Figure 21:
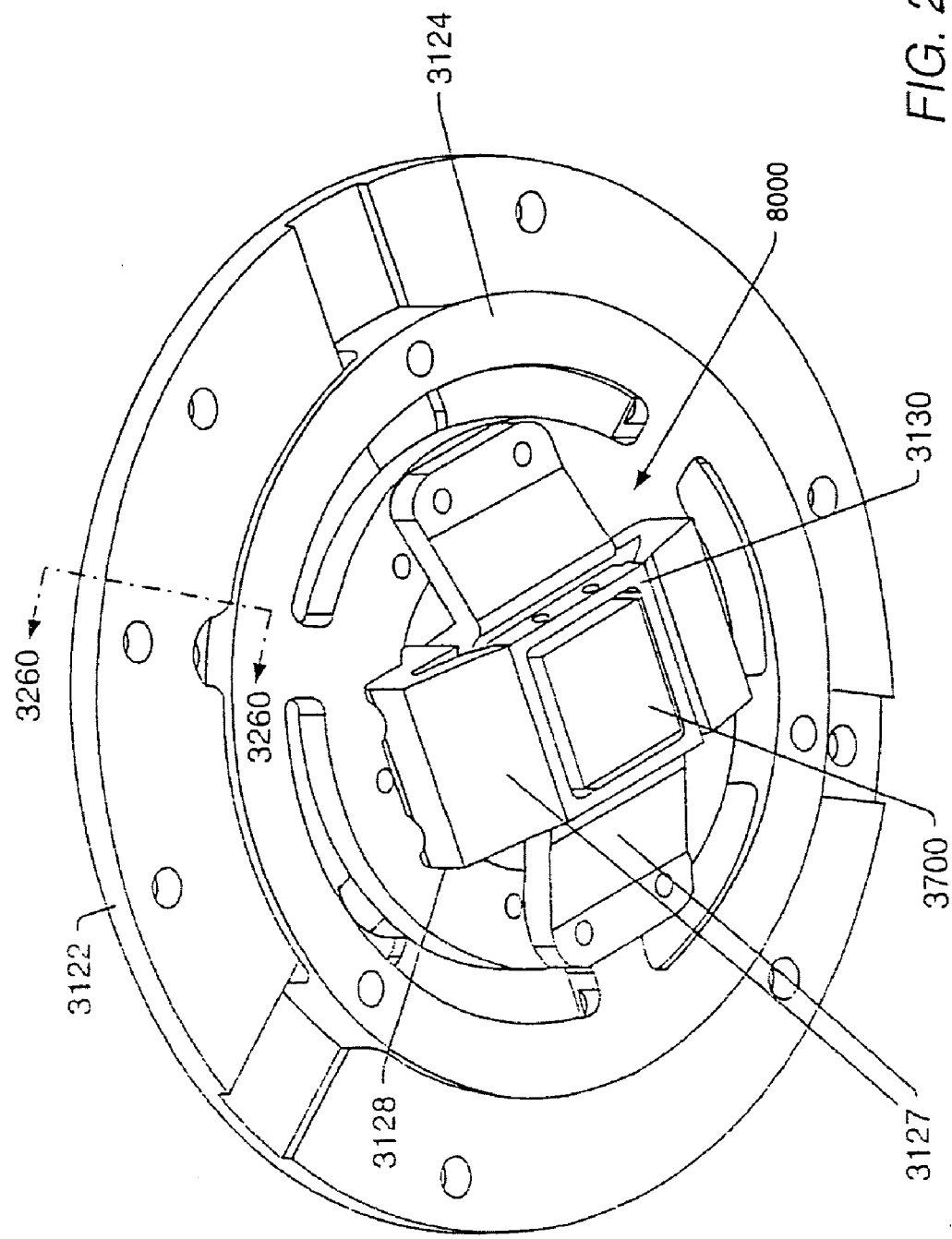
FIG. 21 depicts a projection view of a rigid template support system coupled to a pre-calibration system of an imprint head.

Referring to FIG. 3, in an alternate embodiment, imprint head 3100 may include a pre-calibration system 3109, as described above. Pre-calibration system 3109 includes a flexure ring 3124, as depicted in FIG. 21. In place of fine orientation system 3100 as described above, template support system 8000 is coupled to a pre-calibration ring. In contrast to fine orientation system 3100, template support system 8000 is formed of substantially rigid and non-compliant members 3127. These members provide a substantially rigid support for patterned template 3700 disposed in template support 3130. In this embodiment, fine orientation may be achieved using motion stage 3600, shown in FIG. 1, instead of template support 3130.

Figure 22:
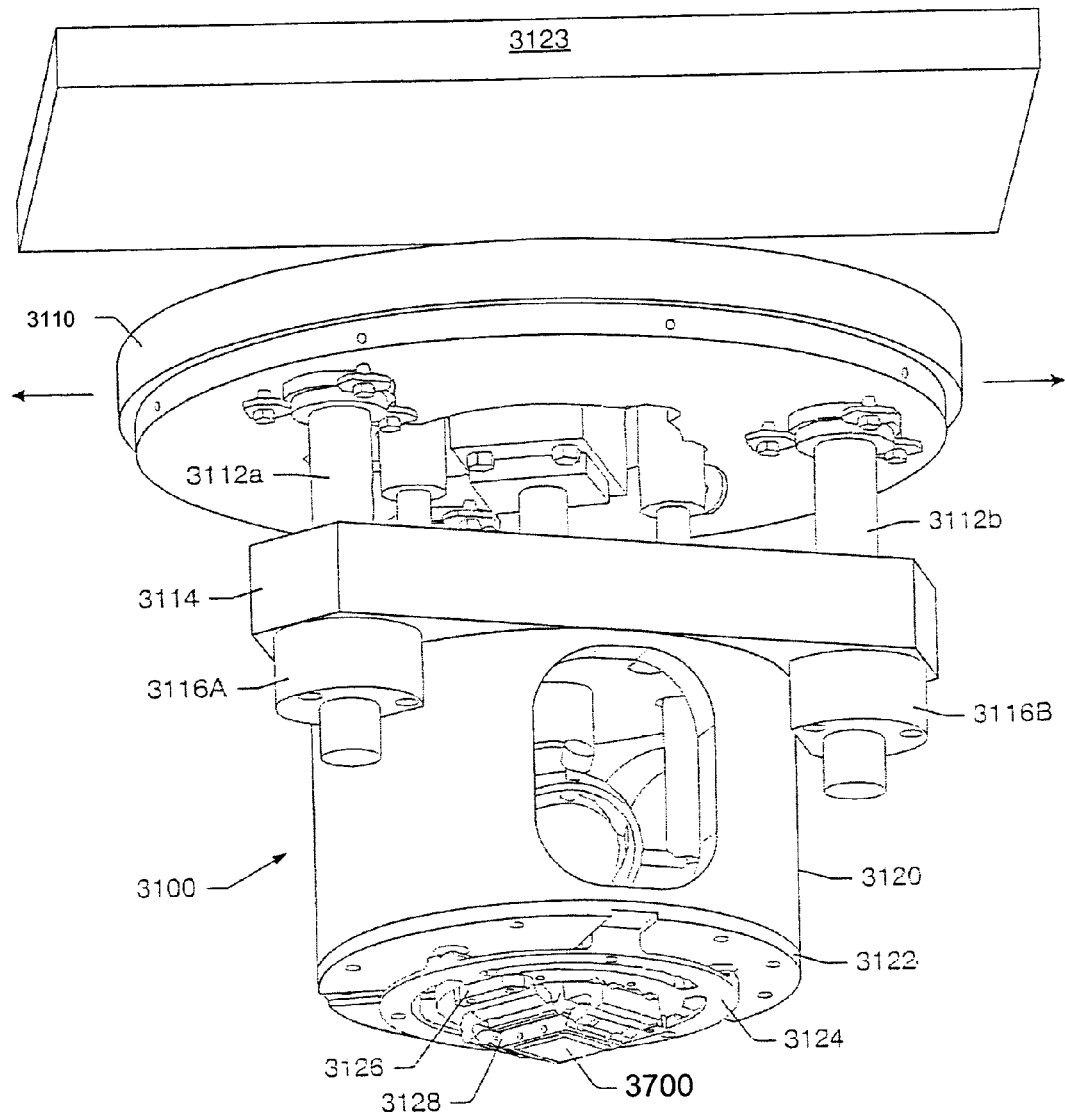
FIG. 22 depicts an imprint head coupled to an X-Y motion system.

In previous embodiments, imprint head 3100 is coupled to the body in a fixed position. In an alternate embodiment, imprint head 3100 may be mounted to a motion system that allows imprint head 3100 to be moved along the X-Y plane, as depicted in FIG. 22. Imprint head 3100 is configured to support patterned template 3700 as described in any of the embodiments herein. Imprint head 3100 is coupled to a motion system that includes an imprint head chuck 3110 and imprint motion stage 3123. Imprint head 3100 is mounted to imprint head chuck 3110. Imprint head chuck 3110 interacts with imprint motion stage 3123 to move imprint head 3100 along an X-Y plane. Mechanical or electromagnetic motion systems may be used. Electromagnetic systems rely on the use of magnets to produce an X-Y planar motion in imprint head chuck 3110. Generally, an electromagnetic system incorporates permanent and electromagnetic magnets into imprint motion stage 3123 and imprint head chuck 3110. The attractive forces of these magnets is overcome by a cushion of air between imprint head chuck 3110 and imprint motion stage 3123 such that an "air bearing" is produced. Imprint head chuck 3110, and therefore imprint head 3100, is moved along an X-Y plane on a cushion of air. Electromagnetic X-Y motion stages are described in further detail in U.S. Pat. No. 6,389,702, entitled "Method and Apparatus for Motion Control," which is incorporated herein by reference. In a mechanical motion system, imprint head chuck 3110 is attached to imprint motion stage 3123. Imprint motion stage 3123 is then moved by use of various mechanical means to alter the position of imprint head chuck 3110, and thus imprint head 3110, along the X-Y plane. In this embodiment, imprint head 3100 may include a passive compliant fine orientation system, an actuated fine orientation system, or a rigid template support system, as described herein.

Figure 40:
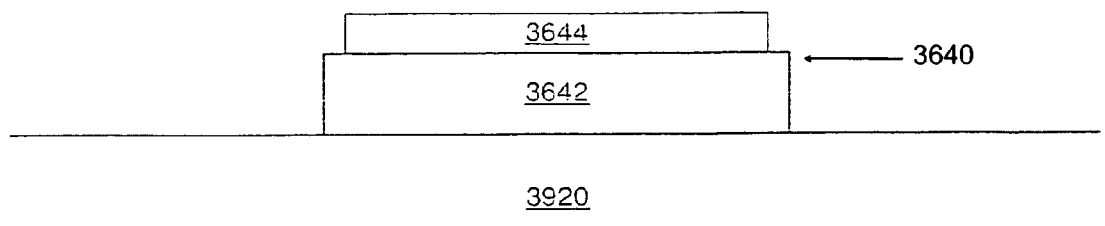
FIG. 40 depicts a schematic drawing of a substrate support.

With imprint head 3100 coupled to a moving support, the substrate may be mounted to a stationary support. Thus, in an alternate embodiment, imprint head 3100 is coupled to an X-Y axis motion stage as described herein. A substrate is mounted to a substantially stationary substrate support. A stationary substrate support 3640 is depicted in FIG. 40. Stationary substrate support 3640 includes a base 3642 and a substrate chuck 3644. Substrate chuck 3644 is configured to support a substrate during imprint lithography processes. Substrate chuck 3644 may employ any suitable means to retain a substrate to substrate chuck 3644. In one embodiment, substrate chuck 3644 may include a vacuum system which applies a vacuum to the substrate to couple the substrate to substrate chuck 3644. Substrate chuck 3644 is coupled to base 3642. Base 3642 is coupled to motion stage support 3920 of imprint lithography system 3900 (see FIG. 1). During use, stationary substrate support 3640 remains in a fixed position on motion stage support 3920 while imprint head 3100 position is varied to access different portions of the substrate.

Coupling an imprint head to a motion stage can offer advantages over techniques in which the substrate is on a motion stage. Motion stages generally rely on an air bearing to allow substantially frictionless motion of the motion stage. Generally, motion stages are not designed to accommodate significant pressure applied along the Z-axis. When pressure is applied to a motion stage chuck along the Z-axis, the motion stage chuck position will change slightly in response to this pressure. During a step and repeat process, a template that has a smaller area than the area of the substrate is used to form multiple imprinted areas. The substrate motion stage is relatively large compared to the template to accommodate the larger substrates. When a template contacts the substrate motion stage in a position that is off-center, the motion stage will tilt to accommodate the increased pressure. This tilt is compensated for by tilting the imprint head to ensure proper alignment. If, however, the imprint head is coupled to the motion stage, all of the forces along the Z-axis will be centered on the template, regardless of where on the substrate the imprinting is taking place. This leads to increased ease in alignment and may also increase the throughput of the system.

Figure 38:
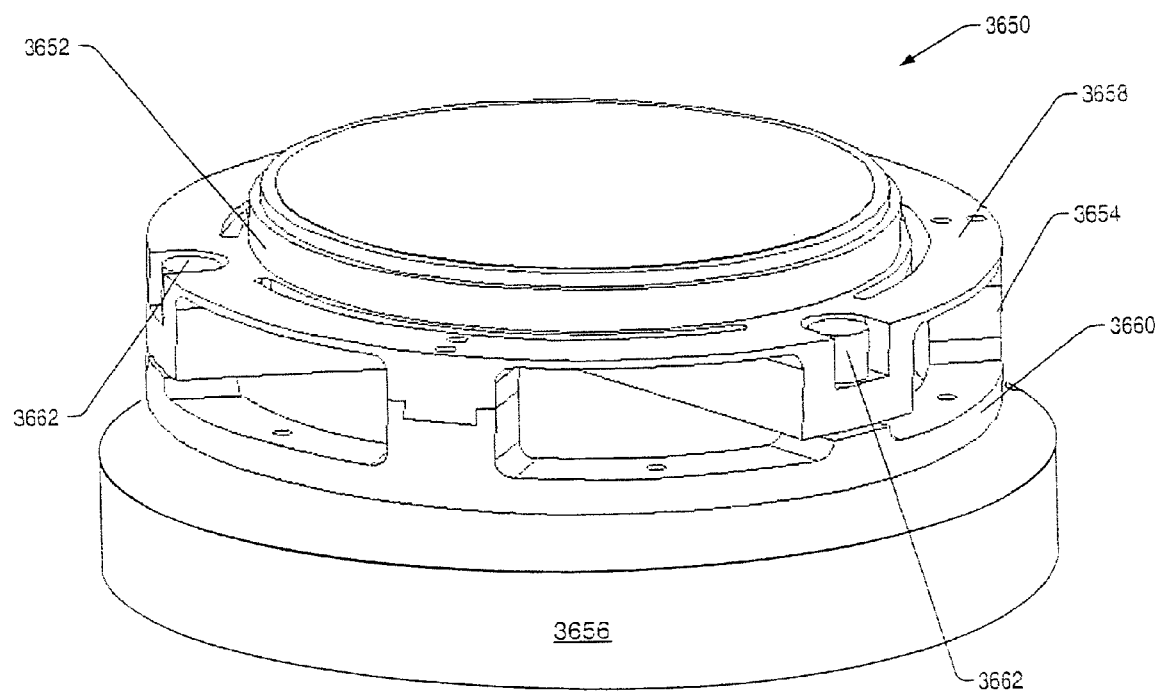
FIG. 38 depicts a motion stage having a substrate tilt module.

In an embodiment, a substrate tilt module 3654 may be formed in substrate support 3650, as depicted in FIG. 38. Substrate support 3650 includes a substrate chuck 3652, coupled to substrate tilt module 3654. Substrate tilt module 3654 is coupled to a base 3656. Base 3656, in one embodiment, is coupled to a motion stage which allows X-Y motion of substrate support 3650. Alternatively, base 3656 is coupled to a support (e.g., 3920) such that substrate support 3650 is mounted to imprint lithography system 3900, shown in FIG. 1 in a fixed position.

Substrate chuck 3652 may employ any suitable means to retain a substrate to substrate chuck 3652. In one embodiment, substrate chuck 3652 may include a vacuum system which applies a vacuum to the substrate to couple the substrate to substrate chuck 3652. Substrate tilt module 3654 includes a flexure ring 3658 coupled to flexure ring support 3660. A plurality of actuators 3662 are coupled to flexure ring 3658 and flexure ring support 3660. Actuators 3662 are operated to alter the tilt of flexure ring 3658. Actuators 3662, in one embodiment, use a differential gear mechanism that may be manually or automatically operated. In an alternate embodiment, actuators 3662 use an eccentric roller mechanism. An eccentric roller mechanism generally provides more vertical stiffness to substrate support 3650 than a differential gear system. In one embodiment, substrate tilt module 3654 has a stiffness that will inhibit tilt of the substrate when the template applies a force of between about 1 lb. to about 10 lbs. to a liquid disposed on the substrate. Specifically, substrate tilt module 3654 is configured to allow no more than 5 micro radians of tilt when pressure up to about 10 lbs. is applied to the substrate through the liquid on the template.

During use sensors coupled to substrate chuck 3652 may be used to determine the tilt of the substrate. The tilt of the substrate is adjusted by actuators 3662. In this manner tilt correction of the substrate may be achieved.

Figure 39:
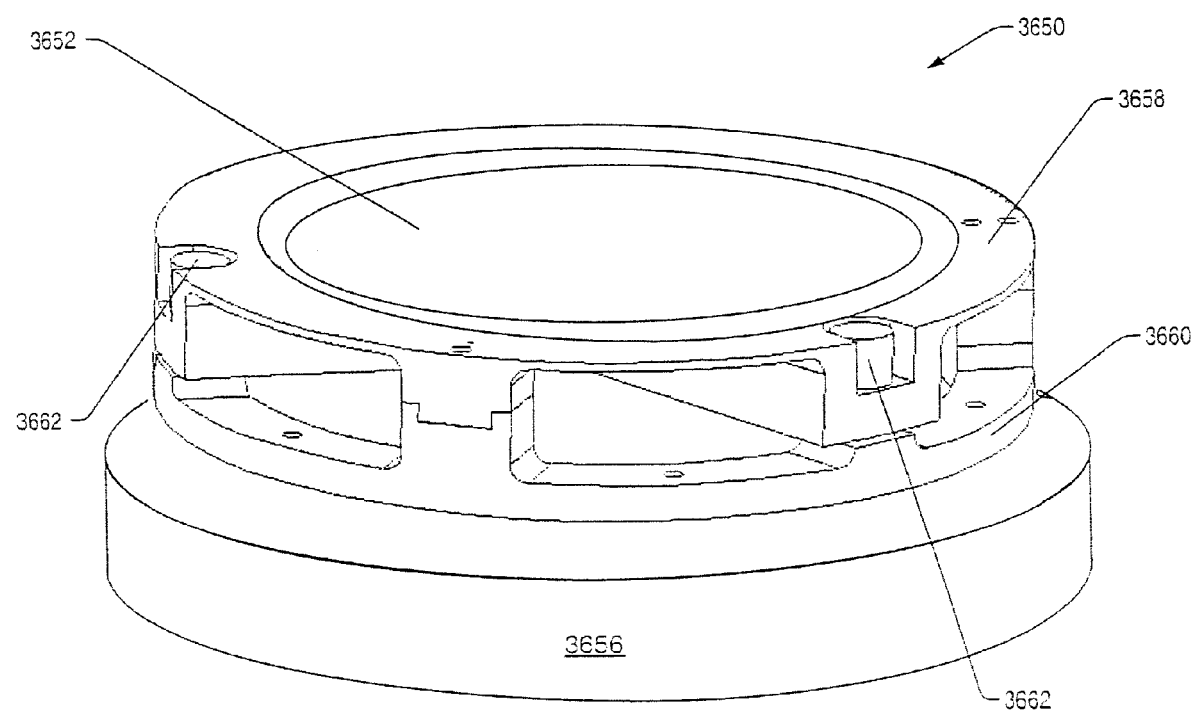
FIG. 39 depicts a motion stage that includes a fine orientation system.

Substrate tilt module 3654 may also include a fine orientation system. A substrate support that includes a fine orientation system is depicted in FIG. 39. To achieve fine orientation control, flexure ring 3658 includes a central recess in which substrate chuck 3652 is disposed. The depth of the central recess is such that an upper surface of a substrate disposed on substrate chuck 3652 is substantially even with an upper surface of flexure ring 3658. Fine orientation may be achieved using actuators 3662 capable of controlled motion in the nanometer range. Alternatively, fine orientation may be achieved in a passive manner. Actuators 3662 may be substantially compliant. The compliance of actuators 3662 may allow the substrate to self-correct for variations in tilt when a template is in contact with a liquid disposed on a substrate surface. By disposing the substrate in a position that is substantially even with flexure ring 3658, fine orientation may be achieved at the substrate-liquid interface during use. Compliance of actuators 3662 is thus transferred to the upper surface of the substrate to allow fine orientation of the substrate.

Figure 41:
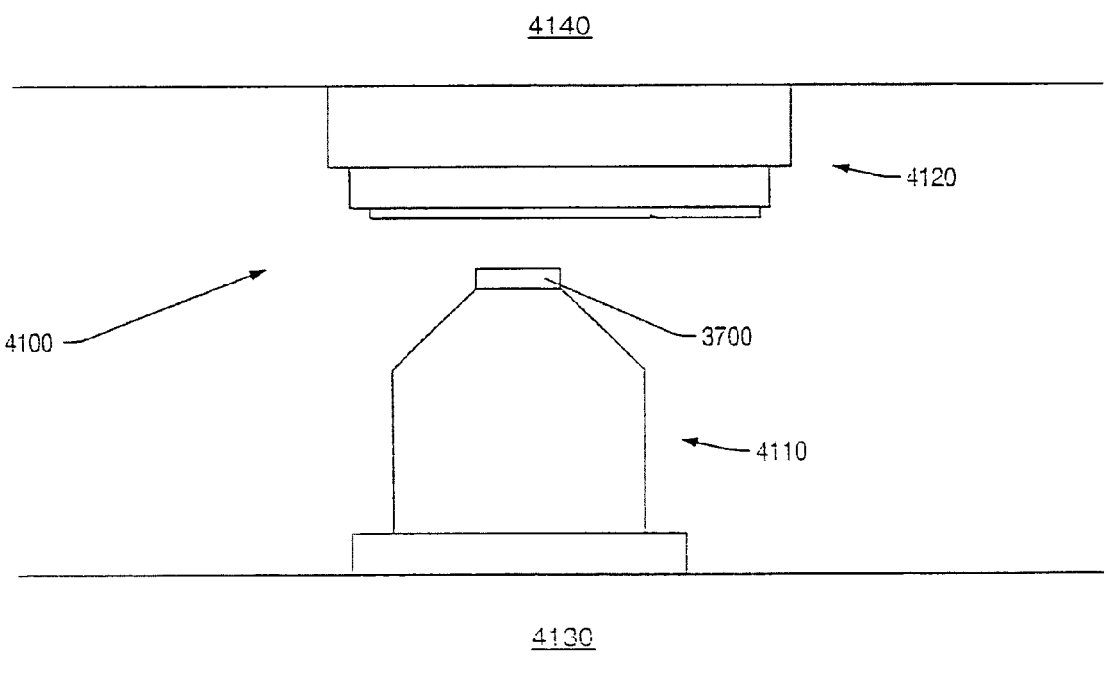
FIG. 41 depicts a schematic drawing of an imprint lithography system that includes an imprint head disposed below a substrate support.

The above-described systems are generally configured to systems in which an activating light curable liquid is dispensed onto a substrate and the substrate and template are brought into proximity to each other. It should be understood, however, that the above-described systems may be modified to allow an activating light curable liquid to be applied to a template rather than the substrate. In such an embodiment, the template is placed below the substrate. FIG. 41 depicts a schematic drawing of an embodiment of a system 4100 that is configured such that the template is positioned below a substrate. System 4100 includes an imprint head 4110 and a substrate support 4120 positioned above imprint head 4110. Imprint head 4110 is configured to hold patterned template 3700. Imprint head 4110 may have a similar design to any of the herein described imprint heads. For example, imprint head 4110 may include a fine orientation system as described herein. Imprint head 4110 is coupled to imprint head support 4130. Imprint head 4110 may be coupled in a fixed position and remain substantially motionless during use. Alternatively, imprint head 4110 may be placed on a motion stage that allows X-Y planar motion of imprint head 4110 during use.

The substrate to be imprinted is mounted onto a substrate support 4120. Substrate support 4120 has a similar design to any of the herein described substrate supports. For example, substrate support 4120 may include a fine orientation system as described herein. Substrate support 4120 may be coupled to a support 4140 in a fixed position and remain substantially motionless during use. Alternatively, substrate support 4120 may be placed on a motion stage that allows X-Y planar motion of substrate support during use.

During use an activating light curable liquid is placed on patterned template 3700 disposed in imprint head 4110. The template may be patterned or planar, depending on the type of operation to be performed. Patterned templates may be configured for use in positive, negative, or combinations of positive and negative imprint lithography systems as described herein.

Imprint Lithography Processes

Negative Imprint Lithography Process

Figure 23A:
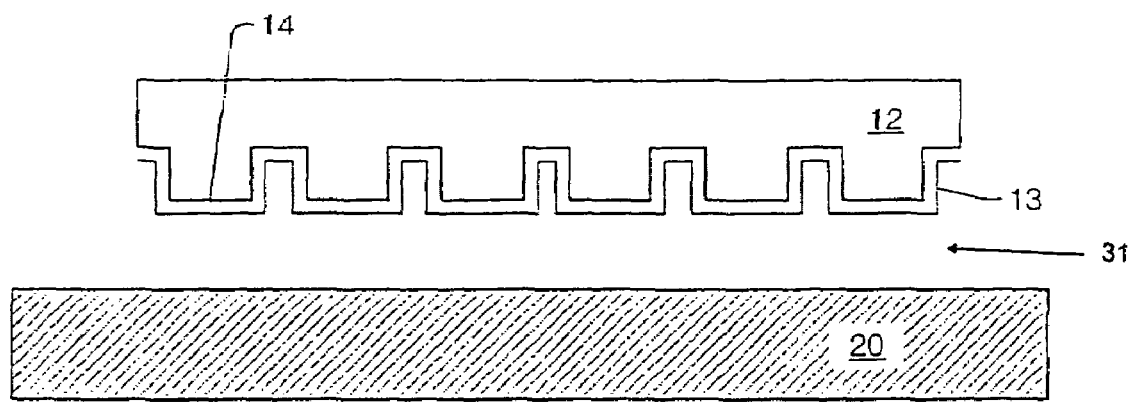
FIGS. 23A-23F depict cross-sectional views of a negative imprint lithography process.

A typical imprint lithography process is shown in FIGS. 23A-23F. As depicted in FIG. 23A, template 12 is positioned in a spaced relation to the substrate 20 such that a gap 31 is formed between template 12 and substrate 20. Template 12 may include a surface that defines one or more desired features, which may be transferred to substrate 20 during patterning. As used herein, a "feature size" generally refers to a width, length and/or depth of one of the desired features. In various embodiments, the desired features may be defined on the surface of template 12 as recesses and/or a conductive pattern formed on a surface of template 12. Surface 14 of template 12 may be treated with a thin surface treatment layer 13 that lowers template 12 surface energy and assists in separation of template 12 from substrate 20. Surface treatment layers for templates are described herein.

Figure 23B:
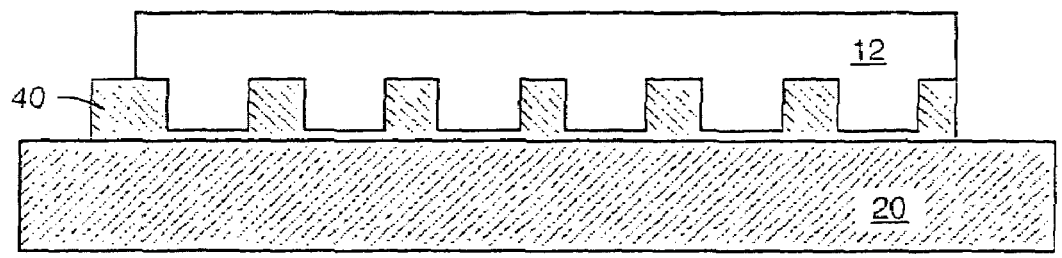

In an embodiment, curable liquid 40 may be dispensed upon substrate 20 prior to moving template 12 into a desired position relative to substrate 20. Curable liquid 40 may be a curable liquid that conforms to the shape of desired features of template 12. In an embodiment, curable liquid 40 is a low viscosity liquid that at least partially fills the space of gap 31 without the use of high temperatures. Low viscosity liquids may also allow gap 31 between template 12 and substrate 20 to be closed without requiring high pressures. As used herein, the term "low viscosity liquids" refer to liquids having a viscosity of less than about 30 centipoise measured at about 25° C. Further details regarding appropriate selections for curable liquid 40 are discussed below. Template 12 may interact with curable liquid 40 to conform curable liquid 40 into a desire shape. For example, curable liquid 40 may conform to the shape of template 12, as depicted in FIG. 23B. The position of template 12 may be adjusted to create a desired gap distance between template 12 and substrate 20. The position of template 12 may also be adjusted to properly align template 12 with substrate 20.

Figure 23C:
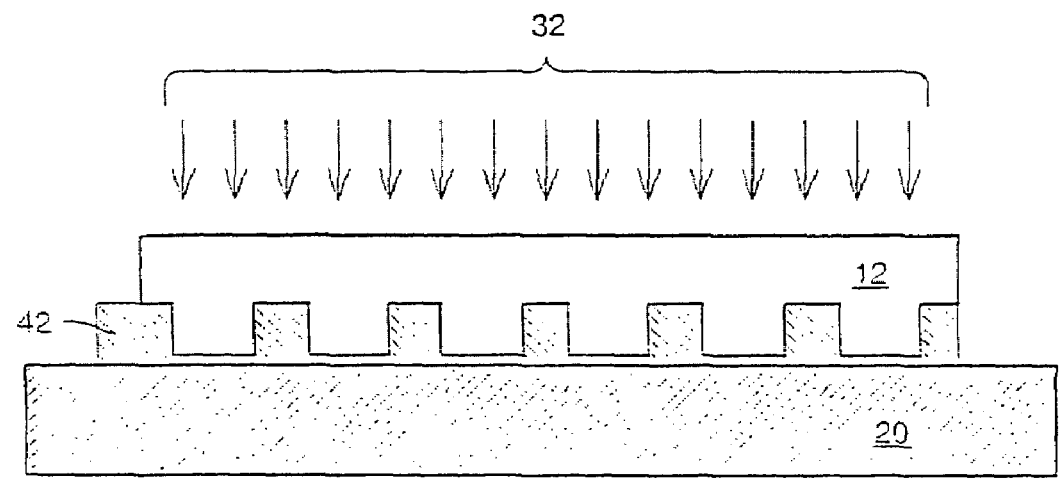
Figure 23D:
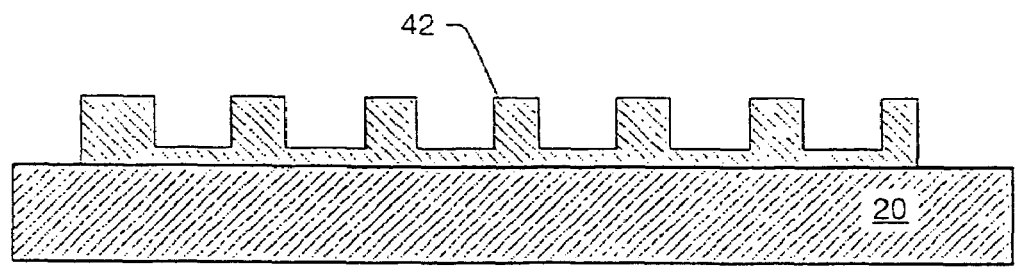

After template 12 is properly positioned, curable liquid 40 is cured to form a masking layer 42 on substrate 20. In an embodiment, curable liquid 40 is cured using activating light 32 to form masking layer 42. Application of activating light 32 through template 12 to cure curable liquid 40 is depicted in FIG. 23C. After curable liquid 40 is substantially cured, template 12 is removed from masking layer 42, leaving cured masking layer 42 on the surface of substrate 20, as depicted in FIG. 23D. Masking layer 42 has a pattern that is complementary to the pattern of template 12. Masking layer 42 may include a "base layer" (also called a "residual layer") between one or more desired features. The separation of template 12 from masking layer 42 is done so that desired features remain intact without shearing or tearing from the surface of substrate 20. Further details regarding separation of template 12 from substrate 20 following imprinting are discussed below.

Masking layer 42 may be used in a variety of ways. For example, in some embodiments, masking layer 42 may be a functional layer. In such embodiments, curable liquid 40 may be curable to form a conductive layer, a semiconductive layer, a dielectric layer and/or a layer having a desired mechanical or optical property. In another embodiment, masking layer 42 may be used to cover portions of substrate 20 during further processing of substrate 20. For example, masking layer 42 may be used during a material deposition process to inhibit deposition of the material on certain portions of the substrate. Similarly, masking layer 42 may be used as a mask for etching substrate 20. To simplify further discussion of masking layer 42, only its use as a mask for an etching process will be discussed in embodiments described below. However, it is recognized that masking layers in embodiments described herein may be used in a variety of processes as previously described.

Figure 23E:
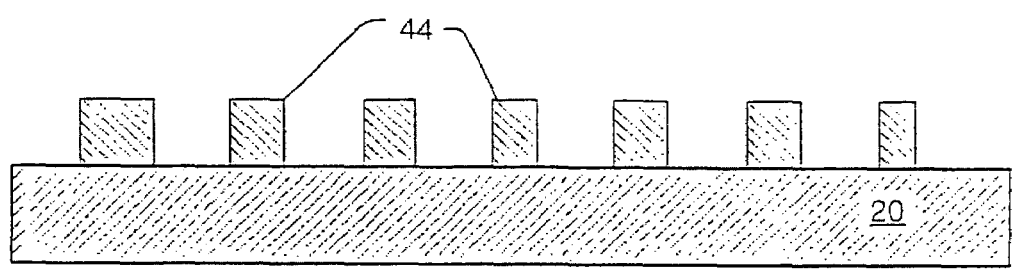
Figure 23F:
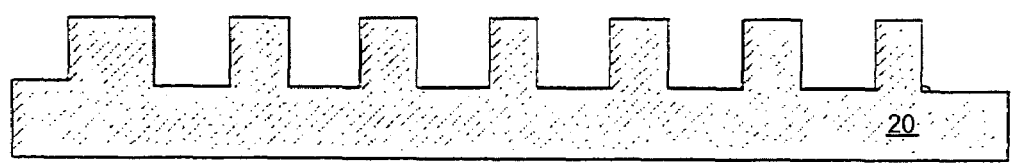

For use in an etch process, masking layer 42 may be etched using an etch process until portions of substrate 20 are exposed through masking layer 42, as depicted in FIG. 23E. That is, portions of the base layer may be etched away. Portions 44 of masking layer 42 may remain on substrate 20 for use in inhibiting etching of portions of substrate 20. After etching of masking layer 42 is complete, substrate 20 may be etched using known etching processes. Portions of substrate 20 disposed under portions 44 of masking layer 42 may remain substantially unetched while the exposed portions of substrate 20 are etched. In this manner, a pattern corresponding to the pattern of template 12 may be transferred to substrate 20. The remaining portions 44 of masking layer 42 may be removed leaving a patterned substrate 20, depicted in FIG. 23F.

FIGS. 24A-24D illustrate an embodiment of an imprint lithography process using a transfer layer. A transfer layer 18 may be formed upon an upper surface of substrate 20. Transfer layer 18 may be formed from a material that has different etch characteristics than underlying substrate 20 and/or masking layer 42 formed from curable liquid 40, depicted in FIGS. 23A-23C. That is, each layer (e.g., transfer layer 18, masking layer 42 and/or substrate 20) may be etched at least somewhat selectively with respect to the other layers.

Figure 24A:
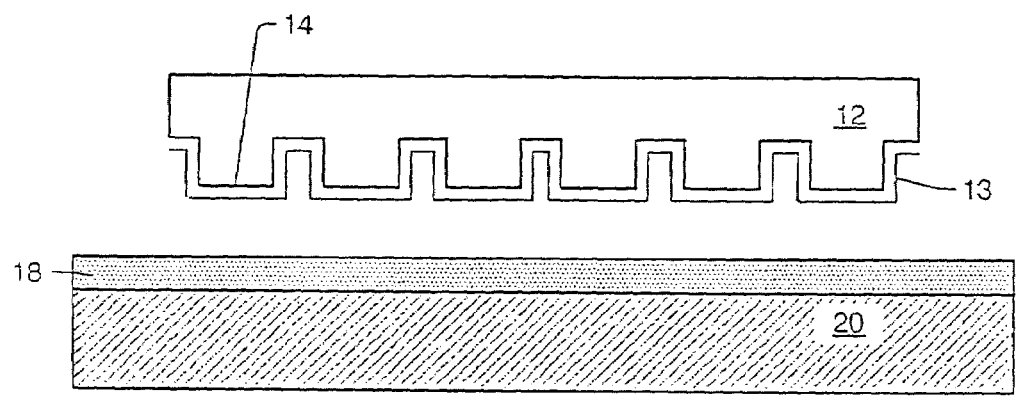
FIGS. 24A-24D depict cross-sectional views of a negative imprint lithography process with a transfer layer.
Figure 24B:
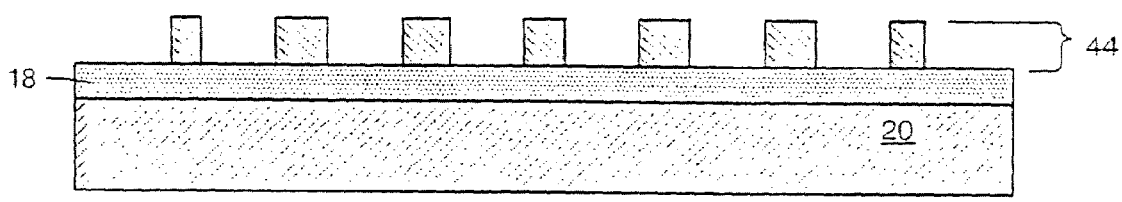

Masking layer 42 is formed on the surface of transfer layer 18 by depositing curable liquid 40 on the surface of transfer layer 18 and curing masking layer 42, as depicted in FIGS. 23A-23C. Masking layer 42 may be used as a mask for etching transfer layer 18. Masking layer 42 is etched using an etch process until portions of transfer layer 18 are exposed through masking layer 42, as depicted in FIG. 24B. Portions 44 of masking layer 42 remain on transfer layer 18 and may be used to inhibit etching of portions of the transfer layer. After etching of masking layer 42 is complete, transfer layer 18 may be etched using known etching processes. Portions of transfer layer 18 disposed under portions 44 of masking layer 42 may remain substantially unetched while the exposed portions of transfer layer 18 are etched. In this manner, the pattern of masking layer 42 is replicated in transfer layer 18.

Figure 24C:
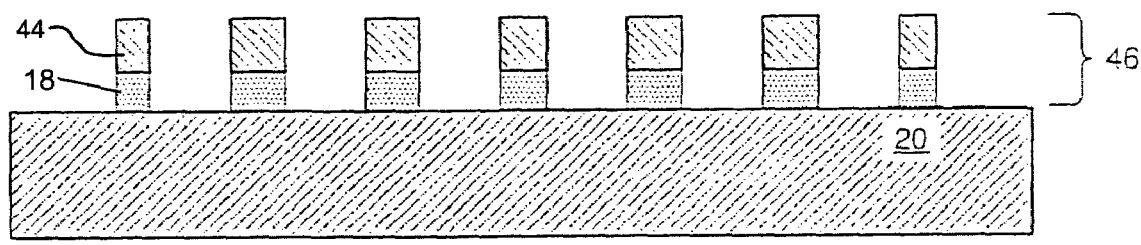
Figure 24D:
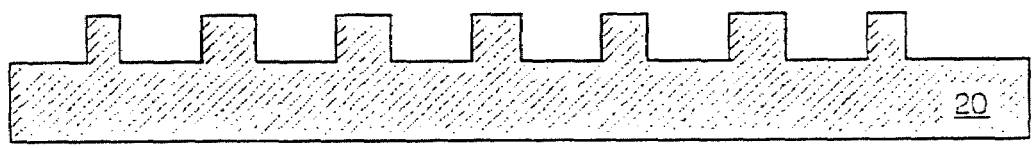

In FIG. 24C, portions 44 and etched portions of transfer layer 18 together form a masking stack 46 that may be used to inhibit etching of mask portions 44 of underlying substrate 20. Etching of substrate 20 may be performed using a known etch process (e.g., a plasma etching process, a reactive ion etching process, etc.). As depicted in FIG. 24D, masking stack 46 may inhibit etching of the underlying portions of substrate 20. Etching of the exposed portions of substrate 20 may be continued until a predetermined depth is reached. An advantage of using a masking stack as a mask for etching of substrate 20 is that the combined stack of layers may create a high aspect ratio mask (i.e., a mask that has a greater height than width). A high aspect ratio masking layer may be desirable during the etching process to inhibit undercutting of mask portions 44.

The processes depicted in FIGS. 23A-23F and FIGS. 24A-24D are examples of negative imprint lithography processes. As used herein a "negative imprint lithography" process generally refers to a process in which the curable liquid is substantially conformed to the shape of the template before curing. That is, a negative image of the template is formed in the cured liquid. As depicted in these figures, the non-recessed portions of the template become the recessed portions of the mask layer. The template, therefore, is designed to have a pattern that represents a negative image of the pattern to be imparted to the mask layer.

Positive Imprint Lithography

As used herein a "positive imprint lithography" process generally refers to a process in which the pattern formed in the mask layer is a mirror image of the pattern of the template. As will be further described below, the non-recessed portions of the template become the non-recessed portions of the mask layer.

Figure 25A:
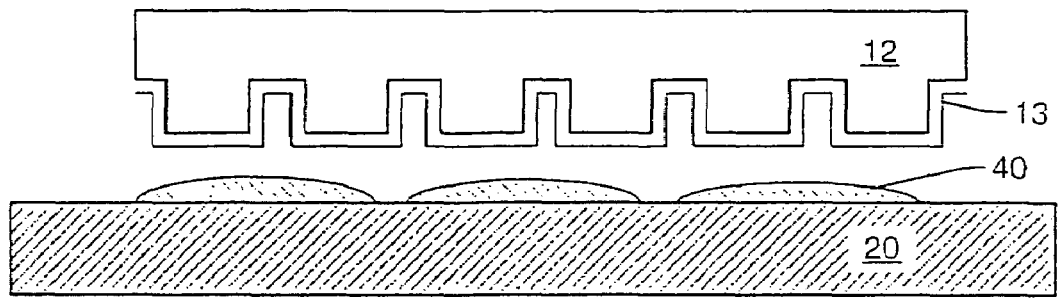
FIGS. 25A-25D depict cross-sectional views of a positive imprint lithography process.

A typical positive imprint lithography process is shown in FIGS. 25A-25D. As depicted in FIG. 25A, template 12 is positioned in a spaced relation to substrate 20 such that a gap is formed between template 12 and substrate 20. Surface of template 12 may be treated with a thin surface treatment layer 13 that lowers template 12 surface energy and assists in separation of template 12 from cured masking layer 42, shown in FIG. 25C.

Curable liquid 40 is disposed on the surface of substrate 20. Template 12 is brought into contact with curable liquid

Figure 25B:
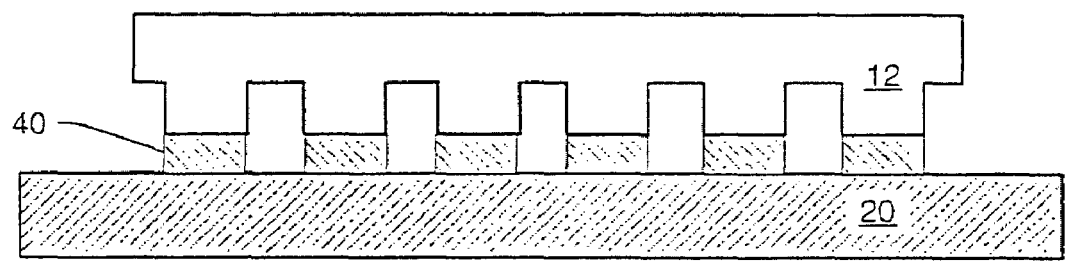
Figure 25C:
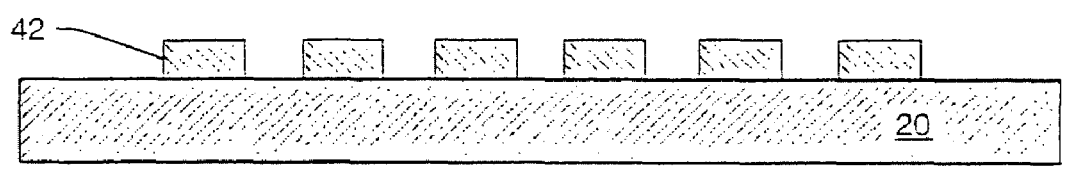

40. As depicted in FIG. 25B, curable liquid 40 fills the gap between the lower surface of template 12 and substrate 20. In contrast to a negative imprint lithography process, curable liquid 40 is substantially absent from regions of substrate 20 approximately below at least a portion of the recesses of template 12. Thus, curable liquid 40 is maintained as a discontinuous film on substrate 20 that is defined by the location of at least a portion of the recesses of template 12. After template 12 is properly positioned, curable liquid 40 is cured to form masking layer 42 on substrate 20. Template 12 is removed from masking layer 42, leaving cured masking layer 42 on the surface of substrate 20, as depicted in FIG. 25C. Masking layer 42 has a pattern that is complementary to the pattern of template 12.

Figure 25D:

Masking layer 42 may be used to inhibit etching of portions of substrate 20. After formation of masking layer 42 is complete, substrate 20 may be etched using known etching processes. Portions of substrate 20 disposed under masking layer 42 may remain substantially unetched while the exposed portions of substrate 20 are etched, as depicted in FIG. 25D. In this manner, the pattern of template 12 may be replicated in substrate 20. The remaining portions 44 of masking layer 42 may be removed to create patterned substrate 20.

Figure 26A:
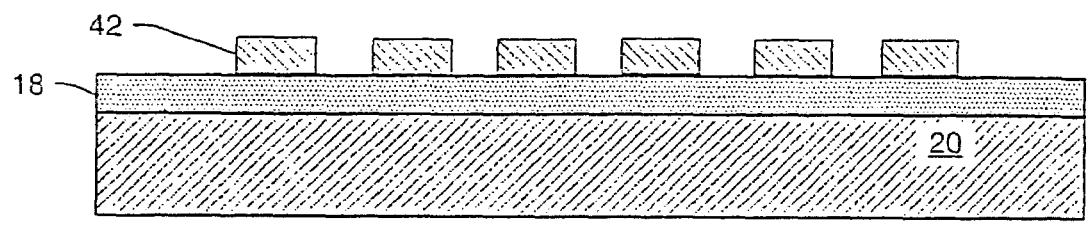
FIGS. 26A-26C depict cross-sectional views of a positive imprint lithography process with a transfer layer.
Figure 26B:
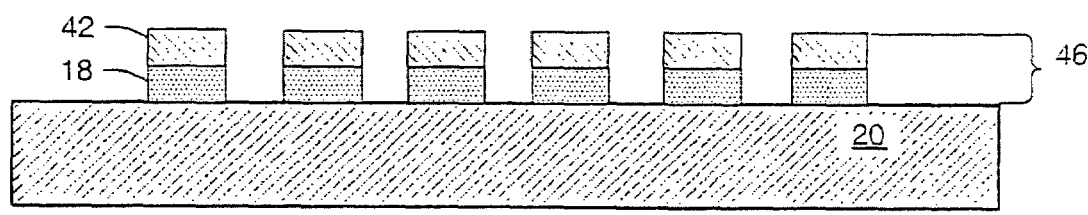
Figure 26C:
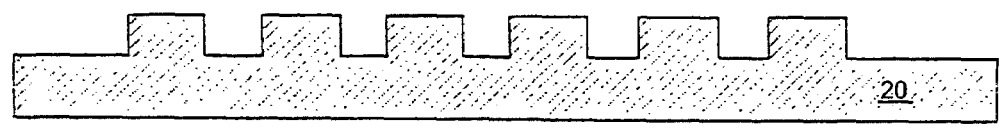

FIGS. 26A-26C illustrate an embodiment of a positive imprint lithography process using a transfer layer 18. Transfer layer 18 may be formed upon an upper surface of substrate 20. Transfer layer 18 is formed from a material that has different etch characteristics than the underlying transfer layer 18 and/or substrate 20. Masking layer 42 is formed on the surface of transfer layer 18 by depositing a curable liquid on the surface of transfer layer 18 and curing the masking layer 42, as depicted in FIGS. 25A-25C.

Masking layer 42 may be used as a mask for etching transfer layer 18. Masking layer 42 may inhibit etching of portions of transfer layer 18. Transfer layer 18 may be etched using known etching processes. Portions of transfer layer 18, disposed under masking layer 42, may remain substantially unetched while the exposed portions of transfer layer 18 are etched. In this manner, the pattern of masking layer 42 may be replicated in transfer layer 18.

In FIG. 26B, masking layer 42 and etched portions of transfer layer 18 together form masking stack 46 that may be used to inhibit etching of portions of the underlying substrate 20. Etching of substrate 20 may be performed using known etching processes (e.g., a plasma etching process, a reactive ion etching process, etc.). As depicted in FIG. 26C, the masking stack may inhibit etching of the underlying portions of substrate 20. Etching of the exposed portions of substrate 20 may be continued until a predetermined depth is reached.

Positive/Negative Imprint Lithography

Figure 27A:
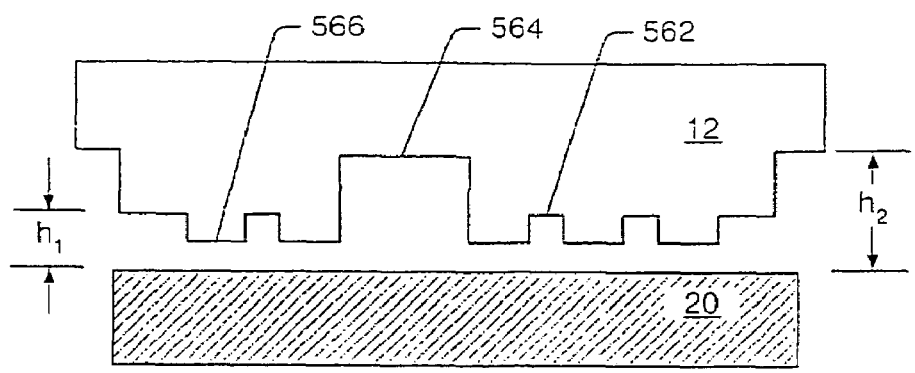
FIGS. 27A-27D depict cross-sectional views of a combined positive and negative imprint lithography process.

In an embodiment, a process may combine positive and negative imprint lithography. A template for a combined positive and negative imprint lithography process may include recesses suitable for positive lithography and recesses suitable for negative lithography. For example, an embodiment of a template for combined positive and negative imprint lithography is depicted in FIG. 27A. Template 12, as depicted in FIG. 27A, includes a lower surface 566, at least one first recess 562, and at least one second recess 564. First recess 562 is configured to create a discontinuous portion of curable liquid 40 when template 12 contacts curable liquid 40, depicted in FIG. 27B. A height of first recess ($h_2$) is substantially greater than a height of second recess ($h_1$).

A typical combined imprint lithography process is shown in FIGS. 27A-27D. As depicted in FIG. 27A, template 12 is positioned in a spaced relation to substrate 20 such that a gap is formed between template 12 and substrate 20. At least the lower surface 566 of template 12 may be treated with a thin surface treatment layer (not shown) that lowers template 12 surface energy and assists in separation of template 12 from cured masking layer 42. Additionally, surfaces of first recesses 562 and/or second recesses 564 may be treated with the thin surface treatment layer.

Figure 27B:
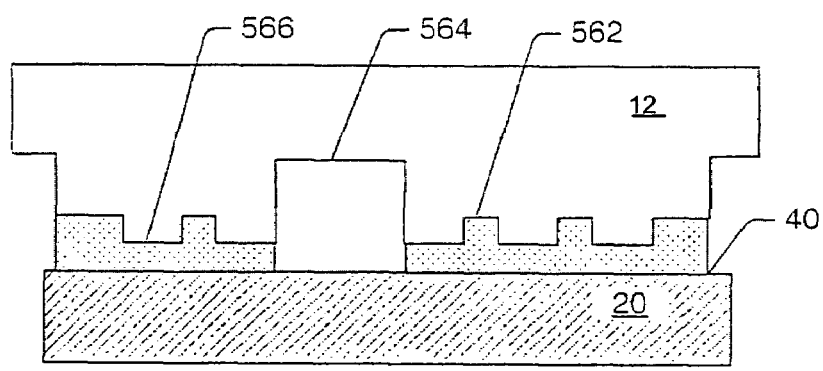
Figure 27C:
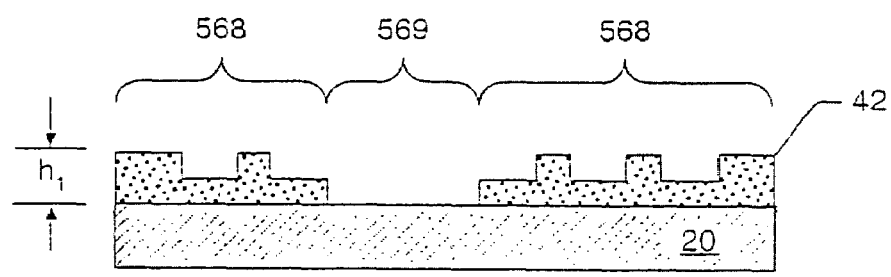

Curable liquid 40 is disposed on the surface of substrate 20. Template 12 is brought into contact with curable liquid 40. As depicted in FIG. 27B, curable liquid 40 fills the gap between lower surface 566 of template 12 and substrate 20. Curable liquid 40 also fills first recesses 562. However, curable liquid 40 is substantially absent from regions of substrate 20 approximately below second recesses 564. Thus, curable liquid 40 is maintained as a discontinuous film on substrate 20 that includes surface topography corresponding to the pattern formed by first recesses 562. After template 12 is properly positioned, curable liquid 40 is cured to form masking layer 42 on substrate 20. Template 12 is removed from masking layer 42, leaving cured masking layer 42 on the surface of substrate 20, as depicted in FIG. 27C. Masking layer 42 may include a patterning region 568 that resembles a mask layer formed by negative imprint lithography. In addition, masking 42 may include a channel region 569 that does not include any masking material.

Figure 27D:
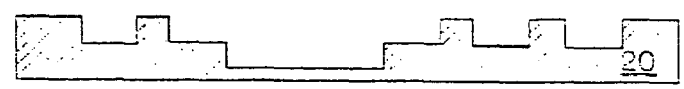

In one embodiment, masking layer 42 is composed of a material that has the same or a similar etch rate as underlying substrate 20. An etch process is to be applied to masking layer 42 to remove masking layer 42 and substrate 20 at substantially the same etch rate. In this manner the multilayer pattern of template 12 may be transferred to substrate 20, as depicted in FIG. 27D. This process may also be performed using transfer layer 18 as described in other embodiments.

A combination of positive and negative lithography is also useful for patterning multiple regions of template 12. For example, substrate 20 may include a plurality of regions that require patterning. As depicted in FIG. 27C, template 12 with multiple depth recesses includes two patterning regions 568 with an intervening "border" region 569. Border region 569 inhibits flow of a liquid beyond the patterning area of template 12.

Step and Repeat

As used herein, a "step and repeat" process refers to using a template smaller than the substrate to form a plurality of patterned regions on the substrate. A step and repeat imprint process includes depositing a light curable liquid on a portion of a substrate, aligning a pattern in the cured liquid to previous patterns on the substrate, impressing a template into the liquid, curing the liquid, and separating the template from the cured liquid. Separating the template from the substrate may leave an image of the topography of the template in the cured liquid. Since the template is smaller than the total surface area of the substrate, only a portion of the substrate includes the patterned cured liquid. The "repeat" portion of the process includes depositing a light curable liquid on a different portion of the substrate. A patterned template is then aligned with the substrate and contacted with the curable liquid. The curable liquid is cured using activating light to form a second area of cured liquid. This process may be continually repeated until most of the substrate is patterned. Step and repeat processes may be used with positive, negative, or positive/negative imprint processes. Step and repeat processes may be performed with any embodiments of equipment described herein.

Step and repeat imprint lithography processes offer a number of advantages over other techniques. Step and repeat processes described herein are based on imprint lithography that uses low viscosity light curable liquids and rigid, transparent templates. The templates are transparent to liquid activating light and alignment mark detection light thus offering the potential for layer-to-layer alignment. For production-scale imprint lithography of multi-level devices, it is advantageous to possess very high-resolution layer-to-layer alignment (e.g., as low as ⅓ of the minimum feature size ("MFS")).

There are various sources of distortion errors in the making of the templates. Step and repeat processes are used so that only a portion of a substrate is processed during a given step. The size of the field processed during each step should be small enough to possess pattern distortions of less than ⅓ the MFS. This necessitates step and repeat patterning in high-resolution imprint lithography. This is also the reason why most optical lithography tools are step and repeat systems. Also, as discussed before, a need for low CD variations and defect inspection/repair favors processing of small fields.

In order to keep process costs low, it is important for lithography equipment to possess sufficiently high throughput. Throughput requirements put a stringent limit on the patterning time allowed per field. Low viscosity liquids that are light curable are attractive from a throughput point of view. These liquids move much faster to properly fill the gap between the template and the substrate, and the lithography capability is pattern independent. The resulting low pressure, room temperature processing is suitable for high throughput, while retaining the benefits of layer-to-layer alignment.

While prior inventions have addressed patterning of low viscosity light curable liquids, they have not addressed this for a step and repeat process. In photolithography, as well as in hot embossing, a film is spin coated and hard baked onto the substrate prior to its patterning. If such an approach is used with low viscosity liquids, there are three major problems. Low viscosity liquids are difficult to spin coat since they tend to de-wet and cannot retain the form of a continuous film. Also, in a step and repeat process, the liquid undergoes evaporation, thereby causing varying amounts of liquid to be left behind on the substrate as the template steps and repeats over the substrate. Finally, a blanket light exposure tends to disperse beyond the specific field being patterned. This tends to cause partial curing of the subsequent field, thereby affecting the fluid properties of the liquid prior to imprinting. An approach that dispenses liquid suitable for a single field onto the substrate, one field at a time, may solve the above three problems. However, it is important to accurately confine the liquid to that particular field to avoid loss of usable area on the substrate.

In general, lithography is one of many unit processes used in the production of devices. The cost of all of these processes, particularly in multi-layer devices, makes it highly desirable to place patterned regions as close as possible to each other without interfering with subsequent patterns. This effectively maximizes the usable area and hence the usage of the substrate. Also, imprint lithography may be used in a "mix-and-match" mode with other kinds of lithography (such as optical lithography) wherein different levels of the same device are made from different lithography technologies. It is advantageous to make the imprint lithography process compatible with other lithography techniques. A border region separates two adjacent fields on a substrate. In state-of-the-art optical lithography tools this border region may be as small as 50-100 microns. The size of the border is typically limited by the size of the blades used to separate the patterned regions. This small border is expected to get smaller as the blades that dice the individual chips get thinner. In order to accomplish this stringent border size requirement, the location of any excess liquid that is expelled from the patterned area should be well confined and repeatable. As such, the individual components, including the template, substrate, liquid and any other materials that affect the physical properties of the system including, but not limited to, surface energy, interfacial energies, Hamacker constants, Van der Waals' forces, viscosity, density, opacity, etc., are engineered as described herein to properly accommodate a repeatable process.

Formation of Discontinuous Films

As discussed previously, discontinuous films are formed using an appropriately patterned template. For example, a template with high aspect ratio recesses that define a border region can inhibit the flow of a liquid beyond the border area. The inhibition of the liquid within a border area is influenced by a number of factors. As discussed above template design plays a role in the confinement of a liquid. Additionally, the process by which the template is contacted with the liquid also influences the confinement of the liquid.

Figure 19A:
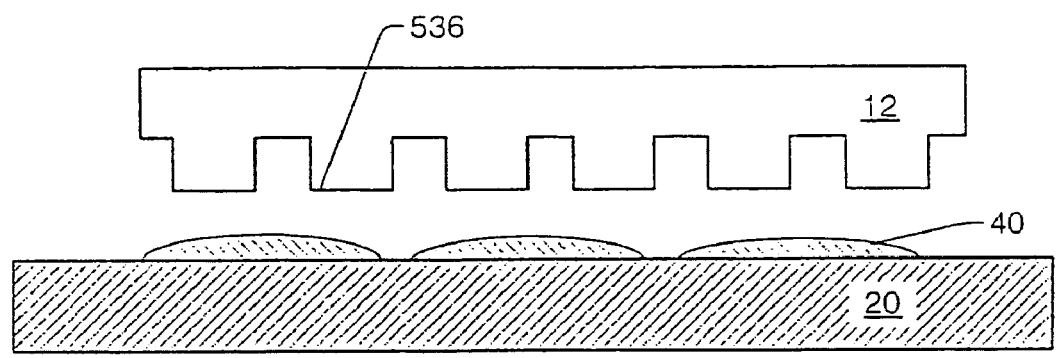
FIGS. 19A-19D depict cross-sectional views of a sequence of steps of a template contacting a liquid disposed on a substrate.
Figure 19B:
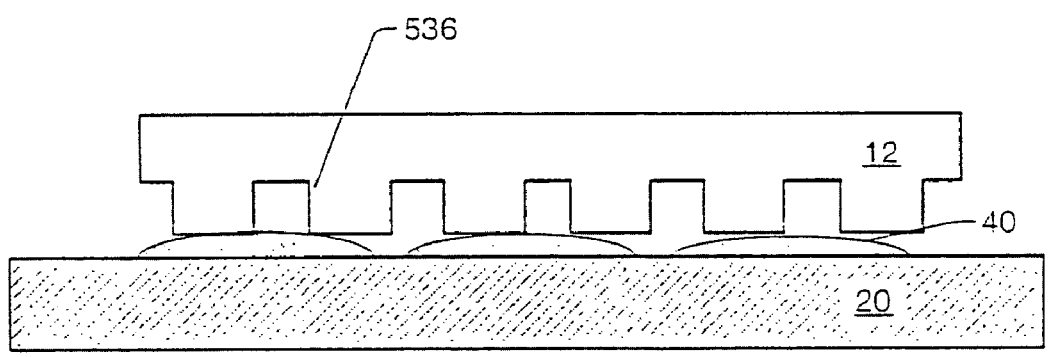
Figure 19C:
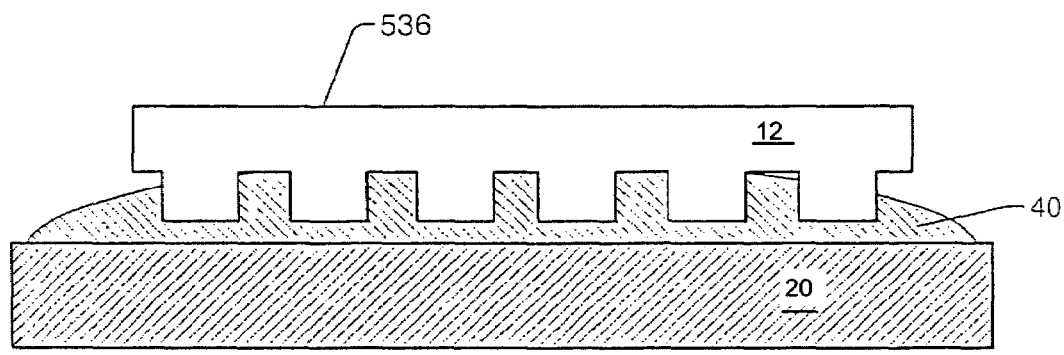
Figure 19D:
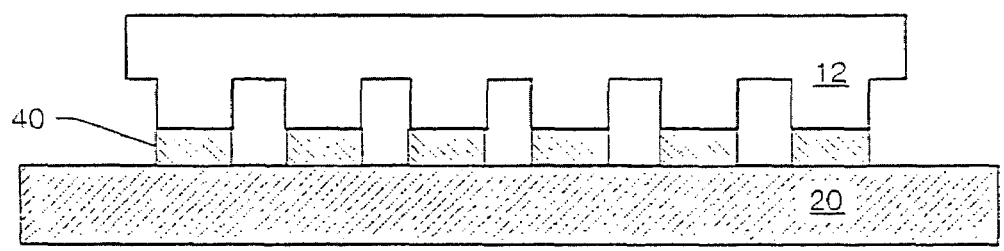

FIGS. 19A-19C depict a cross-sectional view of a process wherein discontinuous films are formed on a surface. In one embodiment, curable liquid 40 is dispensed onto substrate 20 as a pattern of lines or droplets, as depicted in FIG. 19A. Curable liquid 40, therefore, does not cover an entire area of substrate 20 to be imprinted. As lower surface 536 of template 12 contacts curable liquid 40, the force of template 12 on curable liquid 40 causes the curable liquid 40 to spread over the surface of substrate 20, as depicted in FIG. 19B. Generally, the more force that is applied by template 12 to curable liquid 40, the further curable liquid 40 will spread over substrate 20. Thus, if a sufficient amount of force is applied, curable liquid 40 may be forced beyond a perimeter of template 12, as depicted in FIG. 19C. By controlling the forces applied to curable liquid 40 by template 12, the liquid is confined within the predetermined borders of template 12, as depicted in FIG. 19D.

The amount of force applied to curable liquid 40 is related to the amount of liquid dispensed on substrate 20 and the distance template 12 is from the substrate during curing. For a negative imprint lithography process the amount of fluid dispensed onto the substrate should be less than or equal to a volume defined by: the volume of liquid required to substantially fill the recesses of the patterned template, the area of the substrate to be patterned, and the desired thickness of the cured layer. If the amount of cured liquid exceeds this volume, the liquid will be displaced from the perimeter of the template when the template is brought to the appropriate distance from the substrate. For a positive imprint lithography process the amount of liquid dispensed onto the substrate should be less than the volume defined by: the desired thickness of the cured layer (i.e., the distance between the non-recessed portions of the template and the substrate) and the surface area of the portion of the substrate to be patterned.

For an imprint lithography process that uses a template that includes one or more borders, the distance between the non-recessed surface of the template and the substrate is set between the minimum film thickness and the maximum film thickness, as previously described. Setting the height between these values allows the appropriate capillary forces to contain the liquid within the border-defined areas of the template. Additionally, the thickness of the layer should be approximately comparable to the height of the patterned features. If the cured layer is too thick, the features formed in the cured layer may be eroded before the features can be transferred to the underlying substrate. It is therefore desirable to control the volume as described above to allow the appropriate film thickness to be used.

The force applied by template 12 to curable liquid 40 is also influenced by the rate at which template 12 is brought into contact with curable liquid 40. Generally, the faster template 12 is brought into contact, the more force is applied to curable liquid 40. Thus, some measure of control of the spread of curable liquid 40 on the surface of substrate 12 may be achieved by controlling the rate at which template 12 is brought into contact with curable liquid 40.

All of these features are considered when positioning the template with respect to the substrate for an imprint lithography process. By controlling these variables in a predetermined manner, the flow of liquid may be controlled to stay confined within a predetermine area.

Alignment Techniques

Overlay alignment schemes include measurement of alignment errors followed by compensation of these errors to achieve accurate alignment of a patterned template and a desired imprint location on a substrate. Correct placement of the template with respect to the substrate is important for achieving proper alignment of the patterned layer with any previously formed layers on the substrate. Placement error, as used herein, generally refers to X-Y positioning errors between a template and substrate (that is, translation along the X- and/or Y-axis). Placement errors, in one embodiment, are determined and corrected for by using a through-the-template optical device, as depicted in FIG. 14.

Figure 28:
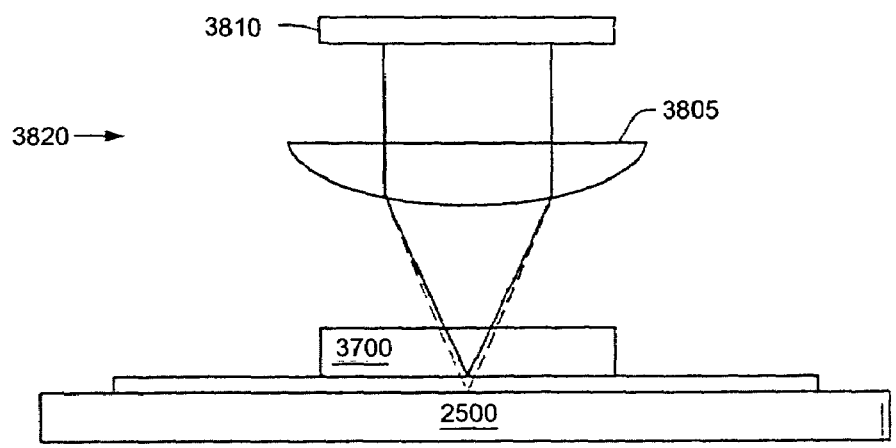
FIG. 28 depicts a schematic of an optical alignment measuring device positioned over a template and substrate.
Figure 29:
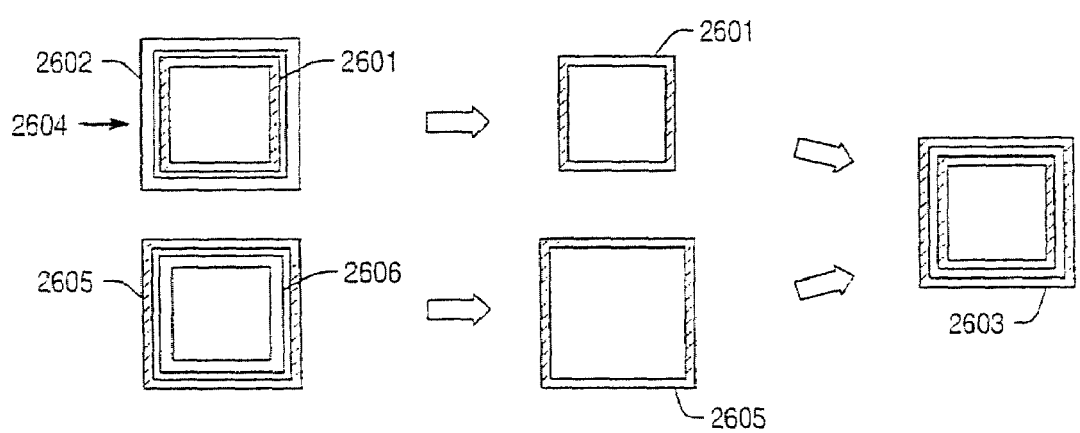
FIG. 29 depicts a scheme for determining the alignment of a template with respect to a substrate using alignment marks by sequentially viewing and refocusing.

FIG. 28 illustrates a schematic diagram of optical system 3820 of through-the-template optical imaging system 3800 (see also FIG. 14). Optical system 3820 is configured to focus two alignment marks from different planes onto a single focal plane. Optical system 3820 may use the change of focal length resulting from light with distinct wavelengths to determine the alignment of the template with an underlying substrate. Optical system 3820 may include optical imaging device 3810, an illumination source (not shown), and focusing device 3805. Light with distinct wavelengths may be generated either by using individual light sources or by using a single broad band light source and inserting optical band-pass filters between the imaging plane and the alignment marks. Depending on the gap between patterned template 3700 and substrate 2500, different wavelengths are selected to adjust the focal lengths. Under each wavelength of light used, each overlay mark may produce two images on the imaging plane, as depicted in FIG. 29. A first image 2601, using a specific wavelength of light, is a clearly focused image. A second image 2602, using the same wavelength of light, is an out-of-focus image. In order to eliminate each out-of-focus image, several methods may be used.

In a first method, under illumination with a first wavelength of light, two images may be received by optical imaging device 3810. Images are depicted in FIG. 29 and generally referenced by numeral 2604. While images are depicted as squares, it should be understood that any other shape may be used, including crosses. Image 2602 corresponds to an overlay alignment mark on the substrate. Image 2601 corresponds to an overlay alignment mark on the template. When image 2602 is focused, image 2601 is out of focus. In an embodiment, an image processing technique may be used to erase geometric data corresponding to pixels associated with image 2602. Thus, the out-of-focus image of the substrate mark may be eliminated, leaving only image 2601. Using the same procedure and a second wavelength of light, images 2605 and 2606 may be formed on optical imaging device 3810. Te out-of-focus image 2606 is then eliminated, leaving only image 2605. The two remaining focused images 2601 and 2605 are then combined onto a single imaging plane 2603 for making overlay error measurements.

Figure 30:
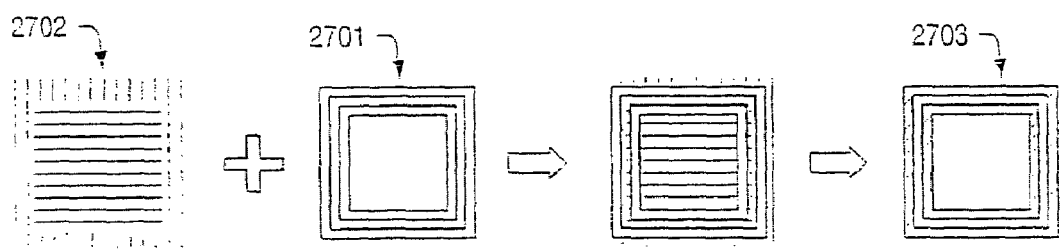
FIG. 30 depicts a scheme for determining the alignment of a template with respect to a substrate using alignment marks and polarized filters.

A second method may utilize two coplanar polarizing arrays, as depicted in FIG. 30, and polarized illumination sources. FIG. 30 illustrates overlay marks 2701 and orthogonally polarizing arrays 2702. Polarizing arrays 2702 are formed on the template surface or placed above the surface. Under two polarized illumination sources, only focused images 2703 (each corresponding to a distinct wavelength and polarization) may appear on the imaging plane. Thus, out-of-focus images are filtered out by polarizing arrays 2702. An advantage of this method may be that it may not require an image processing technique to eliminate out-focused images.

Moiré pattern-based overlay measurement has been used for optical lithography processes. For imprint lithography processes, where two layers of Moiré patterns are not on the same plane but still overlapped in the imaging array, acquiring two individual focused images may be difficult to achieve. However, carefully controlling the gap between the template and substrate within the depth of focus of the optical measurement tool and without direct contact between the template and substrate may allow two layers of Moiré patterns to be simultaneously acquired with minimal focusing problems. It is believed that other standard overlay schemes based on the Moiré patterns may be directly implemented to imprint lithography processes.

Another concern with overlay alignment for imprint lithography processes that use UV curable liquid materials may be the visibility of the alignment marks. For the overlay placement error measurement, two overlay marks, one on the template and the other on the substrate are used. However, since it is desirable for the template to be transparent to a curing agent, the template overlay marks, in some embodiments, are not opaque lines. Rather, the template overlay marks are topographical features of the template surface. In some embodiments, the marks are made of the same material as the template. In addition, UV curable liquids may have a refractive index that is similar to the refractive index of the template materials (e.g., quartz). Therefore, when the UV curable liquid fills the gap between the template and the substrate, template overlay marks may become very difficult to recognize. If the template overlay marks are made with an opaque material (e.g., chromium), the UV curable liquid below the overlay marks may not be properly exposed to the UV light.

Figure 31:
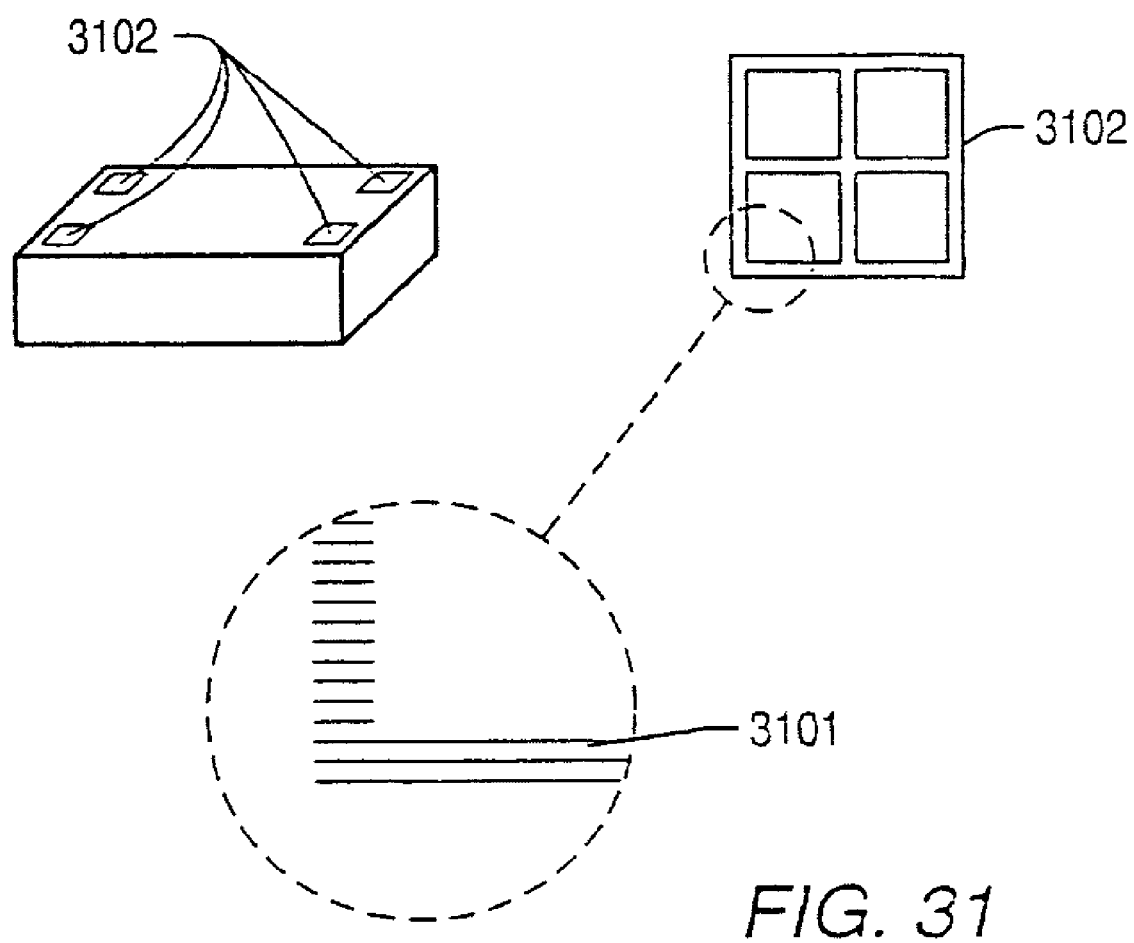
FIG. 31 depicts a top view of an alignment mark that is formed from polarizing lines.

In an embodiment, overlay marks are used on the template that are seen by optical imaging system 3800 but are opaque to the curing light (e.g., UV light). An embodiment of this approach is illustrated in FIG. 31. In FIG. 31, instead of completely opaque lines, overlay marks 3102 on the template may be formed of fine polarizing lines 3101. For example, suitable fine polarizing lines have a width about ½ to ¼ of the wavelength of activating light used as the curing agent. The line width of polarizing lines 3101 should be small enough so that activating light passing between two lines is diffracted sufficiently to cause curing of all the liquid below the lines. In such an embodiment, the activating light may be polarized according to the polarization of overlay marks 3102. Polarizing the activating light provides a relatively uniform exposure to all the template regions, including regions having overlay marks 3102. Light used to locate overlay marks 3102 on the template may be broadband light or a specific wavelength that may not cure the liquid material. This light need not be polarized. Polarizing lines 3101 are substantially opaque to the measuring light, thus making overlay marks 3102 visible using established overlay error measuring tools. Fine polarized overlay marks are fabricated on the template using existing techniques, such as electron beam lithography.

In another embodiment, overlay marks 3102 are formed of a different material than the template. For example, a material selected to form the template overlay marks 3102 may be substantially opaque to visible light, but transparent to activating light used as the curing agent (e.g., UV light). For example, $SiO_x$, where X is less than 2, may be used as such a material. In particular, structures formed of $SiO_x$, where X is about 1.5, are substantially opaque to visible light, but transparent to UV curing light.

Off-Axis Alignment

In one embodiment, alignment of one or more template alignment marks may be accomplished using an off-axis alignment process. As described above, a system may include off-axis optical imaging devices coupled to the imprint head and the motion stage. While the following description is directed to systems that have the substrate mounted to a motion stage, it should be understood that the process may be readily modified for systems that have an imprint head mounted to a motion stage. Additionally, it should be understood that the following description assumes that magnification errors have been corrected prior to performing an alignment process. Magnification errors occur when materials expand or contract due to changes in temperature. Techniques for correcting magnification errors are described in U.S. Ser. No. 09/907,512 filed Jul. 16, 2001 entitled "High-Resolution Overlay Alignment Methods and Systems for Imprint Lithography," which is incorporated herein by reference. Also, magnification corrections that are different in two orthogonal directions in the plane of the pattering areas of the template may also be required before aligning.

FIGS. 46A-46D depict schematic views of a system for off-axis alignment of a template with a substrate. Imprint head 3100 includes a template 3700 and an off-axis imaging device 3840. Substrate 4600 is mounted to a substrate chuck 3610 which is coupled to a motion stage 3620. Motion stage 3620 is configured to control motion of the substrate 4600 in a direction substantially parallel to the template 3700. Template optical imaging system 3850 is coupled to motion stage 3620 such that the template optical imaging system 3850 will move with the motion stage 3620. The system also includes a system alignment target 4630. System alignment target 4630 is coupled to a fixed portion of the system in optical alignment with template optical imaging system 3850. System alignment target 4630 may be coupled to the body of an imprint lithography system or a non-moving optical imaging system (e.g., template optical imaging system 3840). System alignment target 4630 is used as a fixed reference point for alignment measurements.

Figure 46A:
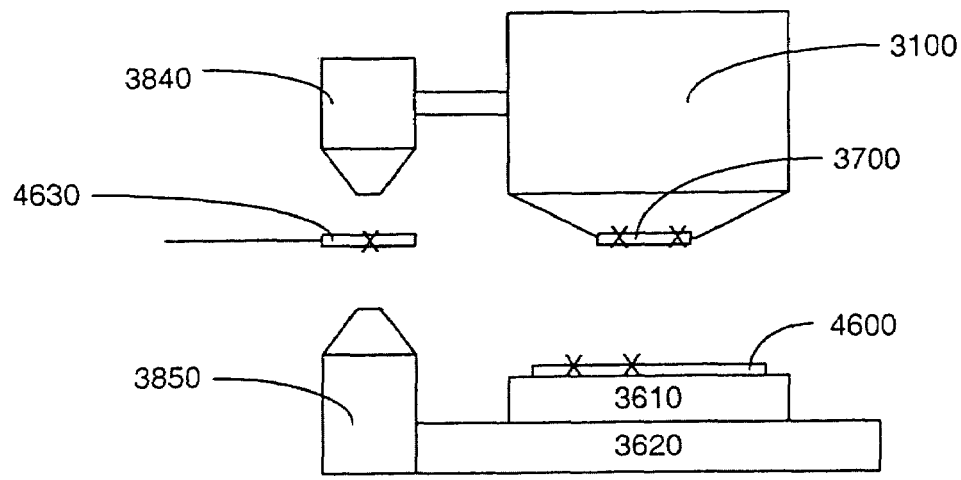
FIGS. 46A-46D depict schematic views of an off axis alignment method.
Figure 46B:
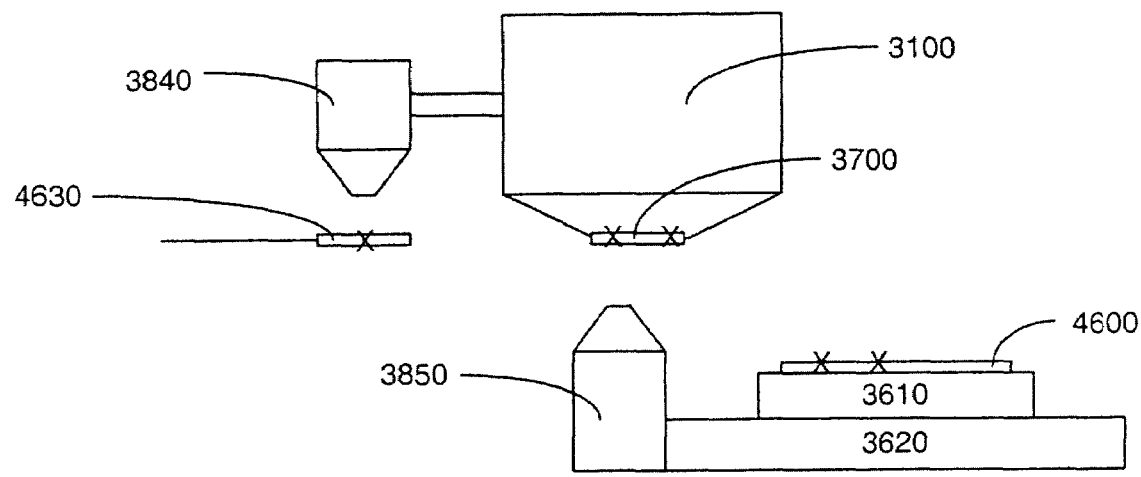

Template 3700 and substrate 4600 include at least one, preferably two alignment marks, as shown in FIG. 46A. During an imprinting process, alignment marks on the template 3700 are aligned with corresponding alignment marks on the substrate 4600 prior to curing a liquid disposed on the substrate 4600. In one embodiment, alignment may be performed by using off-axis optical imaging devices. FIG. 46A depicts the system in an initialized state. In this initial state the template alignment marks are not aligned with the substrate alignment marks. The optical alignment systems 3840 and 3850, however, are aligned with system alignment target 4630. Thus, the starting position of each motion with respect to a fixed point in the system is known.

Figure 46C:
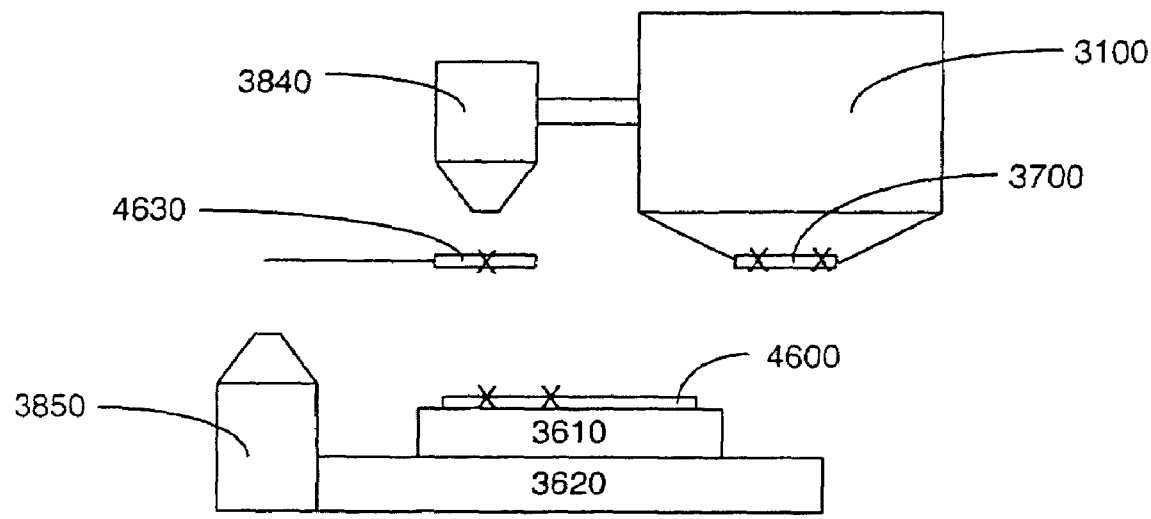

To perform alignment of the template 3700 and substrate 4600 the positions of the alignment marks with respect to the system alignment target 4630 are determined. To determine the positions of the template alignment marks with respect to the system alignment target 4630, motion stage 3620 is moved until a system alignment target 4630 is in the field of view of optical imaging device 3850, shown in FIG. 46B. The movement of the motion stage 3620 required to find the alignment mark (in an X-Y plane) is used to determine the position of the template alignment marks relative to the system alignment target 4630. The position of the substrate alignment targets may be determined by moving the substrate 4600 with motion stage 3620 until a substrate alignment mark is in the field of view of the off-axis optical imaging system 3840, as depicted in FIG. 46C. The movement of the motion stage 3620 required to find the alignment mark (in an X-Y plane) is used to determine the position of the template alignment marks relative to the system alignment target 4630. In an embodiment, the motion stage 3620 may be brought back to the initial positions (e.g., as depicted in FIG. 46A) prior to determining the position of the substrate alignment marks.

Figure 46D:
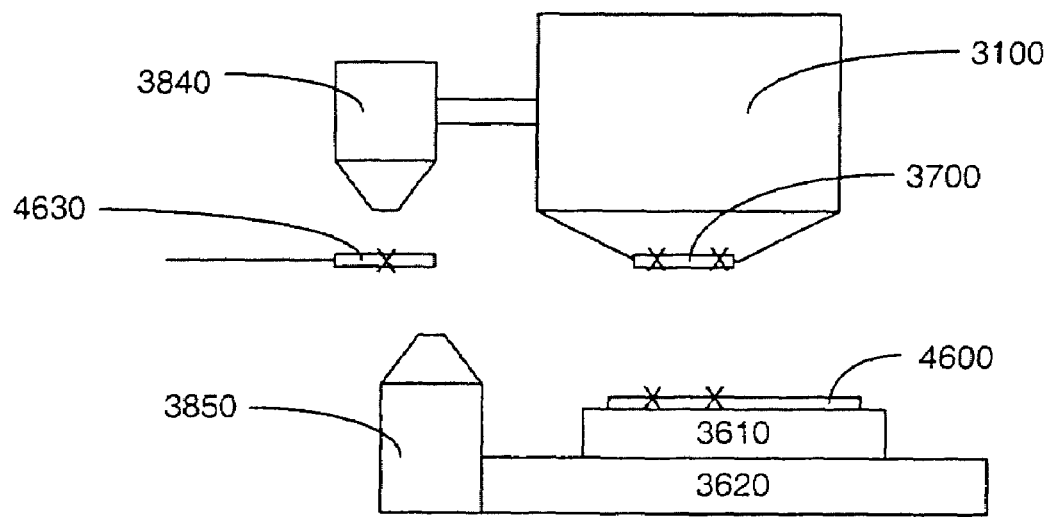

Once the position of the substrate and template alignment marks is determined, alignment is achieved by moving the substrate to the appropriate position. FIG. 46D depicts the final aligned state of the template and substrate.

Theta Alignment

To properly align a template with a field on a substrate, the position of the substrate with respect to the template is selected to allow alignment of alignment marks on the template and substrate. Typically, two or more alignment marks are formed on a template. Corresponding alignment marks are also formed on the substrate. When the alignment marks on the template are all properly aligned with the alignment marks on the substrate, the imprinting process is performed.

In some embodiments, the template may be rotated about the Z-axis with respect to the substrate. In such embodiments, it may not be possible to align multiple alignment marks on a template with corresponding alignment marks on the substrate by simple X-Y motion of the substrate. To properly align the template with the selected field on a substrate, the substrate (or template) is rotated about the Z-axis. This rotational correction is herein referred to as a "theta alignment."

Figure 47A:
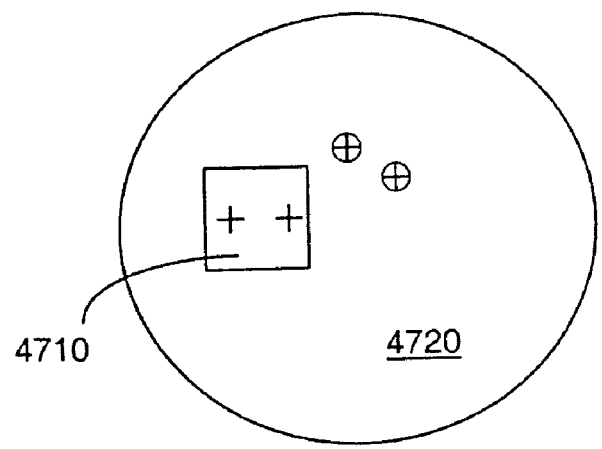
FIGS. 47A-47E depict overhead views of a theta alignment process.

FIG. 47A depicts an overhead view of a template 4710 positioned over a substrate 4720. Template 4710 includes at least two alignment marks and substrate 4720 includes at least two corresponding alignment marks. When properly aligned, all of the template alignment marks should align with all of the corresponding substrate alignment marks.

Figure 47B:
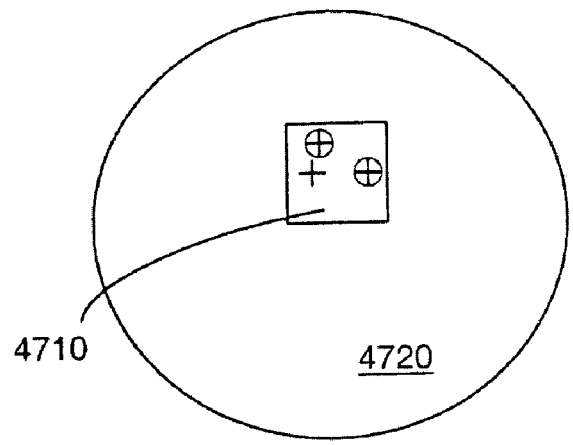

Initial alignment is conducted by moving the substrate 4720 (or the template 4710) to a position such that at least one of the alignment marks on template 4710 is aligned with at least one of the alignment marks on substrate 4720, as depicted in FIG. 47B. In the absence of any theta alignment error (and magnification errors), the other alignment marks should match up without any further movement of substrate 4720. As depicted in FIG. 47B, however, theta alignment errors will cause the other alignment marks on template 4710 and substrate 4720 to be misaligned. Before further imprinting is performed, theta error correction is performed.

Figure 47C:
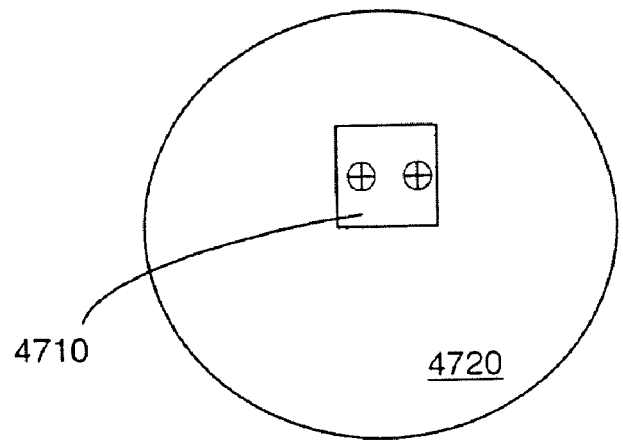

Theta error correction is accomplished by rotating substrate 4720 (or template 4710) about the Z-axis (i.e., the axis extending out of the page perpendicular to the X and Y axis of the page). Rotation of substrate 4720 will allow alignment of all the template and substrate alignment marks, as depicted in FIG. 47C.

Figure 47D:
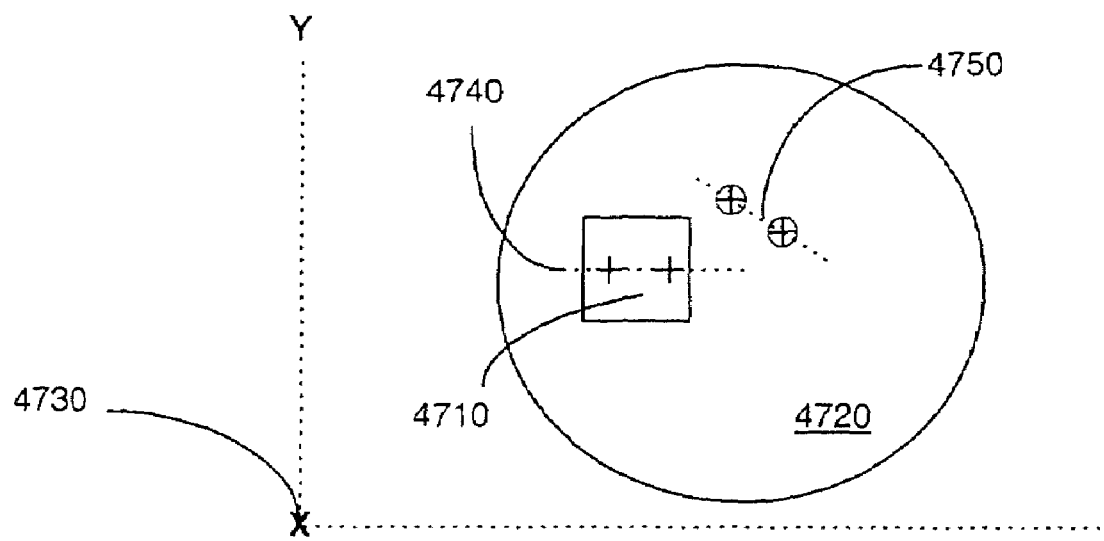

Theta error may be detected (and corrected for) using either off-axis or through-the-template alignment procedures. As described herein, off-axis alignment techniques allow the position of various alignment marks to be determined with respect to a fixed references point (e.g., the system alignment target). FIG. 47D depicts an overhead view of a template 4710 positioned over a substrate 4720. Template 4710 includes at least two alignment marks and substrate 4720 includes at least two corresponding alignment marks.

Initially, using off-axis imaging devices, the position of the two template alignment marks and the two substrate alignment marks is determined relative to the system alignment target 4730. The system alignment target 4730 defines the vertex of an X reference axis and a Y reference axis. The direction of the X reference axis and Y reference axis with respect to system alignment target 4730 is determined by the direction of X-motion and Y-motion of motion stage 3620, shown in FIG. 46D, respectively. The positions of the template alignment marks are used to determine the angle of a line 4740 that passes through the template alignment marks with respect to the X and Y reference axis. The positions of the substrate alignment marks are used to determine the angle of a line 4750 that passes through the substrate alignment marks, with respect to the X and Y reference axis. The angles of lines 4740 and 4750 may be determined using standard geometric functions. The difference in determined angle of 4740 and 4750 with respect to the X and Y reference axis represents the theta alignment error.

After determining the theta error, the motion stage is rotated to be the appropriate amount to correct for this error. Once corrected, the angle of line 4740, drawn through the template alignment marks, and line 4750, drawn through the substrate alignment marks, with respect to the X and Y reference axis, should be substantially the same. After theta correction is completed, the template and substrate alignment marks are brought into final alignment by X-Y movement of the motion stage. Imprinting processes are afterward performed with the properly aligned template and substrate.

In another embodiment, through-the-template alignment methods may be used to correct for theta errors and align the template with the substrate. Through-the-template alignment techniques are conducted by observing the alignment of a template alignment mark with respect to a corresponding substrate alignment mark by observing both marks. As described herein, this may be accomplished using an optical system that allows viewing the template and substrate alignment marks through the template.

Figure 47E:
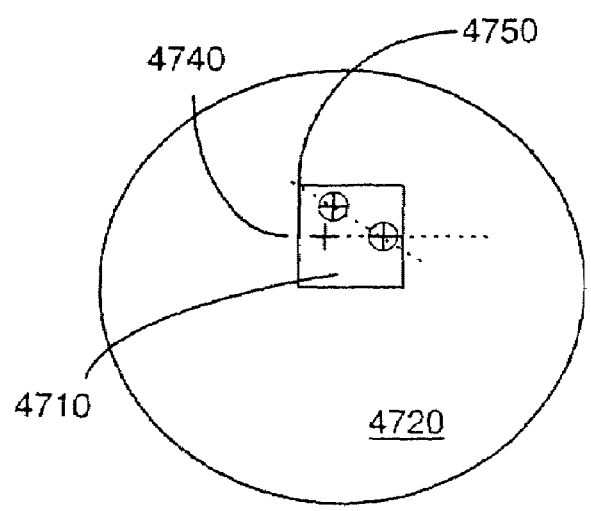

FIG. 47E depicts an overhead view of a template 4710 positioned over a substrate 4720. Template 4710 includes at least two alignment marks and substrate 4720 includes at least two corresponding alignment marks.

Initially, using a through-the-template optical imaging device, the motion stage is moved such that a first template alignment mark is aligned with a first substrate alignment mark, as depicted in FIG. 47E. The positions of the second template alignment mark and the second substrate alignment mark are determined by moving the optical imaging device across the template 4710 until the alignment marks are found. Once the location of the alignment marks are found, imaginary lines 4740 (between the template alignment marks) and 4750 (between the substrate alignment marks) are calculated and used to determine the theta angle between the two lines. This angle represents the theta error.

In one embodiment, the position of the second template and substrate alignment marks is determined by the movements of the motion stage. Initially the first template and substrate alignment marks are aligned as depicted in FIG. 47E. The optical imaging device is moved to find the second template alignment mark. After finding this mark, the motion stage is moved, while the optical imaging device is maintained in the same position, until the first template alignment mark is brought back into the field of view of the optical imaging device. The movement of the motion stage is monitored and this movement is used to calculate the position of the second template alignment mark with respect to the first template alignment mark. The position of the second template alignment mark with respect to the first template alignment mark is determined based on an X-Y reference plane defined by the direction of X-motion and Y-motion of the motion stage. In a similar manner, the position of the second substrate alignment mark is determined with respect to the first substrate alignment mark.

After determining the theta error, motion stage 3620, shown in FIG. 46D, is rotated by the appropriate amount to correct for this error. After theta correction is completed, the template and substrate alignment marks are brought into final alignment by X-Y movement of the motion stage. Imprinting processes are afterward performed with the properly aligned template and substrate.

In another embodiment, both off-axis and through-the-template alignment may be used together to align the template with the substrate. In this embodiment, off-axis methods may be used to perform a first alignment, while through-the-template alignment may be used to refine the alignment of the template with the substrate. Both theta correction and X-Y corrections are performed using both techniques.

The above-described theta correction alignment processes may be used for step and repeat processes. Step and repeat alignment may be conducted either by global or field-by-field alignment. For global alignment, two or more fields of a substrate will include at least two alignment marks. Off-axis or through-the-template alignment is conducted at two or more fields and the theta alignment error and X-Y alignment error at each field is determined. Optionally, alignment at each field may be accompanied by an imprinting step. The theta alignment errors and X-Y alignment errors at each field are then averaged to determine an "average alignment error." The average alignment error is used to determine the correction necessary to apply at any field on the substrate.

The average alignment error is then used in a step and repeat process. In the step and repeat process, each field's position is predetermined and stored in a database of the lithography system. During imprinting, the motion stage is moved such that the template is oriented over the desired position of the substrate based on the coordinates stored in the database. The template and substrate are then subjected to an alignment correction based on the average alignment error. Activating light curable liquid may be placed on the substrate prior to or after alignment correction. Activating light is applied to cure the activating light curable liquid and the template separated from the cured liquid. The motion stage is moved to orient the template over another portion of the substrate and the process is repeated.

Alternatively, a field-by-field alignment process may be used. During imprinting, the motion stage is moved such that the template is oriented over the desired field of the substrate based on the coordinates stored in the database. Each field of the substrate includes two or more alignment marks that correspond to alignment marks on the template. The template alignment marks are then aligned with the substrate alignment marks at the specific field being imprinted using wither off-axis, through-the-template, or a combination of these alignment techniques. Activating light curable liquid may be placed on the substrate prior to or after alignment. Activating light is applied to cure the activating light curable liquid and the template separated from the cured liquid. The motion stage is moved to orient the template over another field of the substrate and the template. Alignment is conducted with each individual field of the substrate.

Scatterometry Alignment Techniques

In one embodiment, alignment may be performed using scatterometry. Scatterometry is a technique used to measure the properties of light scattered off of a surface. For alignment of a template with a substrate, scatterometry uses diffraction gratings on the substrate and the template. In imprint lithography an alignment mark on the template and an alignment mark on the substrate can be separated from each other by less than 200 nm. The alignment system may, therefore, look at both alignment marks simultaneously. Generally, incident light on the alignment marks will be scattered from the alignment marks in a predictable manner depending on the orientation of the alignment marks with respect to each other. In one embodiment, the scattering of light when the alignment marks are aligned is calculated to generate a scattering profile. During use, alignment is achieved by moving either the substrate or the template until the scattered light profile from the alignment marks substantially matches the predetermined scattering profile.

During patterning of a substrate using imprint lithography, the patterned template is positioned over a predetermined portion of the substrate. Typically, the portion of the substrate which is being imprinted will have structures previously formed. Prior to imprinting, the patterned template needs to be aligned with the previously formed structures on the substrate. For sub-100 nm imprint lithography, alignment of a template with features on a substrate should be possible with an accuracy of less than about 25 nm, for some embodiments, less than about 10 nm. Alignment of the template with a substrate is typically achieved by the use of alignment marks. Matching alignment marks are formed in the substrate and the template and positioned in a predetermined position. When the alignment marks are properly aligned, the template is properly aligned with the substrate and the imprint process is performed.

Generally, alignment may be performed using high-power microscopes. Such microscopes collect images of the alignment marks. The collected images are analyzed by a user and the user may alter the position of the template with respect to the substrate to bring the images into alignment and, therefore, bring the template into alignment with the underlying substrate. High-power microscopes that can achieve alignment accuracies of less than 10 nm are very expensive and may be difficult to implement within an imprint lithography system.

Scatterometry offers a technique for collecting image data without having to image the features. In general, the scatterometry tool includes optical hardware, such as an ellipsometer or reflectometer, and a data processing unit loaded with a scatterometry software application for processing data collected by the optical hardware. The scatterometry tool generally includes an analyzing light source and a detector which are positionable proximate to alignment marks on the substrate and template. The light source may illuminate at least a portion of a diffraction grating structure of an alignment mark. The detector takes optical measurements, such as intensity or phase, of the reflected light. The data processing unit receives the optical measurements from the detector and processes the data to determine the scattering profile of light off of the diffraction grating.

The scatterometry tool may use monochromatic light, white light, or some other wavelength or combinations of wavelengths, depending on the specific implementation. The angle of incidence of the light may also vary, depending on the specific implementation. The light analyzed by the scatterometry tool typically includes a reflected component (i.e., incident angle equals reflected angle) and a scattered component (i.e., incident angle does not equal the reflected angle). For purposes of discussion hereinafter, the term "reflected" light is meant to encompass both components.

When the alignment mark on a template is aligned with an alignment mark on a substrate, light is reflected off of the surfaces in a manner that can be characterized by a reflection profile. Misalignment of the template alignment mark with the substrate alignment mark causes changes in the reflection profile (e.g., intensity, phase, polarization, etc.) measured by the scatterometry tool as compared to the light reflection profile that would be present when the marks are aligned. During use, the scatterometry tool measures reflection profiles for the alignment marks. A difference in the reflection profiles measured for the alignment marks during use indicates a misalignment of the template with the substrate.

A data processing unit of the scatterometry tool compares the measured reflection profile to the reference reflection profile library. The differences are between the measured reflection profile and the reference reflection profiles are used to determine the alignment of the template alignment mark with the substrate alignment mark. Alternatively, when the two gratings are aligned, the scattering pattern from a normal incident beam should be symmetrical, i.e., the + and − 1 orders should be the same, or any order (including zero) from two opposing low angle incident beams should be the same. The symmetrical signals from multiple wavelengths would be subtracted, and the differences summed to measure alignment and the wafer or template moved to minimize the sum.

Scatterometry offers advantages over optical imaging processes. The optical requirements of a scatterometry tool are much less than for an optical imaging system. Additionally, the scatterometry allows additional optical information (such as light phase and polarization) to be collected that can not be collected using an optical imaging device such as a microscope.

Figure 48A:
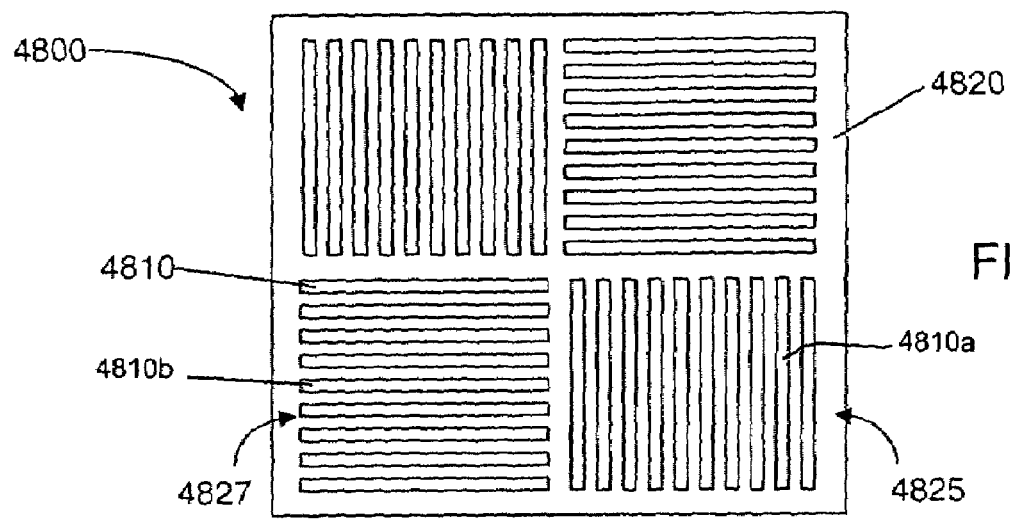
FIG. 48A depicts a top view of an alignment target that includes a diffraction grating.

An illustrative alignment mark is depicted in FIG. 48A. Alignment mark 4800 includes a plurality of trenches 4810 formed in substrate 4820 (e.g., the template or the substrate upon which the imprinted layer is being formed) that together define diffraction gratings (e.g., 4825 and 4827). Alignment mark 4800 is shown in cross-section in FIG. 48B. Typically, a diffraction grating may be formed by etching a plurality of grooves in a substrate. The grooves have substantially the same width and depth and are evenly spaced.

To allow alignment along the X and Y axis, at least two sets of diffraction gratings are used. As depicted in FIG. 48A, a first group of trenches 4810a define a diffraction grating 4825 for alignment along a first axis (e.g., the X-axis). A second group of trenches 4810b define a diffraction grating 4827 for alignment along a second axis (e.g., the Y-axis).

Figure 48B:
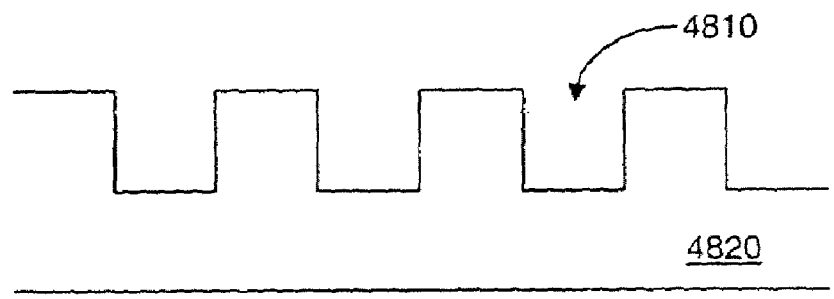
FIG. 48B depicts a cross-sectional view of an diffraction grating.
Figure 48C:
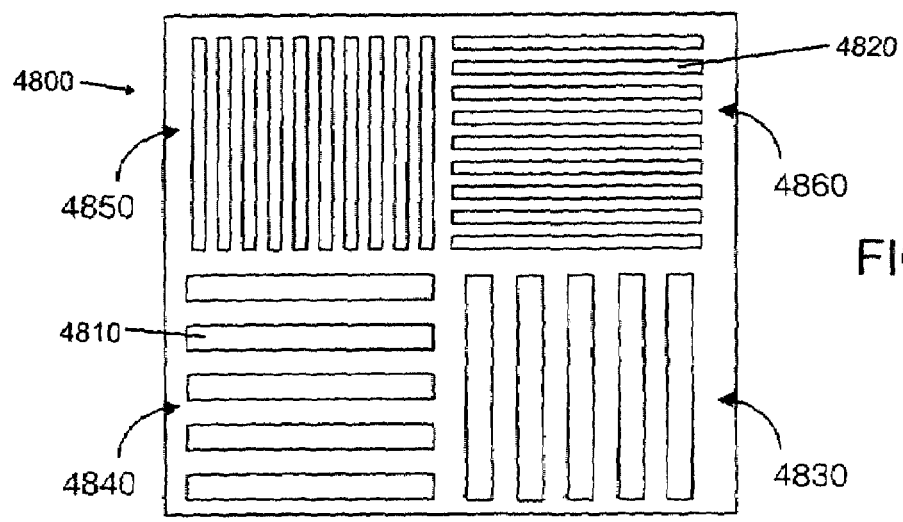
FIG. 48C depicts a top view of an alignment target that includes diffraction gratings having different spacings.

An alternate embodiment of an alignment mark is depicted in FIG. 48C. At least four sets of diffraction gratings are used for alignment of a template with a substrate. Diffraction gratings are formed from a plurality of trenches 4810 etched into the substrate 4820 as shown in FIGS. 48A and 48B. Two of the diffraction gratings, 4830 and 4840 are used for a coarse alignment of the template with the substrate. The coarse alignment gratings are formed from a plurality of trenches that have substantially the same width and depth and are evenly spaced. The coarse alignment diffraction grating trenches may be spaced at distances of between about 1 µm to about 3 µm. Diffraction gratings having a spacing in this range may be used to align a template with a substrate with an accuracy of up to about 100 nm. Diffraction grating 4830 is used for alignment along a first axis (e.g., the X-axis). Diffraction grating 4840 is used for alignment along a second axis (e.g., the Y-axis).

When imprinting structures having a feature size of less than about 100 nm onto a surface, such accuracy is not sufficient to allow proper orientation of different patterning layers. Additional diffraction grating structures, 4850 and 4860 may be used for a fine alignment. The fine diffraction gratings 4850 and 4860 are formed from a plurality of trenches that have substantially the same width and depth and are evenly spaced. The fine alignment diffraction grating trenches may be spaced at distances of between about 100 nm to about 1000 nm. Diffraction gratings having a spacing in this range may be used to align a template with a substrate with an accuracy of up to about 5 nm. Diffraction grating 4850 is used for alignment along a first axis (e.g., the X-axis). Diffraction grating 4860 is used for alignment along a second axis (e.g., the Y-axis).

Figure 49:
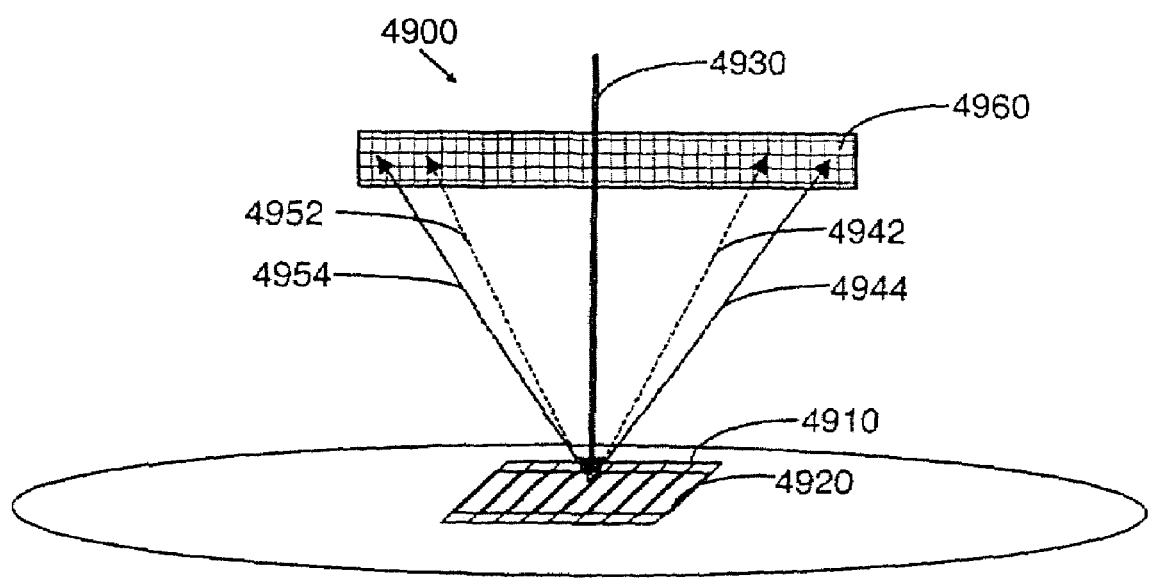
FIG. 49 depicts a schematic view of a scatterometry system for analyzing multiple wavelengths on N order scattered light.

FIG. 49 depicts a configuration of a scatterometry tool 4900 used to determine alignment between a template alignment mark 4910 and a substrate alignment mark 4920. Scatterometry tool 4900 produces an incident light beam 4930 which is directed to the alignment marks 4910 and 4920, as depicted. Incident light beam 4930 is directed in a direction that is substantially normal to the plane of the template (or substrate). Incident light beam 4930 may be produced from a white light source or any other source of light that is capable of producing multiple wavelengths of light. The light source used to produce the light may be disposed in the imprint head of an imprint system as described herein. Alternatively, a light source may be coupled to a body outside of the imprint head and an optical system may be used to conduct light to the template.

When light from the light source contacts the alignment marks 4910 and 4920, the light is scattered as depicted in FIG. 49. As is known in the art, scattering of light occurs to produce maximum light intensities at different angles. The angles at which the different light maxima are produced correspond to different diffraction orders. Typically, pluralities of orders are produced when light is reflected off of a diffraction grating. The zero order, as used herein, refers to light that is reflected back to the light source along the same optical path as the incident light. As depicted in FIG. 49, light reflected back to light source along incident light beam 4930 would be the zero order. First, order light is reflected off the diffraction gratings along an angle that differs from the angle of incidence. As depicted in FIG. 49, light beams 4942 and 4944 represent light produced along the positive first order (i.e., order +1) and light beams 4952 and 4954 represent light produced along the negative first order (i.e., order −1). While the +1 and −1 orders are depicted, it should be understood that other orders of light (e.g., N order, where n is greater than zero) may be used.

During use, light reflected from the substrate (and the through-the-template) is collected by detector 4960. Detector 4960, in one embodiment, is an array detector capable of simultaneously measuring light properties at a plurality of positions. When light is scattered from a diffraction grating, individual wavelengths of light are scattered differently. Generally, all wavelengths will be scattered along one of the diffraction orders; however, the different wavelength of light will be scattered at slightly different angles. FIG. 49 shows how two different wavelengths of light are reflected along the +1 and −1 orders. It should be noted that the difference in scattering angle has been exaggerated for the purposes of this discussion. Turning to the +1 order, light beam 4942 represents red light while light beam 4944 represents blue light. For the −1 order, light beam 4952 represents red light while light beam 4954 represents blue light. As depicted, the red light beams 4942 and 4944 and blue light beams 4944 and 4954 contact different portions of the detector 4960. Detector 4960 includes an array of light detection elements. The size and location of the light detection elements are such to allow analysis of the different wavelengths of light. As depicted in FIG. 49, red light 4942 hits a different light detection element than blue light 4944. Thus the scatterometry tool 4900 may simultaneously measure light properties at multiple wavelengths.

An advantage of measuring scattering at multiple wavelengths of light is that phase errors may be averaged out. Phase errors are caused by irregularities in the etching of the trenches that form the diffraction grating. For example, if the walls are non-parallel or the bottom of the trench is angled, light scattering may not follow the predicted model. Such errors tend to vary depending on the wavelength of light used for analysis. For example, processing errors in forming the trench may cause more deviation for red light than for blue light. By taking readings at multiple wavelengths, the singles may be averaged to create a more accurate guide for alignment.

Figure 50:
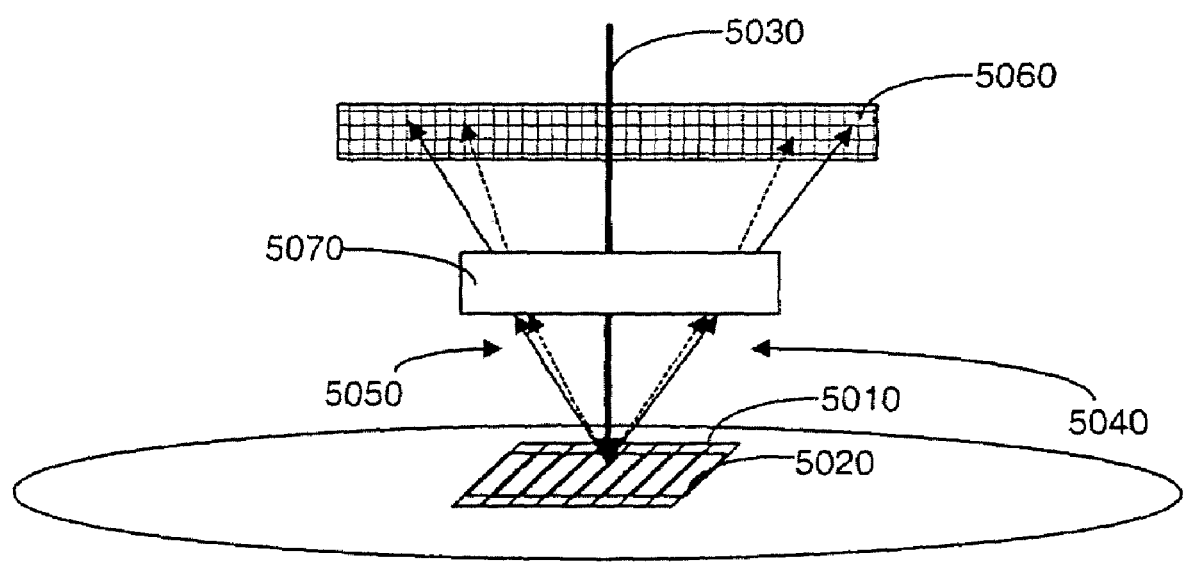
FIG. 50 depicts a schematic view of a scatterometry system for analyzing multiple wavelengths on N order scattered light through an optical element.

In an alternate embodiment, depicted in FIG. 50, the reflected light from the alignment marks may be scattered, as described above for FIG. 49. Instead of relying on the resolution of the detector to capture the different wavelengths of light, the reflected light may be split using an optical element 5070. As described above, a template alignment mark 5010 and a substrate alignment mark 5020 are illuminated with incident light 5030. Incident light 5030 is directed in a direction that is normal to the plane defined by the template. Light reflected from the diffraction gratings of the alignment marks 5010 and 5020 is analyzed along the +1 order (5040) and −1 order (5050). In this embodiment, an optical element 5070, is placed in the optical path between the substrate and the detector 5060. Optical element 5070 is configured to diffract light at different angles based on the wavelength of light. Optical element 5070 may be, for example, a diffraction grating (e.g., as part of a spectrophotometer) or a prism. Both prisms and diffraction gratings will diffract light at different angles based on the wavelength of the light. As depicted in FIG. 50, red light is diffracted at a different angle than the blue light. While depicted as a single element in FIG. 50, it should be understood that optical element 5070 may be composed of two individual elements.

Additionally, while optical element 5070 and detector 5060 are depicted as individual elements, it should be understood that the elements may be incorporated into a single device (e.g., a spectrophotometer).

Alternatively, optical element 5070 may be a lens. When optical element 5070 is a lens, diffraction occurs when the light passes through the lens. The extent of diffraction is based, in part, on the index of refraction of the lens material. The extent of diffraction is also based on the wavelength of the light. Different wavelengths of light will be diffracted at different angles. This causes what is known as "chromatic aberration." Chromatic aberration may be taken advantage of to enhance the separation of light into different wavelengths. In some embodiments, two lenses may be used, one for each order of light.

Scatterometry as described above may be used for an imprint lithography process. In an embodiment, a predetermined amount of an activating light curable liquid is placed on a portion of a substrate to be imprinted. A patterned template is positioned proximate to the substrate. Generally, the template is separated from the substrate by a distance of less than about 200 nm. To ensure proper alignment of the patterned template with previously formed structures on the substrate, a template alignment target is aligned with a substrate alignment target. The template alignment target includes a diffraction grating to allow a scattering technique to be used for alignment. Initial alignment of the template alignment mark with the substrate alignment mark is accomplished using optical imaging of the marks. The marks are aligned using pattern recognition software. Such alignment may be used to achieve an alignment accuracy within about 1 micron.

Scatterometry is used for the next iteration of alignment. In one embodiment, an alignment mark may include a coarse alignment diffraction grating and a fine alignment diffraction grating, such as the alignment mark 4800 depicted in FIG. 48C. A coarse alignment of the alignment marks may be performed using the coarse alignment diffraction gratings. A fine alignment of the alignment marks may be performed using the fine alignment diffraction gratings. All alignment measurements may be performed with the activating light curable liquid disposed between the template and the substrate. As described herein, an optical imaging device may be used to perform the initial alignment. Prior to performing scatterometry, the optical imaging device may be moved out of the optical path between a light source and the template. Alternatively, light from the light source may be directed in such a manner that the optical imaging device does not lie in the optical path between the light source and the template.

In an embodiment, light may be directed to the template and substrate alignment marks normal to the plane defined by the template. Light scattering along the +1 and −1 orders may be analyzed at a plurality of wavelengths. Intensity levels of light scattered at the +1 order are compared to light intensity levels of light scattered at the −1 order. If the template alignment mark and the substrate alignment mark are aligned, the intensities should be substantially identical at any given wavelength. Differences in the intensity of light between the +1 and −1 orders indicate that the alignment marks may be misaligned. Comparison of the degree of misalignment at a plurality of wavelength is used to produce an "average" misalignment of the alignment marks.

The average misalignment of the template and substrate alignment marks may be used to determine a correction needed in the position of the template with respect to the substrate to properly align the alignment marks. In one embodiment, the substrate is disposed on a substrate motion stage. Alignment may be achieved by moving the substrate in an appropriate manner as determined by the average misalignment calculated using scatterometry. After the template and substrate are properly aligned, curing of the liquid followed by separation of the template from the cured liquid may be performed.

Figure 51:
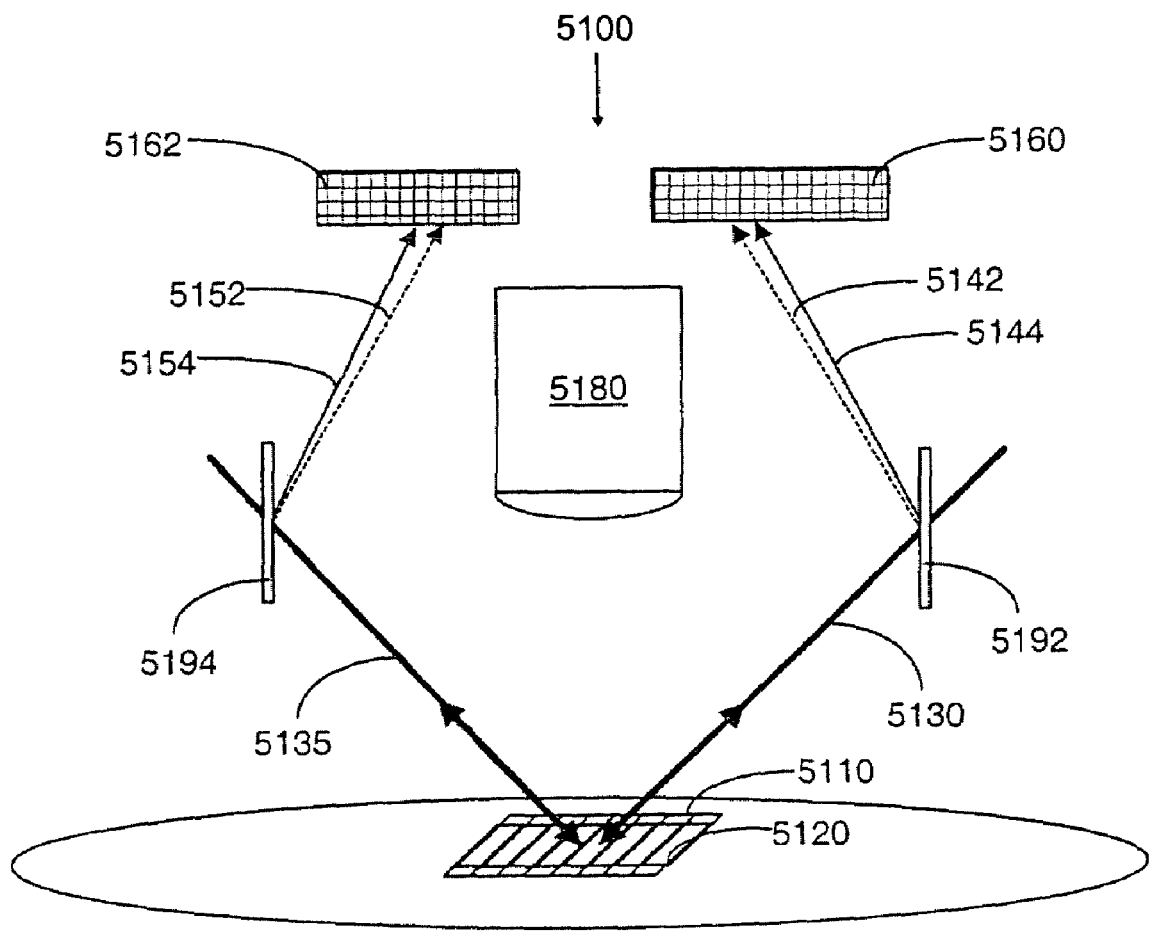
FIG. 51 depicts a schematic view of a scatterometry system for analyzing zero order scattered light at non-normal angles.

FIG. 51 depicts an alternate configuration of a scatterometry tool 5100 used to determine alignment between a template alignment mark 5110 and a substrate alignment mark 5120. Scatterometry tool 5100 uses measurements of two zero order reflections off the substrate to determine the alignment of the alignment marks 5110 and 5120. Two light sources produce two incident light beams 5130 and 5135 which are directed to the alignment marks 5110 and 5120, as depicted. Incident light beams 5130 and 5135 are directed in a direction that is substantially non-normal to the plane of the template (or substrate). Incident light beams 5130 and 5135 may be produced from a white light source or any other source of light that is capable of producing multiple wavelengths of light. Incident light beams 5130 and 5135 are passed through beam splitters 5192 and 5194, respectively.

When light from the light source contacts the alignment marks 5110 and 5120, the light is scattered as described above. Zero order light is the light that is reflected back to the light source along the same optical path as the incident light. Light reflected back toward the light is further reflected by beam splitters 5192 and 5194 toward detectors 5160 and 5162. Detectors 5160 and 5162, in one embodiment, are array detectors capable of simultaneously measuring light properties at a plurality of positions. When light is scattered from a diffraction grating, individual wavelengths of light are scattered differently. Generally, all wavelengths will be scattered along one of the diffraction orders, however, the different wavelength of light will be scattered at slightly different angles, as discussed before. It should be noted that the difference in scattering angle has been exaggerated for the purposes of this discussion. For incident light beam 5130, light beam 5142 represents red light while light beam 5144 represents blue light. For incident light beam 5135, light beam 5152 represents red light while light beam 5154 represents blue light. As depicted, the red light beams 5142 and 5152 and blue light beams 5144 and 5154 contact different portions of detectors 5160 and 5162. Detector 5160 includes an array of light detection elements. The size and location of the light detection elements are such to allow analysis of the different wavelengths of light. As depicted in FIG. 51, red light 5142 hits a different light detection element than blue light 5144. Thus the scatterometry tool 5100 may simultaneously measure light properties at multiple wavelengths. The use of an array detector has the additional advantage that any small changes in the orientation of the wafer or template or any other mechanical changes that cause changes in the positions of the order peaks can be detected and the intensities can be correctly measured.

Scatterometry tool 5100 depicted in FIG. 51 takes advantage of the strongest reflected signals (i.e., the zero order signals) for alignment. Generally, the differences in the alignment of the gratings is not very great along the zero order when the incident light is normal to the gratings. By using non-normal angles of incidence it is believed that that the zero order shows more sensitivity to misalignment of the gratings. Additionally, the optical path for the scatterometry tool 5100 allows the placement of an optical imaging device 5180 in the center of the scatterometry tool 5100. As described herein, optical imaging device 5180 may be used for coarse alignment of the template and substrate alignment marks 5110 and 5120. During alignment of the template and substrate using scatterometry tool 5100, movement of the optical imaging device may not be required.

Figure 52:
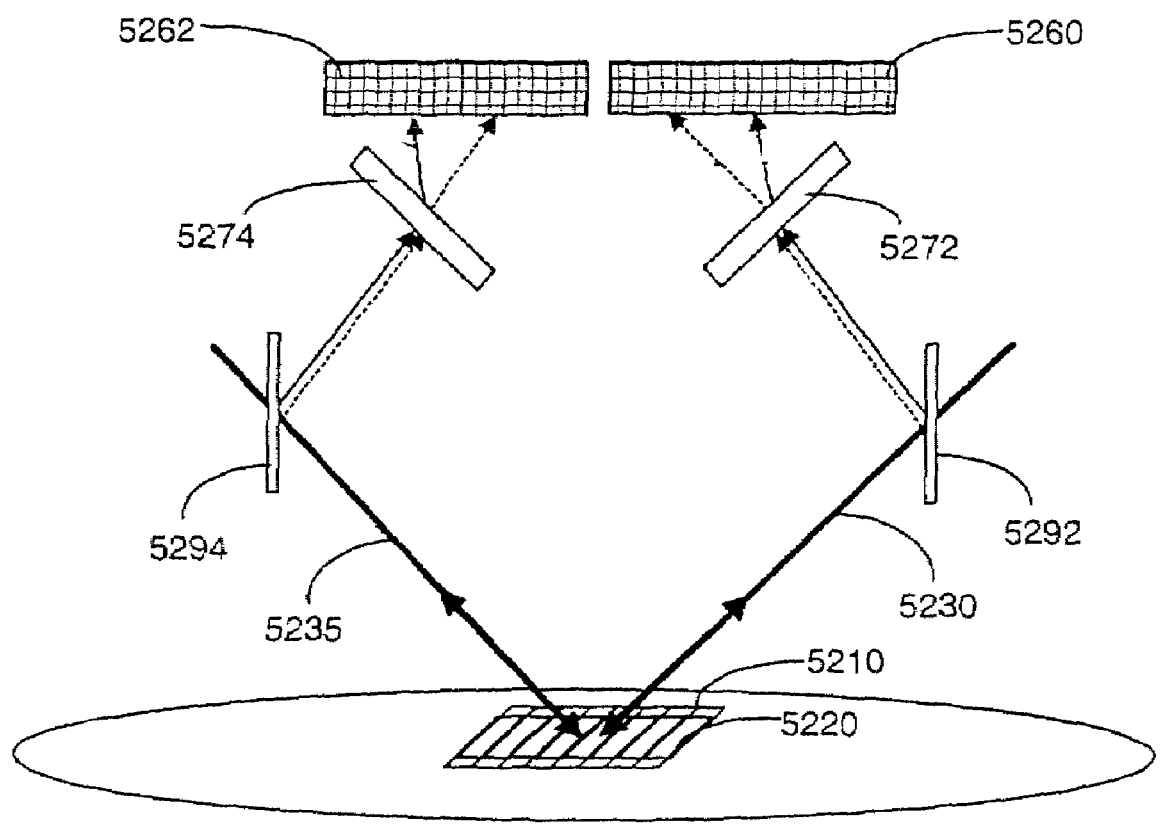
FIG. 52 depicts a schematic view of a scatterometry system for analyzing zero order scattered light at non-normal angles through optical elements.

In an alternate embodiment, depicted in FIG. 52, the reflected light from the alignment marks 5210 and 5220 may be scattered as described above for FIG. 51. Instead of relying on the resolution of the detector to capture the different wavelengths of light, the reflected light may be split using optical elements 5272 and 5274. As described above, template alignment mark 5210 and substrate alignment mark 5220 are illuminated with two beams of incident light 5230 and 5235. Incident light beams 5230 and 5235 are directed in a direction that is non-normal to the plane defined by the template. Light reflected from the diffraction gratings of alignment marks 5210 and 5220 is analyzed along the zero order by reflecting the light with beam splitters 5292 and 5294. In this embodiment, optical elements 5272 and 5274 are placed in the optical path between the substrate and detectors 5260 and 5262. Optical elements 5272 and 5274 are configured to diffract light at different angles based on the wavelength of light. Optical elements 5272 and 5274 may be, for example, a diffraction grating (e.g., as part of a spectrophotometer) or a prism. Alternatively, optical elements 5272 and 5274 may be a lens that exhibits chromatic aberrations.

Figure 53:
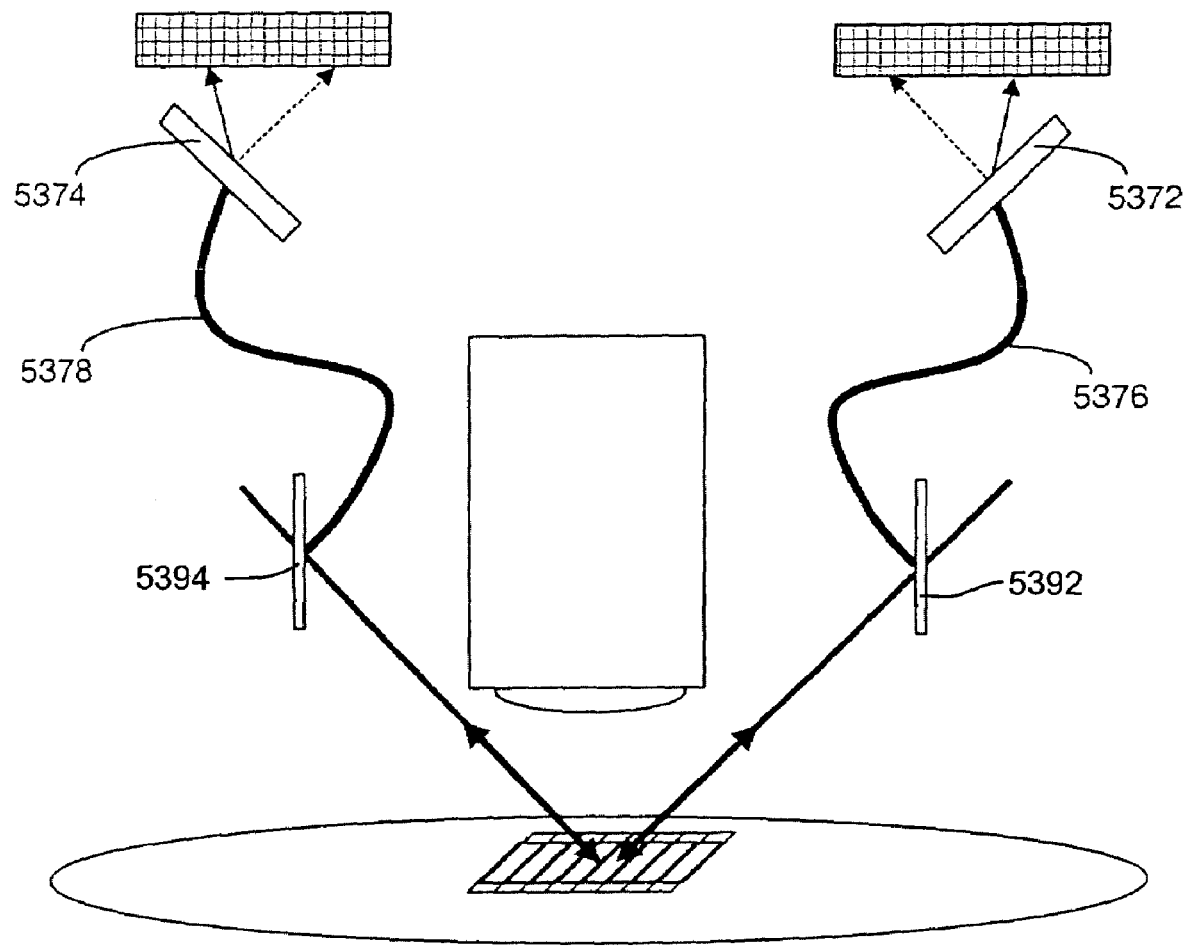
FIG. 53 depicts a schematic view of a scatterometry system for analyzing zero order scattered light at non-normal angles through a fiber optic system.

In an alternate embodiment, depicted in FIG. 53, the reflected light from the alignment marks may be scattered as described above for FIG. 51. Instead of relying on the resolution of the detector to capture the different wavelengths of light, the reflected light may be split using optical elements 5372 and 5374. Light that is reflected off of the alignment marks is directed by beam splitters 5392 and 5394 into fiber optic cables 5376 and 5378, respectively. The fiber optic cables 5376 and 5378 carry the light from the imprint system to optical elements 5372 and 5374. Optical elements 5372 and 5374 are configured to diffract light at different angles based on the wavelength of light. Optical elements 5372 and 5374 may be, for example, a diffraction grating (e.g., as part of a spectrophotometer) or a prism. Alternatively, optical elements 5372 and 5374 may be a lens that exhibits chromatic aberrations. An advantage of such an embodiment is that a portion of the optical system may be isolated from the imprint system. This allows the imprint system size to be kept at a minimal.

Figure 54:
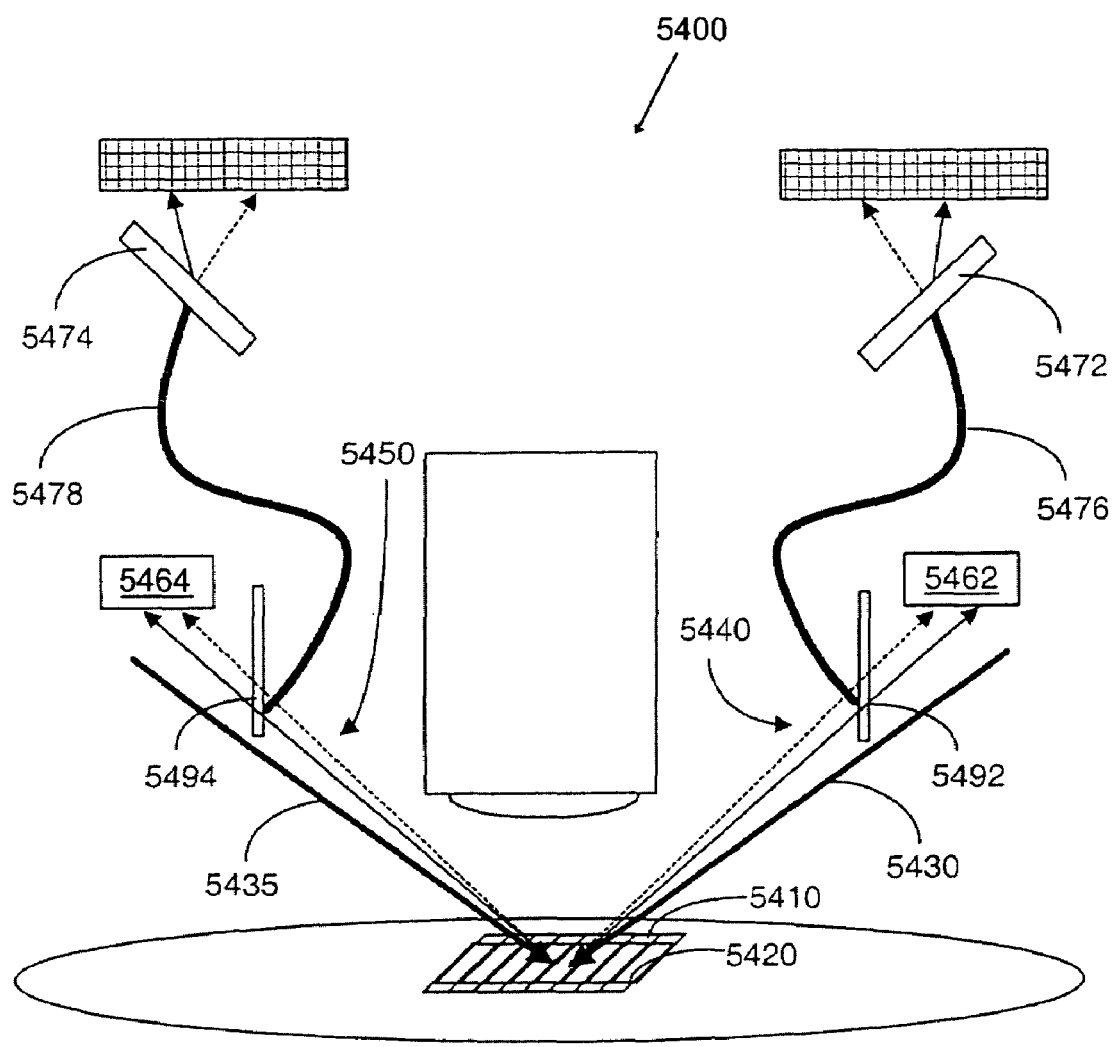
FIG. 54 depicts a schematic view of a scatterometry system for analyzing N order scattered light at non-normal angles through a fiber optic system.

An alternate embodiment of a configuration of a scatterometry tool 5400 used to determine alignment between a template alignment mark 5410 and a substrate alignment mark 5420 is depicted in FIG. 54. Two light sources produce two incident light beams 5430 and 5435 which are directed to the alignment marks 5410 and 5420, as depicted. Incident light beams 5430 and 5435 are directed in a direction that is substantially non-normal to the plane of the template (or substrate). Incident light beams 5430 and 5435 may be produced from a white light source or any other source of light that is capable of producing multiple wavelengths of light. Incident light beams 5430 and 5435 are passed through beam splitters 5492 and 5494, respectively.

When light from the light source contacts the alignment marks 5410 and 5420, the light is scattered as depicted in FIG. 54. As depicted in FIG. 54, light reflected back to light source along incident light beam 5430 and incident light beam 5435 would be the zero order. First order light is reflected off the diffraction gratings along an angle that differs from the angle of incidence. As depicted in FIG. 54, light rays 5440 represent light produced along the +1 order of incident light beam 5430. Light rays 5450 represent the +1 order of incident light beam 5440. −1 order beams are not depicted. While the +1 orders are depicted, it should be understood that other orders of light (e.g., N order, where n is greater than zero) may be used.

Light that is reflected off of the alignment marks 5410 and 5420 is directed by beam splitters 5492 and 5494 into fiber optic cables 5476 and 5478, respectively. The fiber optic cables 5476 and 5478 carry the light from the imprint system to optical elements 5472 and 5474. Optical elements 5472 and 5474 are configured to diffract light at different angles based on the wavelength of light. Optical elements 5472 and 5474 may be, for example, a diffraction grating (e.g., as part of a spectrophotometer) or a prism. Alternatively, optical elements 5472 and 5474 may be a lens that exhibits chromatic aberrations.

Beam splitters 5492 and 5494 will allow a portion of the reflected light to pass through the beam splitter. The portion of the light that passes through the beam splitters 5492 and 5494 is analyzed using light detectors 5462 and 5464. Light detectors 5462 and 5464 are used to determine the total intensity of all light passing through beam splitters 5492 and 5494. Data concerning the total intensity of light may be used to determine the alignment of the template and substrate alignment marks 5410 and 5420. In an embodiment, the alignment is determined as an average of the error measurements determined by the spectrophotometric analysis of the n order (e.g. +1 order) reflected light and the light intensity measurements.

It should be understood that any of the above described embodiments may be combined for different configurations. Furthermore, it should be understood that the light properties used to determine the alignment of the template and substrate marks include intensity of light and polarization of light.

Liquid Dispensing Patterns

In all embodiments of an imprint lithography process, a liquid is dispensed onto a substrate. While the following description is directed to dispensing liquids on substrate, it should be understood that the same liquid dispensing techniques are also used when dispensing liquids onto a template. Liquid dispensing is a carefully controlled process. In general, liquid dispensing is controlled such that a predetermined amount of liquid is dispensed in the proper location on the substrate. Additionally, the volume of liquid is also controlled. The combination of the proper volume of liquid and the proper location of the liquid is controlled by using the liquid dispensing systems described herein. Step and repeat processes, in particular, use a combination of liquid volume control and liquid placement to confine patterning to a specified field.

Figure 32A:
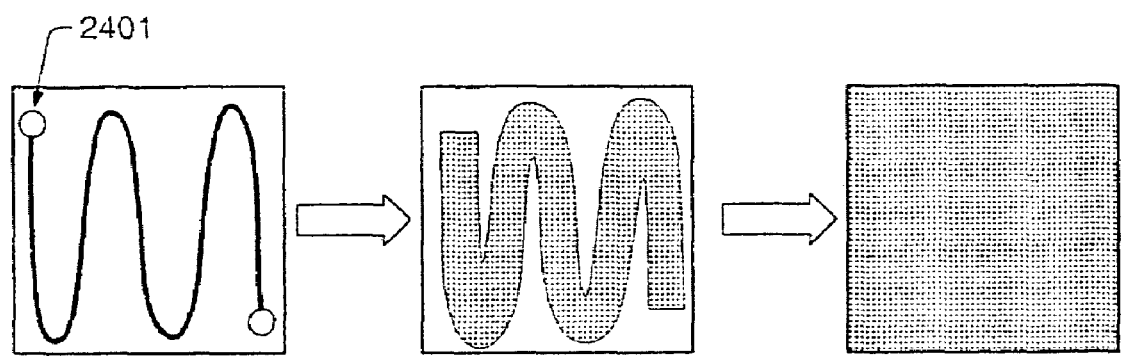
FIGS. 32A-32C depict top views of patterns of curable liquid applied to a substrate.
Figure 32B:
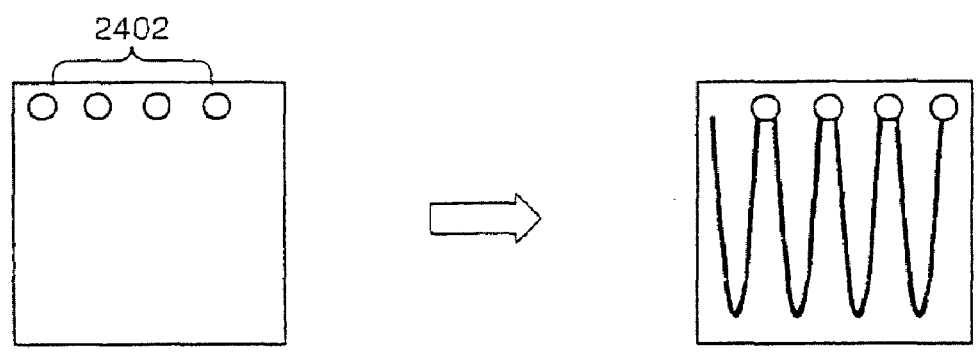
Figure 32C:
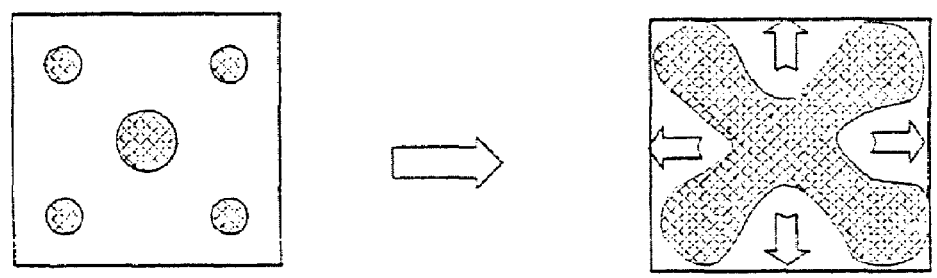

A variety of liquid dispensing patterns are used. Patterns may be in the form of continuous lines or patterns of droplets of liquid. In some embodiments, relative motion between a displacement based liquid dispenser tip and an imprinting member is used to form a pattern with substantially continuous lines on a portion of the imprinting member. Balancing rates of dispensing and relative motion are used to control the size of the cross-section of the line and the shape of the line. During the dispensing process, the dispenser tips are fixed near (e.g., on the order of tens of microns) to the substrate. Two examples of continuous patterns are depicted in FIGS. 32A and 32B. The pattern depicted in FIGS. 32A and 32B is a sinusoidal pattern; however, other patterns are possible. As depicted in FIGS. 32A and 32B, a continuous line pattern may be drawn using either a single dispenser tip 2401 or multiple dispenser tips 2402. Alternately, a pattern of droplets may be used, as depicted in FIG. 32C. In one embodiment, a pattern of droplets that has a central droplet with a greater volume than surrounding droplets is used. When the template contacts the droplets, the liquid spreads to fill the patterning area of the template as depicted in FIG. 32C.

Dispensing rate, $v_d$, and relative lateral velocity of an imprinting member, $v_s$, may be related as follows:

$$v_d = V_d/t_d \text{(dispensing volume/dispensing period)}, \quad (1)$$

$$v_s = L/t_d \text{(line length/dispensing period)}, \quad (2)$$

$$v_d = aL \text{(where, 'a' is the cross section area of line pattern)}, \quad (3)$$

Therefore, $$v_d = av_s. \quad (4)$$

The width of the initial line pattern may normally depend on the tip size of a dispenser. The dispenser tip may be fixed. In an embodiment, a liquid dispensing controller is used to control the volume of liquid dispensed ($V_d$) and the time taken to dispense the liquid ($t_d$). If $V_d$ and $t_d$ are fixed, increasing the length of the line leads to lower height of the cross-section of the line patterned. Increasing pattern length may be achieved by increasing the spatial frequency of the periodic patterns. Lower height of the pattern may lead to a decrease in the amount of liquid to be displaced during imprint processes. By using multiple tips connected to the same dispensing line, line patterns with long lengths may be formed faster as compared to the case of a single dispenser tip. Alternatively, a plurality of closely spaced drops is used to form a line with an accurate volume.

Separation of Template

After curing of the liquid is completed, the template is separated from the cured liquid. Since the template and substrate are almost perfectly parallel, the assembly of the template, imprinted layer, and substrate leads to a substantially uniform contact between the template and the cured liquid. Such a system may require a large separation force to separate the template from the cured liquid. In the case of a flexible template or substrate, the separation, in one embodiment, is performed using a "peeling process." However, use of a flexible template or substrate may be undesirable for high-resolution overlay alignment. In the case of a quartz template and a silicon substrate, a peeling process may be difficult to implement. In one embodiment, a "peel and pull" process is performed to separate the template from an imprinted layer. An embodiment of a peel and pull process is illustrated in FIGS. 33A, 33B, and 33C.

Figure 33A:
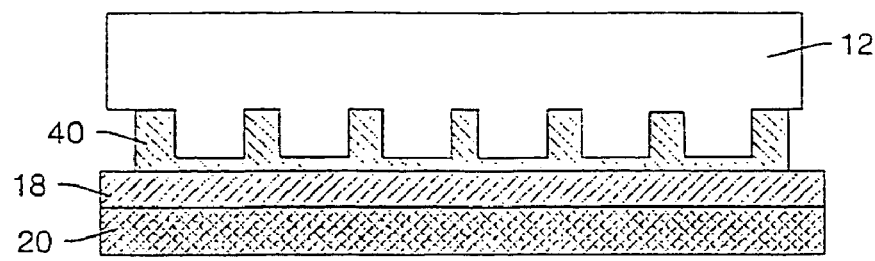
FIGS. 33A-33C depict a scheme for removing a template from a substrate after curing.
Figure 33B:
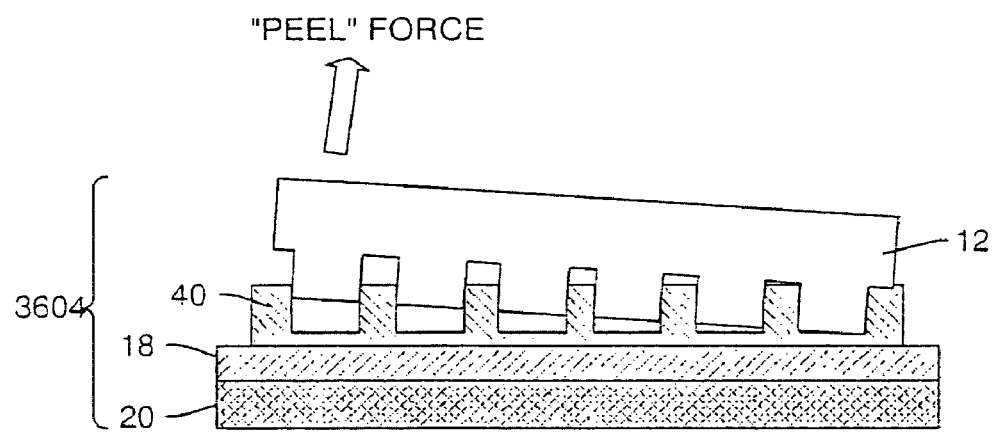
Figure 33C:
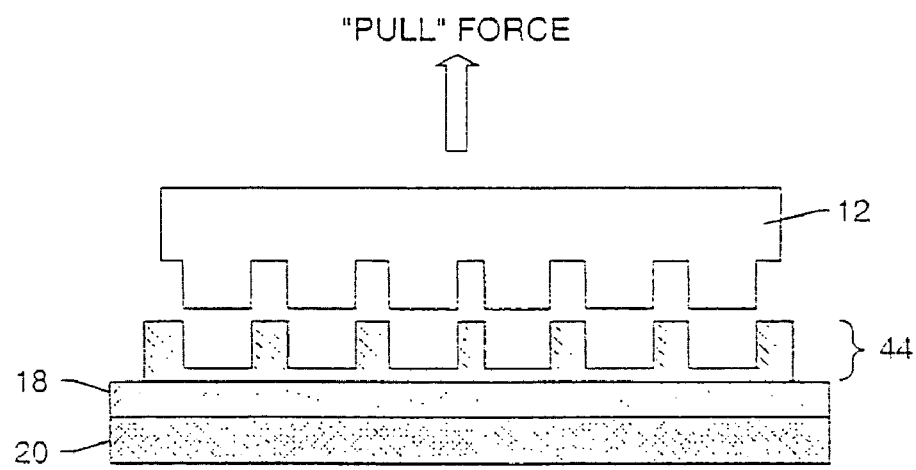

FIG. 33A depicts a template 12 embedded in curable liquid 40 after curing. After curing of curable liquid 40, either template 12 or substrate 20 may be tilted to intentionally induce an angle 3604 between template 12 and substrate 20, as depicted in FIG. 33B. A pre-calibration stage, either coupled to template 12 or substrate 20 may be used to induce a tilt between template 12 and curable liquid 40. The relative lateral motion between template 12 and substrate 20 may be insignificant during the tilting motion if the tilting axis is located close to the template-substrate interface. Once angle 3604 between template 12 and substrate 20 is large enough, template 12 may be separated from substrate 20 using only Z-axis motion (i.e., vertical motion). This peel and pull method may result in desired portions 44 being left intact on a transfer layer 18 and substrate 20 without undesirable shearing, depicted in FIG. 33C.

Electrostatic Curing Process

In addition to the above-described embodiments, embodiments described herein include forming patterned structures by using electric fields. Cured layers formed using electric fields to induce a pattern in the cured layer may be used for single imprinting or step and repeat processes.

Figure 34:
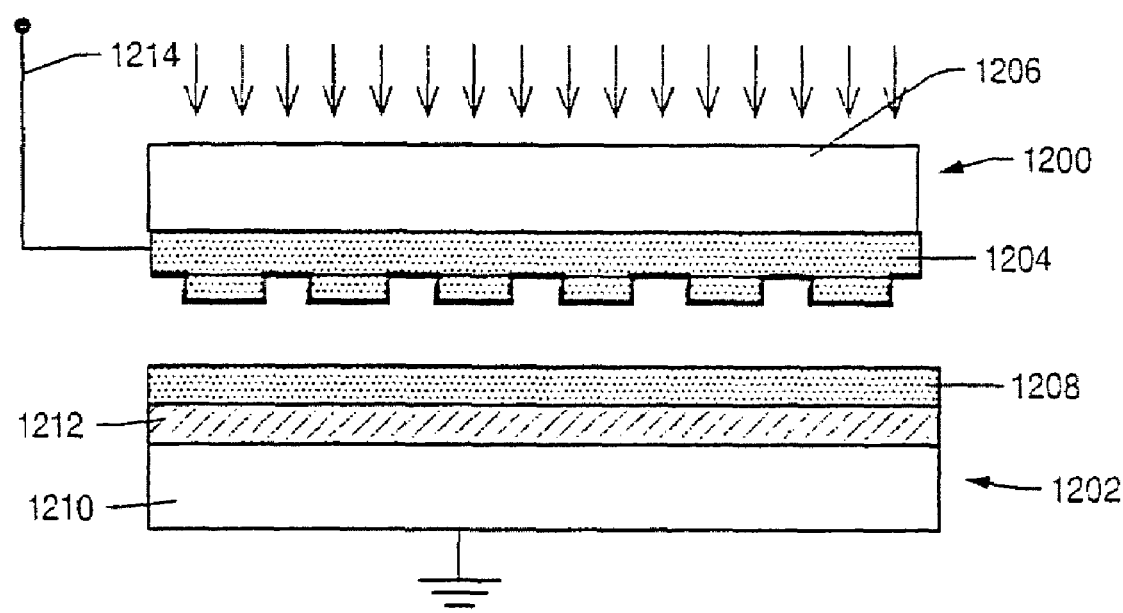
FIG. 34 depicts an embodiment of a template positioned over a substrate for electric field based lithography.
Figure 35A:
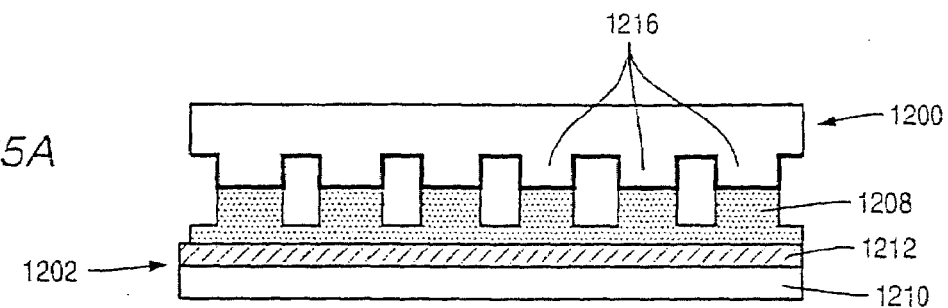
FIGS. 35A-35D depict a first embodiment of a process for forming nanoscale structures using contact with a template.
Figure 35B:
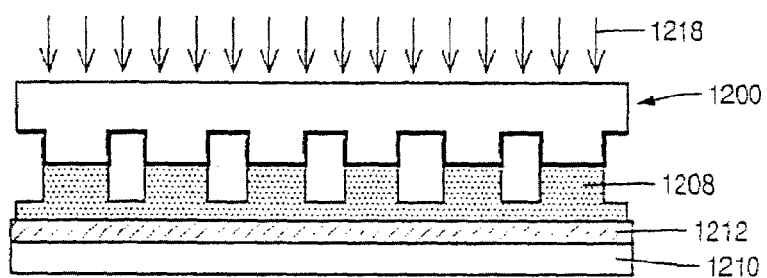
Figure 35C:
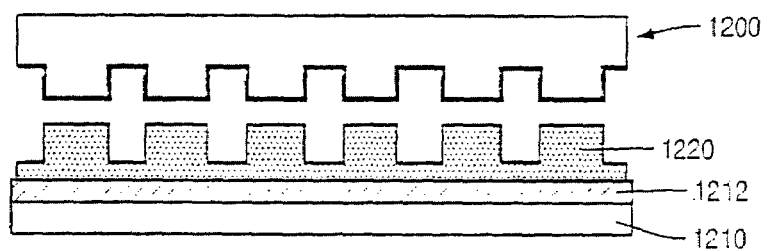
Figure 35D:
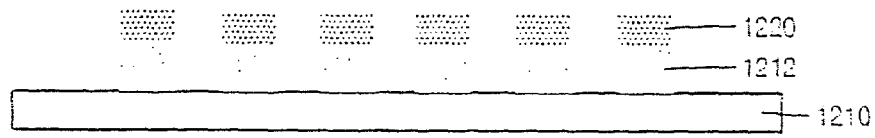

FIG. 34 depicts an embodiment of template 1200 and substrate 1202. Template 1200, in one embodiment, is formed from a material that is transparent to activating light to allow curing of the activating light curable liquid by exposure to activating light. Forming template 1200 from a transparent material also allows the use of established optical techniques to measure the gap between template 1200 and substrate 1202 and to measure overlay marks to perform overlay alignment and magnification correction during formation of the structures. Template 1200 is also thermally and mechanically stable to provide nano-resolution patterning capability. Template 1200 includes an electrically conducting material and/or layer 1204 to allow electric fields to be generated at template-substrate interface.

In one embodiment, a blank of fused silica (e.g., quartz) is used as the material for base 1206 of template 1200. Indium tin oxide (ITO) is deposited onto base 1206. ITO is transparent to visible and UV light and is a conducting material. ITO may be patterned using high-resolution electron beam lithography. A low-surface energy coating, as previously described, may be coated onto template 1200 to improve the release characteristics between template 1200 and the polymerized composition. Substrate 1202 may include standard wafer materials, such as Si, GaAs, SiGeC and InP. A UV curable liquid and/or a thermally curable liquid may be used as activating light curable liquid 1208. In an embodiment, activating light curable liquid 1208 may be spin coated onto the wafer 1210. In another embodiment, a predetermined volume of activating light curable liquid 1208 may be dispensed onto substrate 1202 in a predetermined pattern, as described herein. In some embodiments, transfer layer 1212 may be placed between wafer 1210 and activating light curable liquid 1208. Transfer layer 1212 material properties and thickness may be chosen to allow for the creation of high-aspect ratio structures from low-aspect ratio structures created in the cured liquid material. Connecting ITO to a voltage source 1214 may generate an electric field between template 1200 and substrate 1202.

In FIGS. 35A-35D and FIGS. 36A-36C, two embodiments of the above-described process are illustrated. In each embodiment, a desired uniform gap may be maintained between template 1200 and substrate 1202. An electric field of the desired magnitude may be applied resulting in the attraction of activating light curable liquid 1208 towards the raised portions 1216 of template 1200. In FIGS. 35A-35D, the gap and field magnitudes are such that activating light curable liquid 1208 makes direct contact and adheres to template 1200. A curing agent (e.g., activating light 1218 and/or heat) may be used to cure the liquid. Once desired structures have been formed, template 1200 may be separated from substrate 1202 by methods described herein.

Figure 36A:
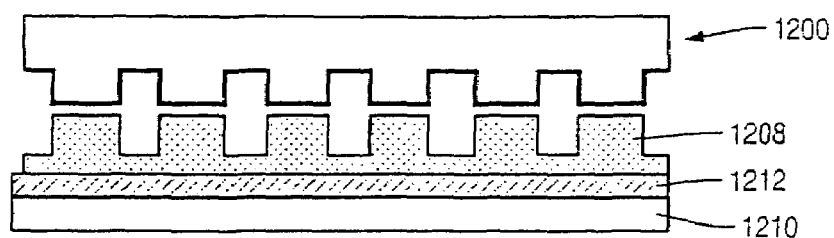
FIGS. 36A-36C depict a first embodiment of a process for forming nanoscale structures without contacting a template.
Figure 36B:
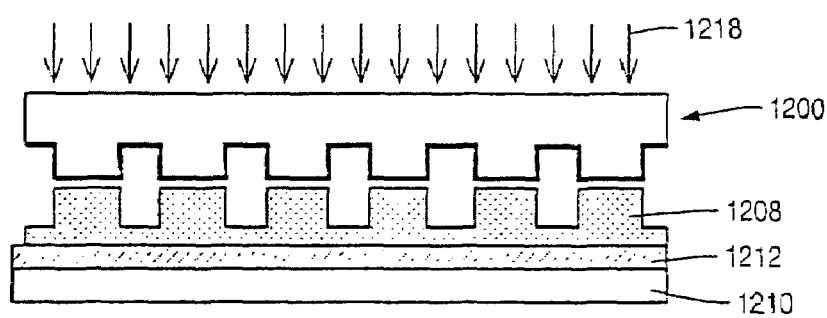
Figure 36C:
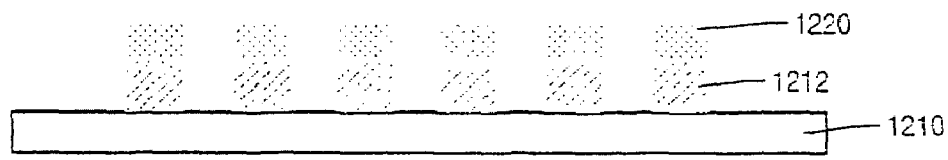

In FIGS. 36A-36C, the gap and field magnitudes may be chosen such that activating light curable liquid 1208 achieves a topography that is essentially the same as that of template 1200. This topography may be achieved without making direct contact with template 1200. A curing agent (e.g. activating light 1218) may be used to cure the liquid. In the embodiment of FIGS. 35A-35D and FIGS. 36A-36C, a subsequent etch process may be used to remove the cured material 1220. A further etch may also be used if transfer layer 1212 is present between cured material 1220 and wafer 1210, as depicted in FIGS. 35A-35D and FIGS. 36A-36C.

Figure 37A:
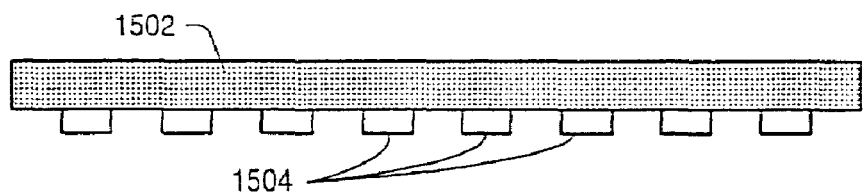
FIGS. 37A-37B depict a template that includes a continuous patterned conductive layer disposed on a non-conductive base.
Figure 37B:
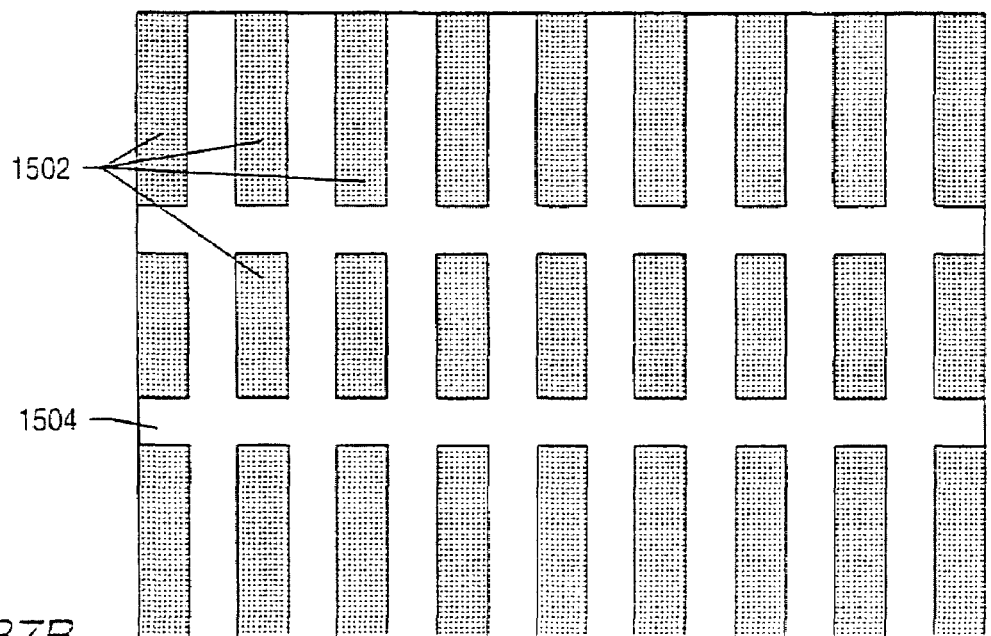

In another embodiment, FIG. 37A depicts an electrically conductive template that includes a continuous layer of electrically conductive portions 1504 coupled to non-conductive bases 1502. As shown in FIG. 37B the non-conductive portions 1502 of the template are isolated from each other by the conductive bases 1504. The template may be used in a "positive" imprint process, as described above.

Use of electric fields allows lithographic patterned structures to be formed, in some instances in a time of less than about 1 second. The structures generally have sizes of tens of nanometers. In one embodiment, curing an activating light curable liquid in the presence of electric fields creates a patterned layer on a substrate. The pattern is created by placing a template with specific nanometer-scale topography at a controlled distance (e.g., within nanometers) from the surface of a thin layer of the curable liquid on a substrate. If all or a portion of the desired structures are regularly repeating patterns (such as an array of dots), the pattern on the template may be considerably larger than the size of the desired repeating structures.

The replication of the pattern on the template may be achieved by applying an electric field between the template and the substrate. Because the liquid and air (or vacuum) have different dielectric constants and the electric field varies locally due to the presence of the topography of the template, an electrostatic force may be generated that attracts regions of the liquid toward the template. Surface tension or capillary pressures tend to stabilize the film. At high electric field strengths, the activating light curable liquid may be made to attach to the template and de-wet from the substrate at certain points. However, the attachment of the liquid film will occur provided the ratio of electrostatic forces is comparable to the capillary forces, which is measured by the dimensionless number $\Lambda$. The magnitude of the electrostatic force is approximately $\epsilon E^2 d^2$, where $\epsilon$ is the permittivity of vacuum, E is the magnitude of the electric field, and d is the feature size. The magnitude of the capillary forces is approximately $\gamma d$, where $\gamma$ is the liquid-gas surface tension. The ratio of these two forces is $\Lambda = \epsilon E^2 d/\gamma$. In order to deform the interface and cause it to attach to the upper surface, the electric field must be such that L is approximately unity. The precise value depends on the details of the topography of the plates and the ratio of liquid-gas permittivities and heights, but this number will be O(1). Thus, the electric field is approximately given by $E \sim (\gamma/\epsilon d)^{1/2}$. This activating light curable liquid may be hardened in place by polymerization of the composition. The template may be treated with a low energy self-assembled monolayer film (e.g., a fluorinated surfactant) to aid in detachment of the template from the polymerized composition.

An example of the above approximations follows: For d=100 nm and $\gamma$=30 mJ/m and $\epsilon$=8.85×10-12 $C^2$/J-m, E=1.8×10$^8$ V/m, which corresponds to a potential difference between the plates of 18V if the plate spacing is 100 nm or 180 if the plate spacing is 1000 nm. Note that the feature size $d \sim \gamma/\epsilon E^2$, which means that the size of the feature decreases with the square of the electric field. Thus, 50 nm features would require voltages on the order of 25 or 250V for 100 and 1000 nm plate spacings, respectively.

It may be possible to control the electric field, the design of the topography of the template and the proximity of the template to the liquid surface so as to create a pattern in the activating light curable liquid that does not come into contact with the surface of the template. This technique may eliminate the need for mechanical separation of the template from the polymerized composition. This technique may also eliminate a potential source of defects in the pattern. In the absence of contact, however, the liquid may not form sharp, high-resolution structures that are as well defined as in the case of contact. This may be addressed by first creating structures in the activating light curable liquid that are partially defined at a given electric field. Subsequently, the gap may be increased between the template and substrate while simultaneously increasing the magnitude of the electric field to "draw-out" the liquid to form clearly defined structures without requiring contact.

The activating light curable liquid may be deposited on top of a transfer layer as previously described. Such a bi-layer process allows low aspect ratio, high-resolution structures formed using electrical fields to be followed by an etch process to yield high-aspect ratio, high-resolution structures. Such a bi-layer process may also be used to perform a "metal lift-off process" to deposit a metal on the substrate such that the metal is left behind after lift-off in the trench areas of the originally created structures.

Using a low viscosity activating light curable liquid, pattern formation using electric fields may be fast (e.g., less than about 1 sec.), and the structure may be rapidly cured. Avoiding temperature variations in the substrate and the activating light curable liquid may also avoid undesirable pattern distortion that makes nano-resolution layer-to-layer alignment impractical. In addition, as mentioned above, it is possible to quickly form a pattern without contact with the template, thus eliminating defects associated with imprint methods that require direct contact.

In this patent application, certain U.S. patents and U.S. patent applications have been incorporated by reference. The text of such U.S. patents, and U.S. patent applications is, however, only incorporated by reference to the extent that no conflict exists between such text and the other statements and drawings set forth herein. In the event of such conflict, U.S. patents and U.S. patent applications are specifically not incorporated by reference in this patent.

While this invention has been described with references to various illustrative embodiments, the description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed:

1. An imprint lithography system, comprising:
  a body;
  a patterned template comprising a patterning area and a template alignment mark, wherein the patterning area comprises a plurality of recesses extending from a first surface of the template toward an opposing second surface of the template, and wherein a first alignment mark is defined by the recesses in the patterning area of the template, and wherein the template alignment mark is a grating structure;
  a stage coupled to the body, wherein the stage is configured to support a substrate;
  an imprint head coupled to the body, wherein the imprint head is configured to hold the patterned template proximate to the substrate during use;
  a liquid dispenser coupled to the body, wherein the liquid dispenser is configured to dispense an activating light curable liquid onto at least a portion of the substrate during use;

an activating light source optically coupled to the body, wherein the activating light source is configured to direct activating light through the patterned template during use;
an analyzing light source optically coupled to a portion of the template; and
a detector optically coupled to the template, wherein the detector is configured to measure multiple individual wavelengths of light reflected from the substrate.

2. The system of claim 1, wherein the template alignment mark and the substrate alignment mark each comprise a grating having a spacing of between about 1 µm to about 3 µm.

3. The system of claim 1, wherein the template alignment mark and the substrate alignment mark each comprise a grating having a spacing of less than about 1 µm.

4. The system of claim 1, wherein the template alignment mark and the substrate alignment mark each comprise a grating having a spacing between about 100 and 1000 nm.

5. The system of claim 1, wherein the template alignment mark and the substrate alignment mark each comprise a first grating having a spacing of between about 1 µm to about 3 µm and a second grating having a spacing between about 100 and 1000 nm.

6. The system of claim 1, wherein the template alignment mark and the substrate alignment mark each comprise a first axis grating and a second axis grating, wherein the first axis grating is perpendicular to the second axis grating.

7. The system of claim 1, wherein the detector comprises an array camera.

8. The system of claim 1, wherein the detector comprises an array camera detector having a resolution capable of resolving different wavelengths of light reflected from the substrate at a non-zero order.

9. The system of claim 1, wherein the detector comprises a spectrophotometer.

10. The system of claim 1, wherein the detector comprises a non achromatic lens coupled to an array camera.

11. The system of claim 1, wherein the detector comprises a spectrophotometer, and wherein the spectrophotometer is optically coupled to light produced by the analyzing light source and reflected off of the substrate by a fiber optic cable.

12. The system of claim 1, wherein the analyzing light source is configured to apply a beam of light to the template substantially normal to a plane defined by the substrate.

13. The system of claim 1, wherein the analyzing light source is configured to apply a beam of light to the template at an angle that is substantially non-normal to a plane defined by the template.

14. The system of claim 1, further comprising a force detector coupled to the imprint head, wherein the force detector is configured to determine a resistive force applied to the template by the applied liquid when the template contacts the applied liquid.

15. The system of claim 1, further comprising a support structure coupled to the imprint head and to the stage, wherein the support structure comprises a material having a linear thermal expansion coefficient of less than about 20 ppm/° C. at about 25° C.

16. The system of claim 1, further comprising an enclosure around at least the imprint head and the stage, and a temperature control system, wherein the temperature control system is configure to inhibit temperature variations of greater than about 1° C. within the enclosure during use.

17. The system of claim 1, wherein at least a portion of the first surface of the patterned template comprises a surface treatment layer.

* * * * *